(12) United States Patent
Sakamoto

(10) Patent No.: US 10,727,415 B2
(45) Date of Patent: Jul. 28, 2020

(54) PHOSPHINE-BASED COMPOUND AND ORGANIC ELECTROLUMINESCENCE DEVICE INCLUDING THE SAME

(71) Applicant: SAMSUNG DISPLAY CO., LTD., Yongin-si, Gyeonggi-do (KR)

(72) Inventor: Naoya Sakamoto, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 300 days.

(21) Appl. No.: 15/923,023

(22) Filed: Mar. 16, 2018

(65) Prior Publication Data

US 2019/0019959 A1 Jan. 17, 2019

(30) Foreign Application Priority Data

Jul. 12, 2017 (KR) .................. 10-2017-0088674

(51) Int. Cl.
*H01L 51/50* (2006.01)
*H01L 51/00* (2006.01)
(Continued)

(52) U.S. Cl.
CPC ............ *H01L 51/0067* (2013.01); *C07F 9/58* (2013.01); *C07F 9/6512* (2013.01);
(Continued)

(58) Field of Classification Search
None
See application file for complete search history.

(56) References Cited

U.S. PATENT DOCUMENTS

| 9,461,272 B2 | 10/2016 | Yang |
| 9,627,627 B2 | 4/2017 | Kim et al. |
| 2016/0005979 A1* | 1/2016 | Kim ................... H01L 51/0072 257/40 |

FOREIGN PATENT DOCUMENTS

| CN | 102675367 A | 9/2012 | |
| CN | 104292260 | * 1/2015 | ............ C09K 11/06 |

(Continued)

OTHER PUBLICATIONS

Gu et al., Bipolar Host Molecules for Efficient Blue Electrophosphorescence: A Quantum Chemical Design, Journal of Physical Chemistry A (2010), 114(2), 965-972 (Year: 2010).*

(Continued)

*Primary Examiner* — Gregory D Clark
(74) *Attorney, Agent, or Firm* — Lewis Roca Rothgerber Christie LLP

(57) ABSTRACT

A phosphine-based compound and an organic electroluminescence device including the same, the phosphine-based compound being represented by the following Formula 1:

(Continued)

[Formula 1]

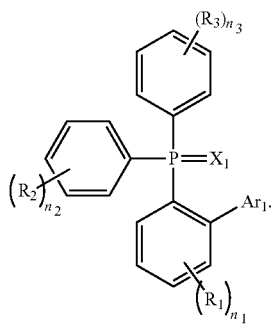

19 Claims, 2 Drawing Sheets

(51) Int. Cl.
  *C07F 9/58* (2006.01)
  *C07F 9/6512* (2006.01)
  *C07F 9/6509* (2006.01)
  *C07F 9/6558* (2006.01)
  *C07F 9/6521* (2006.01)
  *H01L 51/52* (2006.01)

(52) U.S. Cl.
  CPC ........ *C07F 9/6521* (2013.01); *C07F 9/65583* (2013.01); *C07F 9/650905* (2013.01); *C07F 9/650952* (2013.01); *H01L 51/508* (2013.01); *H01L 51/5012* (2013.01); *H01L 51/5016* (2013.01); *H01L 51/5064* (2013.01); *H01L 51/5088* (2013.01); *H01L 51/5092* (2013.01); *H01L 51/5206* (2013.01); *H01L 51/5221* (2013.01)

(56) References Cited

FOREIGN PATENT DOCUMENTS

| CN | 104447866 A | 3/2015 |
|---|---|---|
| KR | 10-2016-0053048 A | 5/2016 |
| KR | 10-2016-0081105 A | 7/2016 |

OTHER PUBLICATIONS

Zhou et al., Manipulating charge-transfer character with electron-withdrawing main-group moieties for the color tuning of iridium electrophosphors, Advanced Functional Materials (2008), 18(3), 499-511 (Year: 2008).*

Wu et al., Computational Design of Host Materials Suitable for Green—(Deep) Blue Phosphors through Effectively Tuning the Triplet Energy While Maintaining the Ambipolar Property, Journal of Physical Chemistry C (2013), 117(16), (Year: 2013).*

* cited by examiner

PHOSPHINE-BASED COMPOUND AND ORGANIC ELECTROLUMINESCENCE DEVICE INCLUDING THE SAME

CROSS-REFERENCE TO RELATED APPLICATIONS

Korean Patent Application No. 10-2017-0088674, filed on Jul. 12, 2017, in the Korean Intellectual Property Office, and entitled: "Phosphine-Based Compound and Organic Electroluminescence Device Including the Same," is incorporated by reference herein in its entirety.

BACKGROUND

1. Field

Embodiments relate to a phosphine-based compound and an organic electroluminescence device including the same.

2. Description of the Related Art

Development of an organic electroluminescence display as an image display is being actively conducted. An organic electroluminescence display is different from a liquid crystal display and is a self-luminescent display that accomplishes display by recombining holes and electrons injected from a first electrode and a second electrode in an emission layer and emitting light from a luminescent material which is an organic compound included in the emission layer.

As an organic electroluminescence device may be composed of, e.g., a first electrode, a hole transport layer disposed on the first electrode, an emission layer disposed on the hole transport layer, an electron transport layer disposed on the emission layer, and a second electrode disposed on the electron transport layer. Holes are injected from the first electrode, and the injected holes move via the hole transport layer and injected into the emission layer. Meanwhile, electrons are injected from the second electrode, and the injected electrons move via the electron transport layer and injected into the emission layer. By recombining the injected holes and electrons into the emission layer, excitons are generated in the emission layer. The organic electroluminescence device emits light using light emitted during the transition of the excitons back to a ground state. In addition, various modifications may be possible.

SUMMARY

Embodiments are directed to a phosphine-based compound and an organic electroluminescence device including the same.

The embodiments may be realized by providing a phosphine-based compound represented by the following Formula 1:

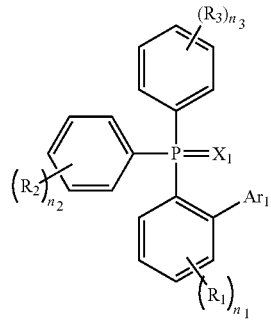

[Formula 1]

wherein, in Formula 1, $X_1$ is O or S, $Ar_1$ is a substituted or unsubstituted pyridyl group, a substituted or unsubstituted pyridazinyl group, a substituted or unsubstituted pyrimidyl group, or a substituted or unsubstituted pyrazinyl group, $R_1$ is a hydrogen atom, a deuterium atom, a halogen atom, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_2$ and $R_3$ are each independently a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, "$n_1$" is an integer of 0 to 4, and "$n_2$" and "$n_3$" are each independently an integer of 0 to 5.

The embodiments may be realized by providing a phosphine-based compound represented by the following Formula 7:

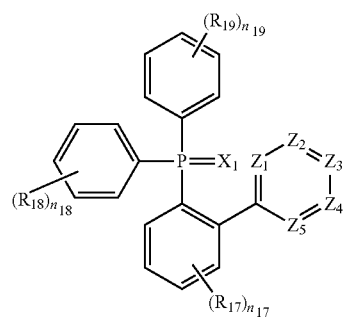

[Formula 7]

wherein, in Formula 7, $X_6$ is O or S, $Z_1$ to $Z_5$ are each independently $CR_{20}$ or N, one or two of $Z_1$ to $Z_5$ being N, $R_{17}$ and $R_{20}$ are each independently a hydrogen atom, a deuterium atom, a halogen atom, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, or a combination thereof, $R_{18}$ and $R_{19}$ are each independently a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, "$n_{17}$" is an integer of 0 to 4, "$n_{18}$" and "$n_{19}$" are each independently an integer of 0 to 5, and at least one of $R_{17}$ and $R_{20}$ is a group represented by the following Formula 8:

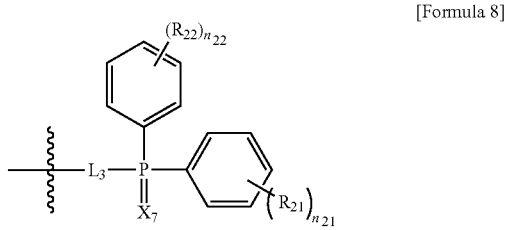

[Formula 8]

wherein, in Formula 8, $X_7$ is O or S, $L_3$ is a direct linkage or a substituted or unsubstituted phenylene group, $R_{21}$ and $R_{22}$ are each independently a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and "$n_{21}$" and "$n_{22}$" are each independently an integer of 0 to 5.

The embodiments may be realized by providing an organic electroluminescence device including a first electrode; a hole transport region disposed on the first electrode; an emission layer disposed on the hole transport region; an electron transport region disposed on the emission layer; and a second electrode disposed on the electron transport region, wherein at least one of the emission layer or the electron transport region includes a phosphine-based compound represented by the following Formula 1:

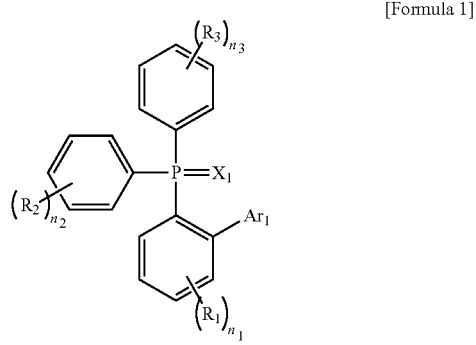

[Formula 1]

wherein, in Formula 1, $X_1$ is O or S, $Ar_1$ is a substituted or unsubstituted pyridyl group, a substituted or unsubstituted pyridazinyl group, a substituted or unsubstituted pyrimidyl group, or a substituted or unsubstituted pyrazinyl group, $R_1$ is a hydrogen atom, a deuterium atom, a halogen atom, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_2$ and $R_3$ are each independently a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, "$n_1$" is an integer of 0 to 4, and "$n_2$" and "$n_3$" are each independently an integer of 0 to 5.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
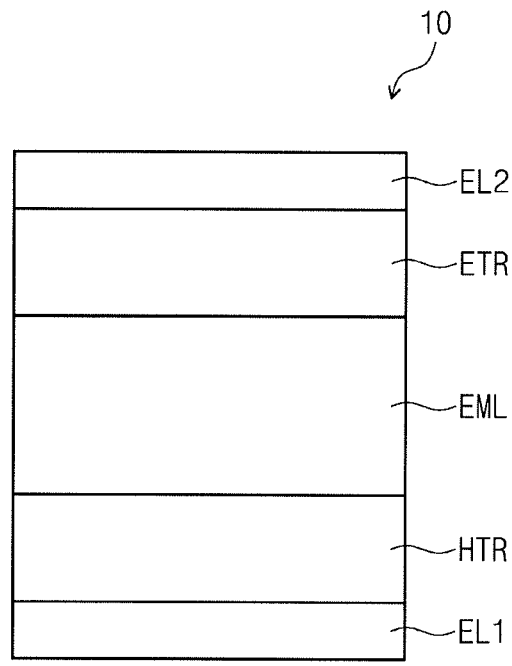
FIG. 1 illustrates a schematic cross-sectional view of an organic electroluminescence device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Like reference numerals refer to like elements for explaining each drawing. In the drawings, the sizes of elements may be enlarged for clarity. It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "includes," "including," "comprises," or "comprising," when used in this specification, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc. is referred to as being 'on' another part, it can be "directly on" the other part, or intervening layers may also be present. On the contrary, when a layer, a film, a region, a plate, etc. is referred to as being 'under' another part, it can be "directly under" the other part, or intervening layers may also be present. The term "or" is not an exclusive term, e.g., "A or B" would include A, B, and A and B.

In the present disclosure,

means a connecting part.

In the present disclosure, "substituted or unsubstituted" may mean substituted with at least one substituent selected from the group consisting of deuterium, halogen, cyano, nitro, amino, silyl, boron, aryl amine, phosphine oxide, phosphine sulfide, alkyl, alkenyl, aryl, and heterocycle or unsubstituted. In addition, each of the substituent illustrated above may be substituted or unsubstituted. For example, biphenyl may be interpreted as aryl, or phenyl substituted with phenyl.

In the present disclosure, the description of forming a ring by combining adjacent groups with each other may mean forming a substituted or unsubstituted hydrocarbon ring or a substituted or unsubstituted heterocycle by combining adjacent groups with each other. A hydrocarbon ring may include an aliphatic hydrocarbon ring and an aromatic hydrocarbon ring. The heterocycle may include an aliphatic heterocycle and aromatic heterocycle. The hydrocarbon ring and heterocycle may be a monocycle or polycycle. In addition, the ring formed by combining adjacent groups may be connected with another ring to form a spiro structure.

In the present disclosure, the terms "an adjacent group" may mean a substituent at an atom which is directly connected with another atom at which a corresponding substituent is substituted, another substituent at an atom at which a corresponding substituent is substituted, or a substituent stereoscopically disposed at the nearest position to a corresponding substituent. For example, two methyl groups in 1,2-dimethylbenzene may be interpreted as "adjacent groups", and two ethyl groups in 1,1-diethylcyclopentene may be interpreted as "adjacent groups".

In the present disclosure, a direct linkage may mean a single bond.

In the present disclosure, a halogen atom may include a fluorine atom, a chlorine atom, a bromine atom, or an iodine atom.

In the present disclosure, the alkyl group may have a linear, branched or cyclic shape. The carbon number of the alkyl group may be 1 to 30, 1 to 20, 1 to 15, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present disclosure, the aryl group means an optional functional group or substituent derived from an aromatic hydrocarbon ring. The aryl group may be monocyclic aryl or polycyclic aryl. The carbon number of the aryl group for forming a ring may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylene, pyrenyl, benzofluoranthenyl, chrysenyl, etc., without limitation.

In the present disclosure, the fluorenyl group may be substituted, or two substituents may be combined with each other to form a spiro structure. For example, the fluorenyl group may be a 9,9'-spirobifluorenyl group.

In the present disclosure, the heteroaryl group may be a heteroaryl group including at least one of O, N, P, S, or Si as a heteroatom. The heteroaryl group may be a monocyclic heteroaryl group or a polycyclic heteroaryl group. The carbon number of the heteroaryl group for forming a ring may be 2 to 30, or 2 to 20. Examples of the heteroaryl group may include thiophenyl, furanyl, pyrrolyl, imidazolyl, thiazolyl, oxazolyl, oxadiazolyl, triazolyl, pyridyl, bipyridyl, pyrimidyl, triazinyl, triazolyl, acridyl, pyridazinyl, pyrazinyl, quinolinyl, quinazolinyl, quinoxalinyl, phenoxazyl, phthalazinyl, pyrido pyrimidyl, pyrido pyrazinyl, pyrazino isoquinolinyl, indolyl, carbazolyl, N-arylcarbazolyl, N-heteroaryl carbazolyl, N-alkyl carbazolyl, benzoxazolyl, benzoimidazolyl, benzothiazolyl, benzocarbazolyl, benzothiophenyl, dibenzothiophenyl, thienothiophenyl, benzofuranyl, phenanthrolyl, isooxazolyl, oxadiazolyl, thiadiazolyl, benzothiazolyl, phenothiazinyl, dibenzosilolyl, dibenzofuranyl, etc., without limitation.

In the present disclosure, the explanation on the aryl group may be applied to the arylene group, except that the arylene group is a divalent group. The explanation on the heteroaryl group may be applied to the heteroarylene group, except that the heteroarylene group is a divalent group.

In the present disclosure, the silyl may include alkyl silyl and aryl silyl. Examples of the silyl may include trimethylsilyl, triethylsilyl, t-butyl dimethylsilyl, vinyl dimethylsilyl, propyl dimethylsilyl, triphenylsilyl, diphenylsilyl, phenylsilyl, etc., without limitation.

In the present disclosure, the boron may include alkyl boron and aryl boron. Examples of the boron may include trimethyl boron, triethyl boron, t-butyl dimethyl boron, triphenyl boron, diphenyl boron, phenyl boron, etc., without limitation.

In the present disclosure, the alkenyl may be linear or branched. The carbon number is not specifically limited, however may be 2 to 30, 2 to 20, or 2 to 10. Examples of the alkenyl may include vinyl, 1-butenyl, 1-pentenyl, 1,3-butadienyl aryl, styrenyl, styrylvinyl, etc., without limitation.

In the present disclosure, the carbon number of the amine is not specifically limited, but may be 1 to 30. The amine may include alkyl amine and aryl amine. Examples of the amine may include methylamine, dimethylamine, phenylamine, diphenylamine, naphthylamine, 9-methyl-anthracenylamine, triphenylamine, etc., without limitation.

Hereinafter, the phosphine-based compound according to an embodiment will be explained.

The phosphine-based compound according to an embodiment may be represented by the following Formula 1.

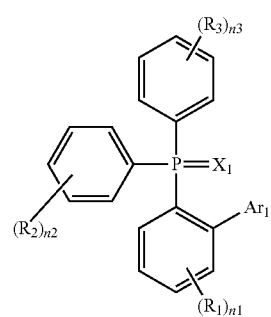

[Formula 1]

In Formula 1, $X_1$ may be, e.g., O or S. If $X_1$ is O, the compound represented by Formula 1 may be a phosphine oxide-based compound. If $X_1$ is S, the compound represented by Formula 1 may be a phosphine sulfide-based compound.

$Ar_1$ may be, e.g., a six-member aromatic ring containing a nitrogen atom. In an implementation, $Ar_1$ may be or may include, e.g., a substituted or unsubstituted pyridyl group, or a substituted or unsubstituted diazinyl group. In an implementation, $Ar_1$ may be or may include, e.g., a substituted or unsubstituted pyridyl group, a substituted or unsubstituted pyridazinyl group, a substituted or unsubstituted pyrimidyl group, or a substituted or unsubstituted pyrazinyl group, In an implementation, $Ar_1$ may be, e.g., a group represented by one of the following Formulae 2-1 to 2-4.

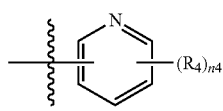

[Formula 2-1]

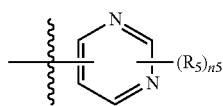

[Formula 2-2]

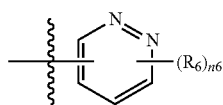

[Formula 2-3]

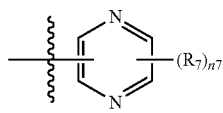

[Formula 2-4]

In Formulae 2-1 to 2-4, $R_4$ to $R_7$ may each independently be or include, e.g., a hydrogen atom, a deuterium atom, a halogen atom, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, or a combination thereof. In an implementation, $R_4$ to $R_7$ may each independently be or include, e.g., a hydrogen atom, a substituted or unsubstituted aryl group having 6 to 30 ring carbon atoms, or a substituted or unsubstituted heteroaryl group having 2 to 30 ring carbon atoms. In an implementation, $R_4$ to $R_7$ may each independently be, e.g., a group represented by the following Formula 3.

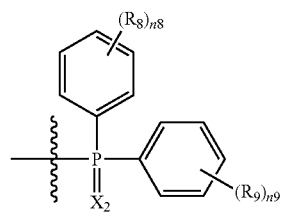

[Formula 3]

In Formula 3, $X_2$ may be, e.g., O or S. $X_2$ may be the same as $X_1$. For example, if $X_1$ is O, $X_2$ may be also O. If $X_1$ is S, $X_2$ may be also S.

$R_8$ and $R_9$ may each independently be or include, e.g., a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

"$n_8$" and "$n_9$" may each independently be, e.g., an integer of 0 to 5. If "$n_8$" is 0, $R_4$ to $R_7$ represented by Formula 3 may be unsubstituted with $R_8$. If "$n_8$" is an integer of 2 or more, a plurality of $R_8$ may be the same or different. If "$n_9$" is 0, $R_4$ to $R_7$ represented by Formula 3 may be unsubstituted with $R_9$. If "$n_9$" is an integer of 2 or more, a plurality of $R_9$ may be the same or different. For example, as would be understood herein for all groups, a group in which "$n_8$" is 0 would be the same as a group in which "$n_8$" is 5 and each $R_8$ is hydrogen.

In Formulae 2-1 to 2-4, "$n_4$" may be, e.g., in integer of 0 to 4. "$n_5$" to "$n_7$" may each independently be, e.g., an integer of 0 to 3. If "$n_4$" is 0, $Ar_1$ represented by Formula 2-1 may be unsubstituted with $R_4$. If "$n_4$" is an integer of 2 or more, a plurality of $R_4$ may be the same or different. For example, one $R_4$ may be a phosphine oxide group or a phosphine sulfide group, which is represented by Formula 3, and the other $R_4$ may be a substituted or unsubstituted phenyl group. If "$n_5$" is 0, $Ar_1$ represented by Formula 2-2 may be unsubstituted with $R_5$. If "$n_5$" is an integer of 2 or more, a plurality of $R_5$ may be the same or different. For example, one $R_5$ may be a phosphine oxide group or a phosphine sulfide group, which is represented by Formula 3, and the other $R_5$ may be a substituted or unsubstituted phenyl group. If "$n_6$" is 0, $Ar_1$ represented by Formula 2-3 may be unsubstituted with $R_6$. If "$n_6$" is an integer of 2 or more, a plurality of $R_6$ may be the same or different. For example, one $R_6$ may be a phosphine oxide group or a phosphine sulfide group, which is represented by Formula 3, and the other $R_6$ may be a substituted or unsubstituted phenyl group. If "$n_7$" is 0, $Ar_1$ represented by Formula 2-4 may be unsubstituted with $R_7$. If "$n_7$" is an integer of 2 or more, a plurality of $R_7$ may be the same or different. For example, one $R_7$ may be a phosphine oxide group or a phosphine sulfide group, which is represented by Formula 3, and the other $R_7$ may be a substituted or unsubstituted phenyl group.

In an implementation, the group represented by Formula 2-1 may be, e.g., a group represented by one of the following Formulae 2-1-1 to 2-1-3.

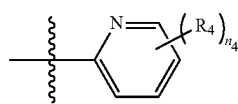

[Formula 2-1-1]

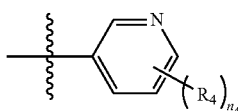

[Formula 2-1-2]

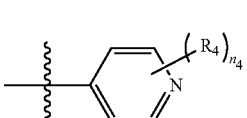

[Formula 2-1-3]

In Formulae 2-1-1 to 2-1-3, $R_4$ and "$n_4$" may be the same as defined above.

In an implementation, the group represented by Formula 2-2 may be, e.g., a group represented by one of the following Formulae 2-2-1 to 2-2-3.

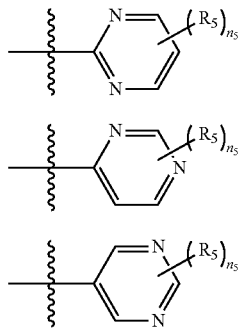

[Formula 2-2-1]

[Formula 2-2-2]

[Formula 2-2-3]

In Formulae 2-2-1 to 2-2-3, $R_5$ and "$n_5$" may be the same as defined above.

In an implementation, the group represented by Formula 2-3 may be, e.g., a group represented by any one of the following Formula 2-3-1 or 2-3-2.

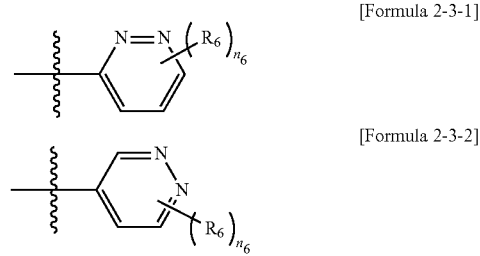

[Formula 2-3-1]

[Formula 2-3-2]

In Formulae 2-3-1 and 2-3-2, $R_6$ and "$n_6$" may be the same as defined above.

In Formula 1, $R_1$ may be or may include, e.g., a hydrogen atom, a deuterium atom, a halogen atom, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. In an implementation, $R_1$ may be or may include, e.g., a hydrogen atom, a substituted or unsubstituted aryl group having 6 to 30 ring carbon atoms, or a substituted or unsubstituted heteroaryl group having 2 to 30 ring carbon atoms. In an implementation, $R_1$ may be, e.g., a group represented by the following Formula 4.

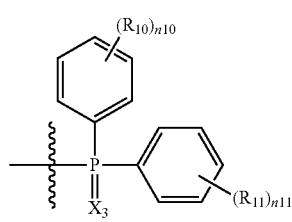

[Formula 4]

In Formula 4, $X_3$ may be O or S. $X_3$ may be the same as $X_1$. For example, if $X_1$ is O, $X_3$ may be also O. If $X_1$ is S, $X_3$ may be also S.

$R_{10}$ and $R_{11}$ may each independently be or include, e.g., a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

"$n_{10}$" and "$n_{11}$" may each independently be, e.g., an integer of 0 to 5. If "$n_{10}$" is 0, $R_1$ represented by Formula 4 may be unsubstituted with $R_{10}$. If "$n_{10}$" is an integer of 2 or more, a plurality of $R_{10}$ may be the same or different. If "$n_{11}$" is 0, $R_1$ represented by Formula 4 may be unsubstituted with $R_{11}$. If "$n_{11}$" is an integer of 2 or more, a plurality of $R_{11}$ may be the same or different.

In Formula 1, $R_2$ and $R_3$ may each independently be or include, e.g., a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

"$n_2$" and "$n_3$" may each independently be, e.g., an integer of 0 to 5. If "$n_2$" is 0, the phosphine-based compound represented by Formula 1 may be unsubstituted with $R_2$. If "$n_2$" is an integer of 2 or more, a plurality of $R_2$ may be the same or different. If "$n_3$" is 0, the phosphine-based compound represented by Formula 1 may be unsubstituted with $R_3$. If "$n_3$" is an integer of 2 or more, a plurality of $R_3$ may be the same or different.

In an implementation, the phosphine-based compound represented by Formula 1 may include at least two phosphine oxide groups or phosphine sulfide groups.

In an implementation, the phosphine-based compound represented by Formula 1 may be, e.g., represented by the following Formula 5.

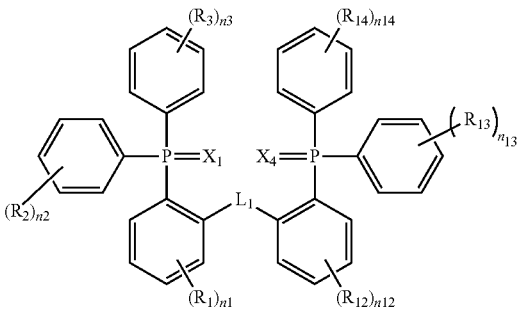

[Formula 5]

In Formula 5, $X_1$, $R_1$ to $R_3$, and "$n_1$" to "$n_3$" may be the same as defined above.

$L_1$ may be, e.g., a connecting group corresponding to $Ar_1$ in Formula 1. In an implementation, $L_1$ may be, e.g., a six-member aromatic ring containing a nitrogen atom. In an implementation, $L_1$ may be or may include, e.g., a substituted or unsubstituted pyridylene group, or a substituted or unsubstituted divalent diazinyl group. $L_1$ may be a substituted or unsubstituted pyridylene group, a substituted or unsubstituted pyridazinylene group, a substituted or unsubstituted pyrimidylene group, or a substituted or unsubstituted pyrazinylene group.

$X_4$ may be, e.g., O or S. $X_4$ may be the same as $X_1$. For example, if $X_1$ is O, $X_4$ may be also O. If $X_1$ is S, $X_4$ may be also S. If both $X_1$ and $X_4$ are O, the phosphine-based compound represented by Formula 5 may be substituted with at least two phosphine oxide groups. If both $X_1$ and $X_4$ are S, the phosphine-based compound represented by Formula 5 may be substituted with at least two phosphine sulfide groups.

$R_{12}$ to $R_{14}$ may each independently be or include, e.g., a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

"$n_{12}$" may be, e.g., an integer of 0 to 4. "$n_{13}$" and "$n_{14}$" may each independently be, e.g., an integer of 0 to 5. If "$n_{12}$" is 0, the phosphine-based compound represented by Formula 5 may be unsubstituted with $R_{12}$. If "$n_{12}$" is an integer of 2 or more, a plurality of $R_{12}$ may be the same or different. If "$n_{13}$" is 0, the phosphine-based compound represented by Formula 5 may be unsubstituted with $R_{13}$. If "$n_{13}$" is an integer of 2 or more, a plurality of $R_{13}$ may be the same or different. If "$n_{14}$" is 0, the phosphine-based compound represented by Formula 5 may be unsubstituted with $R_{14}$. If "$n_{14}$" is an integer of 2 or more, a plurality of $R_{14}$ may be the same or different.

In an implementation, the phosphine-based compound represented by Formula 1 may be represented by the following Formula 6.

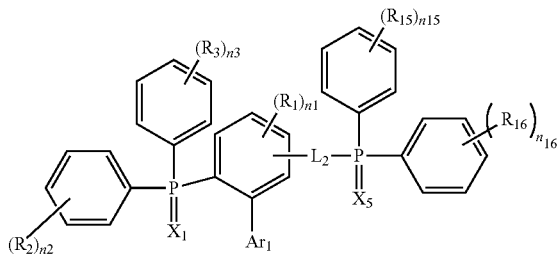

[Formula 6]

In Formula 6, $Ar_1$, $X_1$, $R_1$ to $R_3$, and "$n_2$" and "$n_3$" may be the same as defined above.

$X_5$ may be, e.g., O or S. $X_5$ may be the same as $X_1$. For example, if $X_1$ is O, $X_5$ may be also O. If $X_1$ is S, $X_5$ may be also S. If both $X_1$ and $X_5$ are O, the phosphine-based compound represented by Formula 6 may be substituted with at least two phosphine oxide groups. If both $X_1$ and $X_5$ are S, the phosphine-based compound represented by Formula 6 may be substituted with at least two phosphine sulfide groups.

$L_2$ may be, e.g., a direct linkage or a substituted or unsubstituted phenylene group. In an implementation, $L_2$ may be, e.g., a direct linkage or a phenylene group substituted with a heteroaryl group. In an implementation, $L_2$ may be, e.g., a phenylene group substituted with a pyridyl group or a pyrimidyl group.

$R_{15}$ and $R_{16}$ may each independently be or include, e.g., a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

"$n_1$" may be, e.g., an integer of 0 to 3. "$n_{15}$" and "$n_{16}$" may each independently be, e.g., an integer of 0 to 5. If "$n_{15}$" is 0, the phosphine-based compound represented by Formula 6 may be unsubstituted with $R_{15}$. If "$n_{15}$" is an integer of 2 or more, a plurality of $R_{15}$ may be the same or different. If "$n_{16}$" is 0, the phosphine-based compound represented by Formula 6 may be unsubstituted with $R_{16}$. If "$n_{16}$" is an integer of 2 or more, a plurality of $R_{16}$ may be the same or different.

In an implementation, the phosphine-based compound represented by Formula 1 may be represented by the following Formula 7.

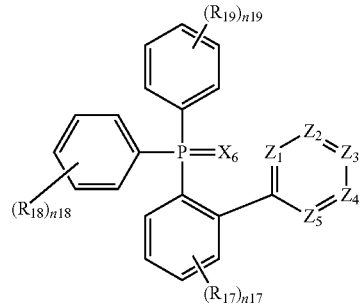

[Formula 7]

In Formula 7, $X_6$ may be, e.g., O or S.

$Z_1$ to $Z_5$ may each independently be, e.g., $CR_{20}$ or N. In an implementation, one or two of $Z_1$ to $Z_5$ may be N. For example, only one or two of $Z_1$ to $Z_5$ may be N, and remaining ones thereof may be $CR_{20}$. For example, one of $Z_1$ to $Z_5$ may be N, and four thereof may be $CR_{20}$. If one of $Z_1$ to $Z_5$ is N, the phosphine-based compound represented by Formula 7 may include a substituted or unsubstituted pyridyl group.

In an implementation, two of $Z_1$ to $Z_5$ may be N, and three thereof may be $CR_{20}$. If two of $Z_1$ to $Z_5$ are N, the phosphine-based compound represented by Formula 7 may include a substituted or unsubstituted diazinyl group. For example, if $Z_1$ and $Z_3$ are N, the phosphine-based compound represented by Formula 7 may include a substituted or unsubstituted pyrimidyl group. If $Z_1$ and $Z_2$ are N, the phosphine-based compound represented by Formula 7 may include a substituted or unsubstituted pyridazinyl group. If $Z_1$ and $Z_3$ are N, the phosphine-based compound represented by Formula 7 may include a substituted or unsubstituted pyrazinyl group.

$R_{17}$ and $R_{20}$ may each independently be or include, e.g., a hydrogen atom, a deuterium atom, a halogen atom, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

In an implementation, $R_{17}$ and $R_{20}$ may each independently be or include, e.g., a hydrogen atom, a substituted or unsubstituted aryl group having 6 to 30 ring carbon atoms, or a substituted or unsubstituted heteroaryl group having 2 to 30 ring carbon atoms. In addition, $R_{17}$ and $R_{20}$ may be each independently represented by Formula 8. At least one of $R_{17}$ or $R_{20}$ is represented by the following Formula 8. In an implementation, when there are two or more $R_{20}$, one of $R_{20}$ may be represented by the following Formula 8.

[Formula 8]

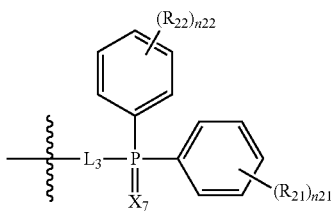

In Formula 8, $X_7$ may be, e.g., O or S. $X_7$ may be the same as $X_8$. For example, if $X_6$ is O, $X_7$ may be also O. If $X_6$ is S, $X_7$ may be also S. If both $X_6$ and $X_7$ are O, the phosphine-based compound represented by Formula 7 may be substituted with at least two phosphine oxide groups. If both $X_6$ and $X_7$ are S, the phosphine-based compound represented by Formula 7 may be substituted with at least two phosphine sulfide groups.

$L_3$ may be, e.g., a direct linkage or a substituted or unsubstituted phenylene group. In an implementation, $L_3$ may be, e.g., a direct linkage or a phenylene group substituted with a heteroaryl group. In an implementation, $L_3$ may be, e.g., a phenylene group substituted with a pyridyl group or a pyrimidyl group.

$R_{21}$ and $R_{22}$ may each independently be or include, e.g., a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

"$n_{22}$" and "$n_{23}$" may each independently be an integer of 0 to 5. If "$n_{22}$" is 0, $R_{17}$ and $R_{20}$ represented by Formula 8 may be unsubstituted with $R_{22}$. If "$n_{22}$" is an integer of 2 or more, a plurality of $R_{22}$ may be the same or different. If "$n_{23}$" is 0, $R_{17}$ and $R_{20}$ represented by Formula 8 may be unsubstituted with $R_{23}$. If "$n_3$" is an integer of 2 or more, a plurality of $R_{23}$ may be the same or different.

In Formula 7, "$n_{17}$" may be, e.g., an integer of 0 to 4. "$n_{18}$" and "$n_{19}$" may each independently be, e.g., an integer of 0 to 5. If "$n_{17}$" is 0, the phosphine-based compound represented by Formula 7 may be unsubstituted with $R_{17}$. If "$n_{17}$" is an integer of 2 or more, a plurality of $R_{17}$ may be the same or different. If "$n_{18}$" is 0, the phosphine-based compound represented by Formula 7 may be unsubstituted with $R_{18}$. If "$n_{18}$" is an integer of 2 or more, a plurality of $R_{18}$ may be the same or different. If "$n_{19}$" is 0, the phosphine-based compound represented by Formula 7 may be unsubstituted with $R_{19}$. If "$n_{19}$" is an integer of 2 or more, a plurality of $R_{19}$ may be the same or different.

In an implementation, the phosphine-based compound represented by Formula 1 may be any a compound of the following Compound Group 1.

[Compound Group 1]

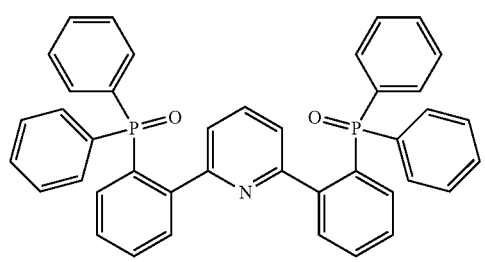

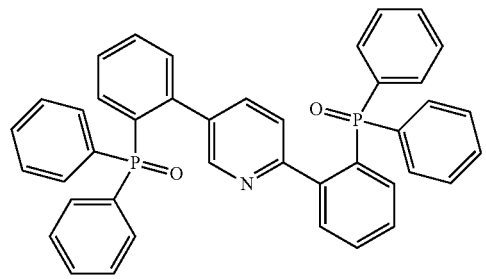

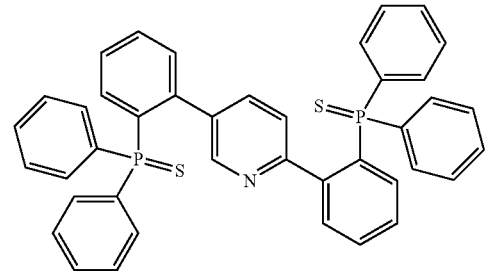

7
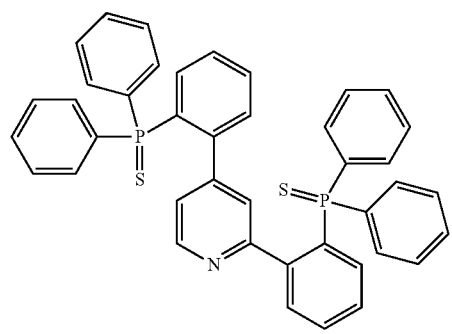
8
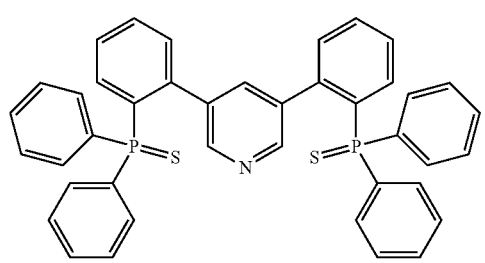
9
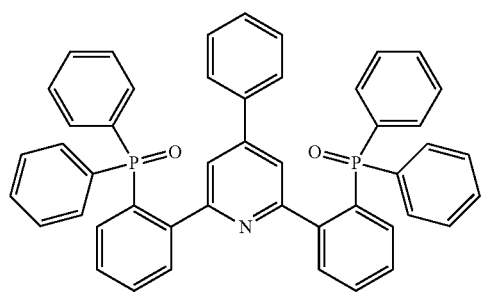
10
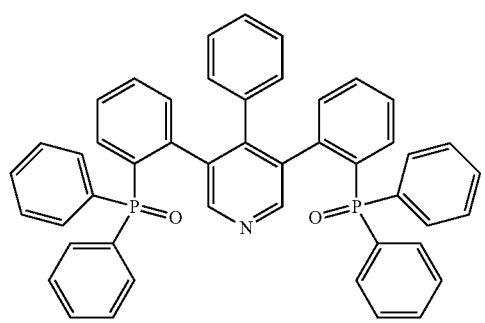
11
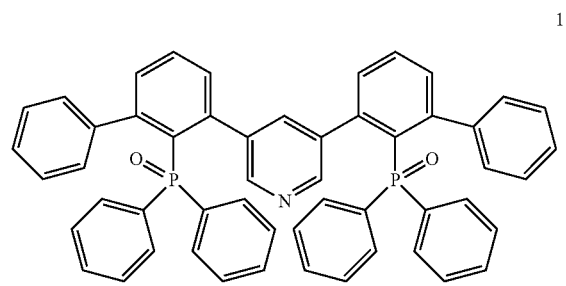
12
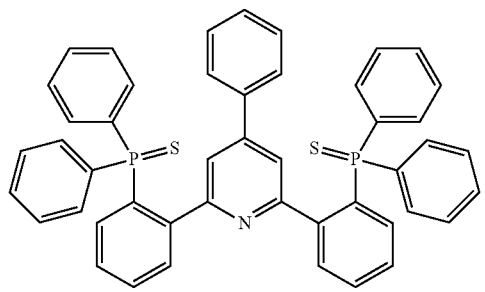
13
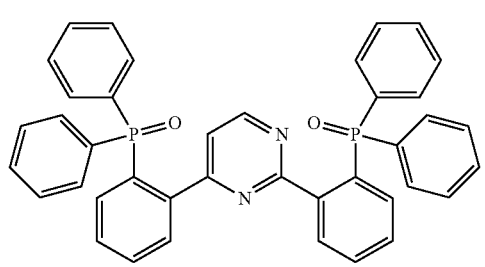
14
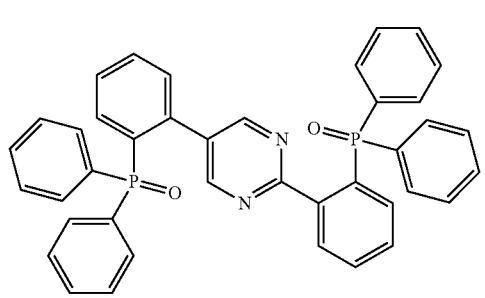
15
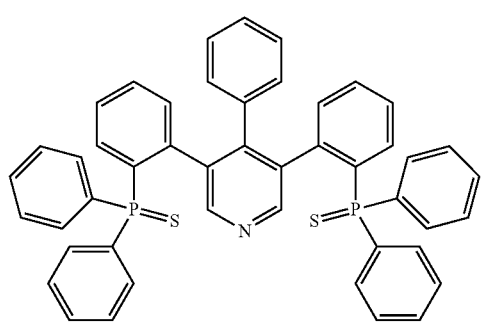
16
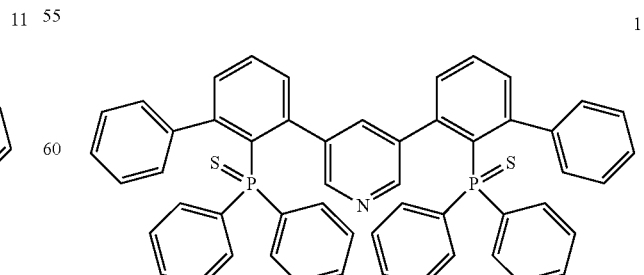

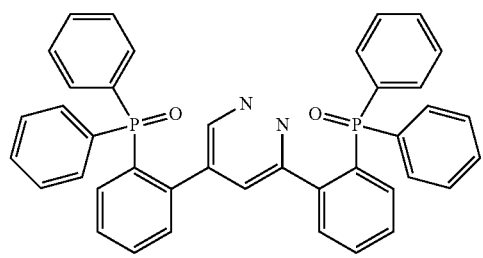
17
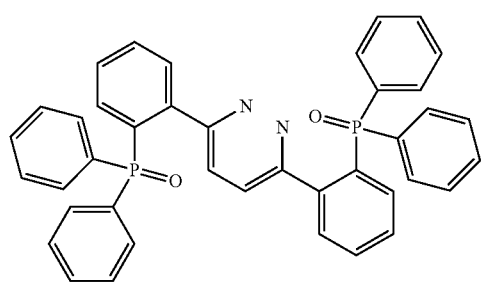
18
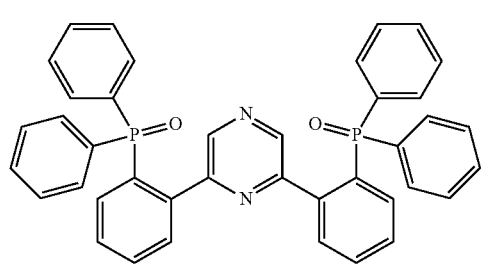
19
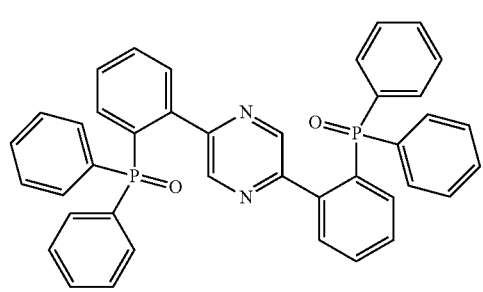
20
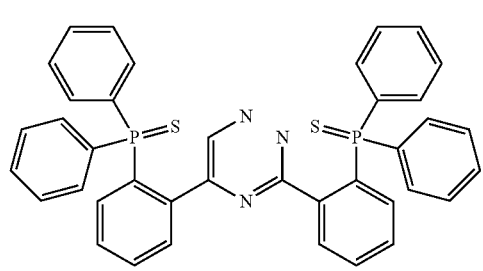
21
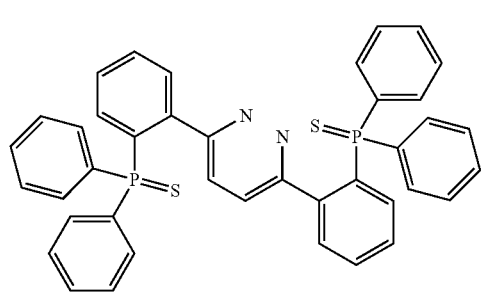
22
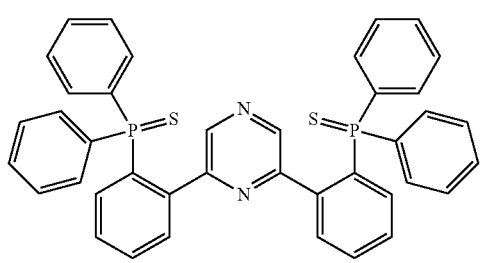
23
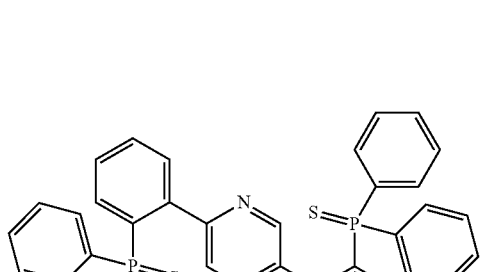
24
In an implementation, the phosphine-based compound represented by Formula 1 may be any a compound of the following Compound Group 2.
[Compound Group 2]
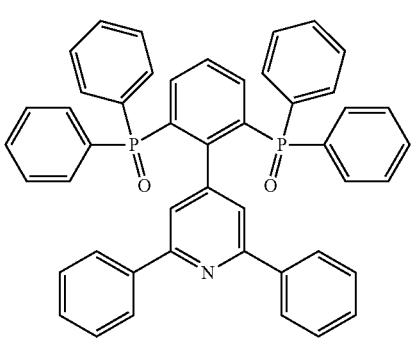
25
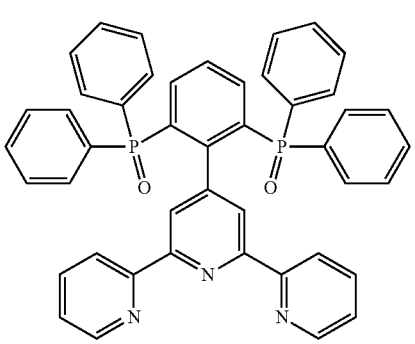
26

27
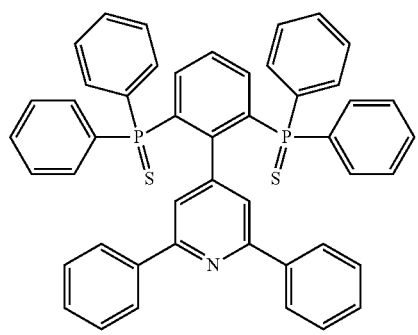
28
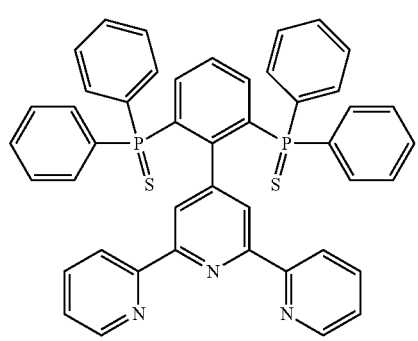
29
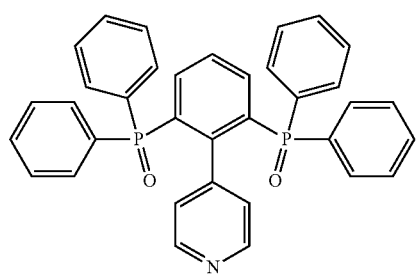
30
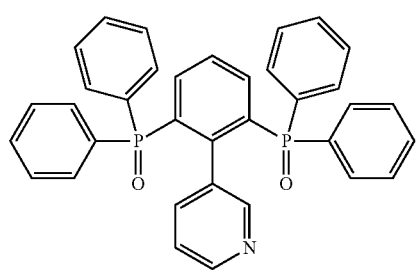
31
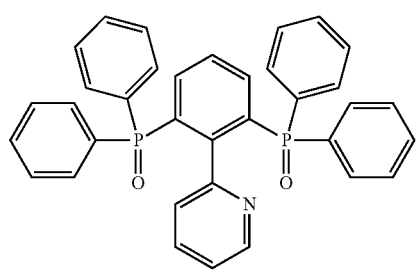
32
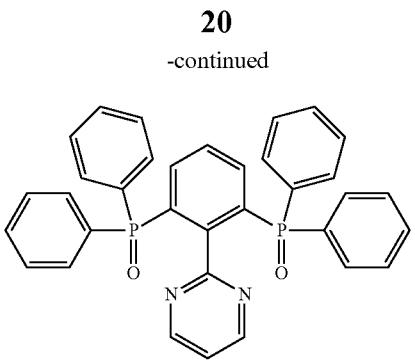
33
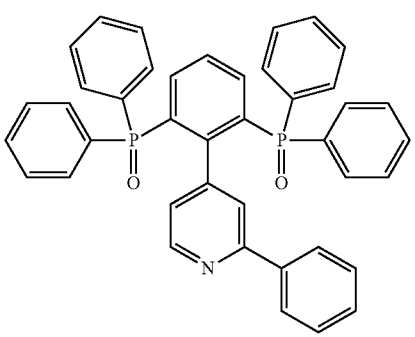
34
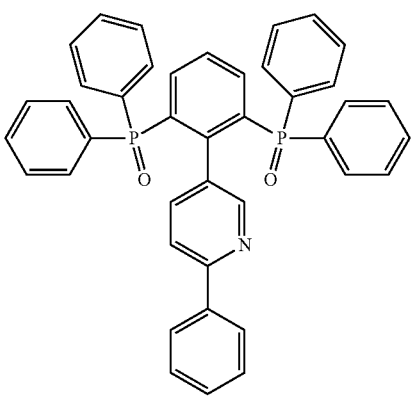
35
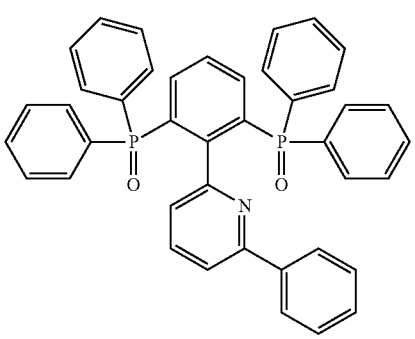

36
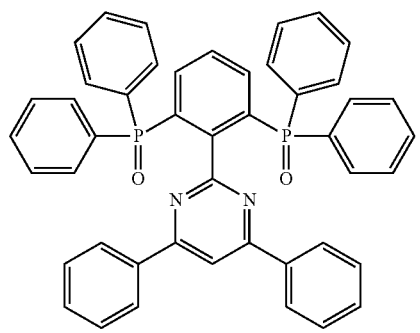
37
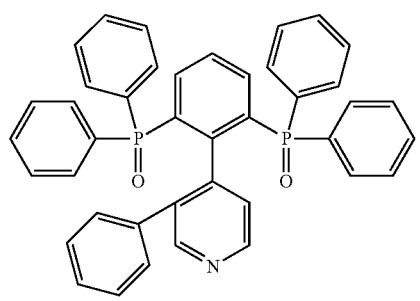
38
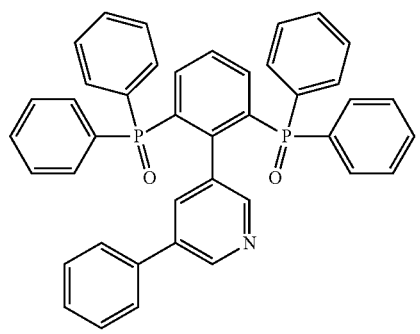
39
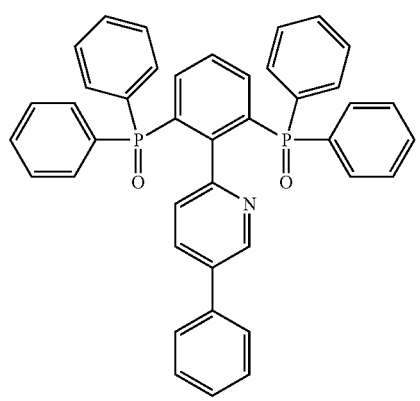
40
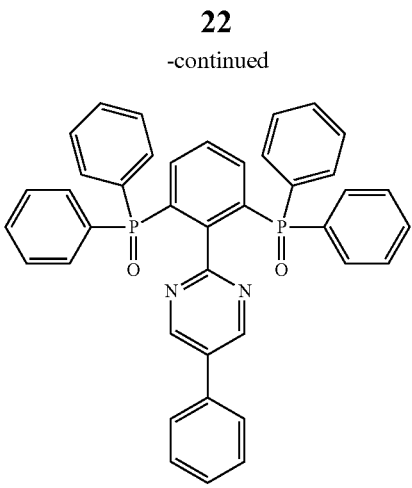
41
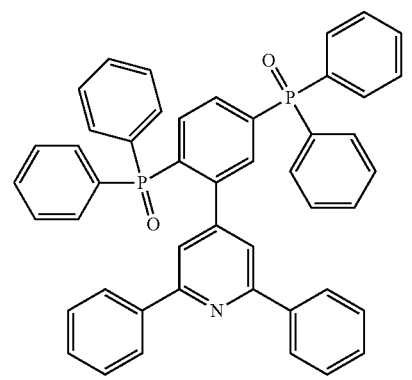
42
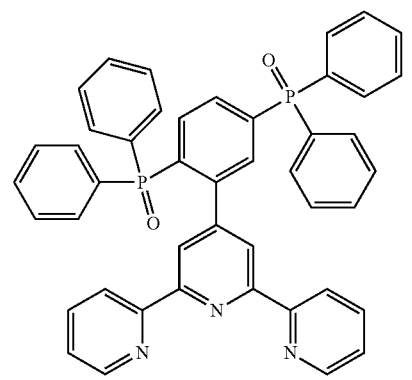
43
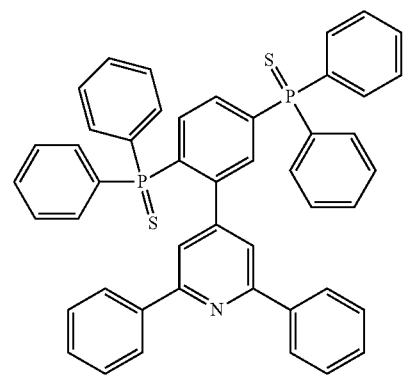

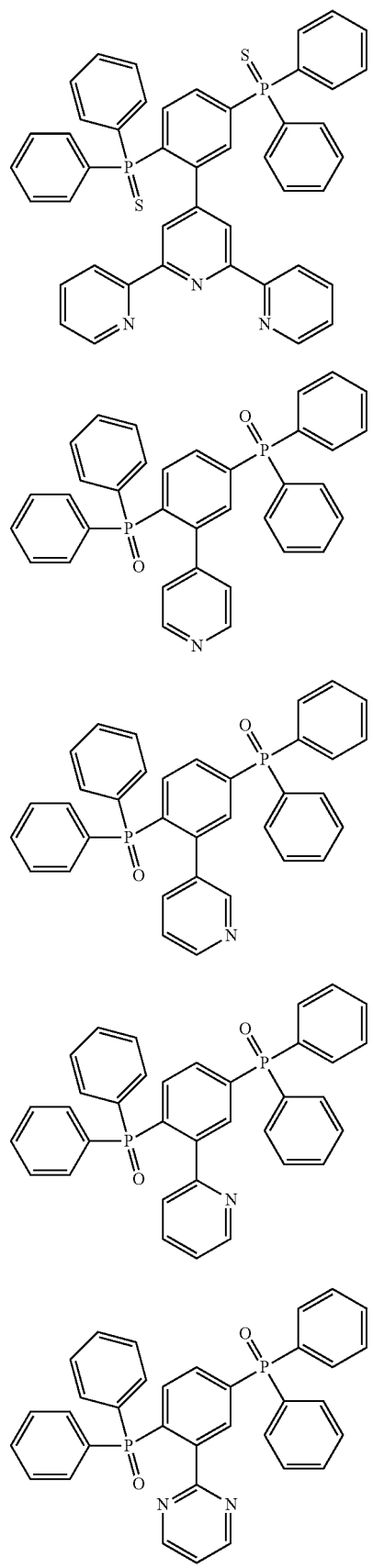
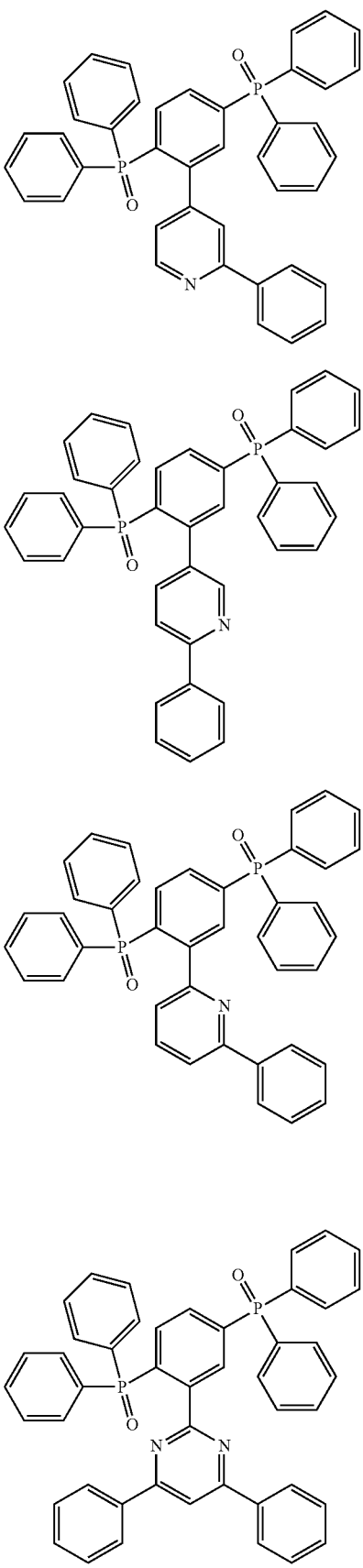

53
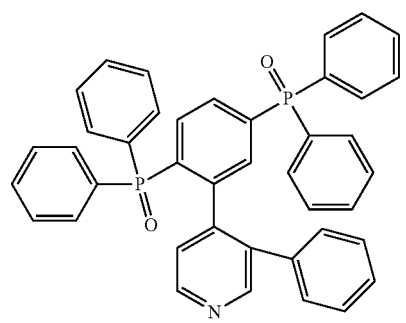
54
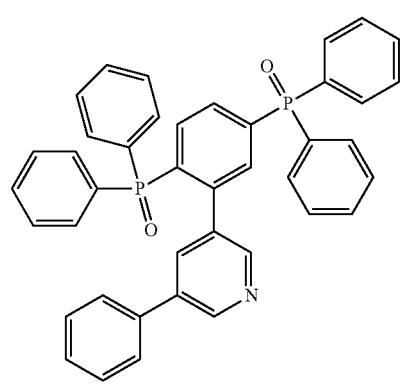
55
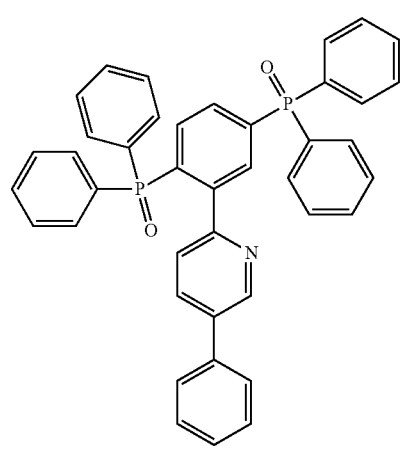
56
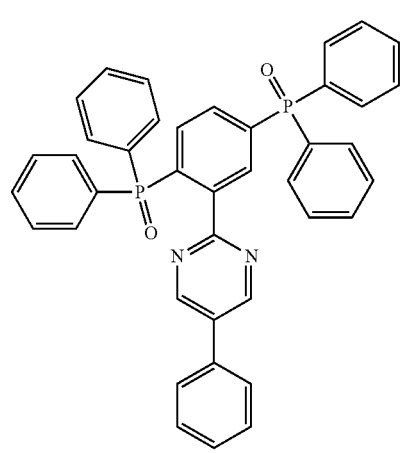
57
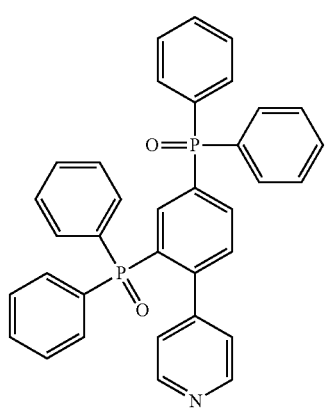
58
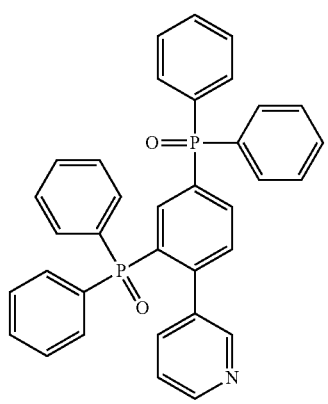
59
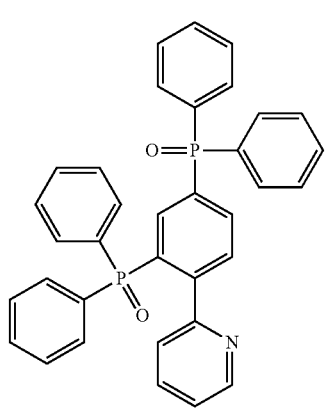
60
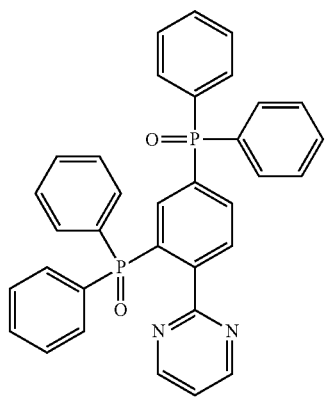

61
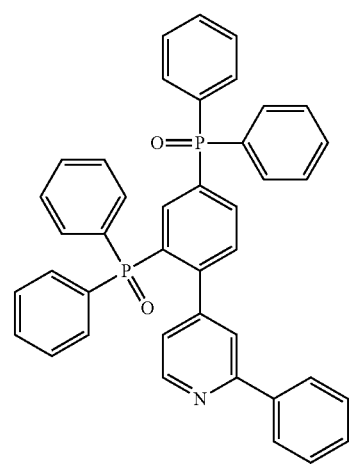
62
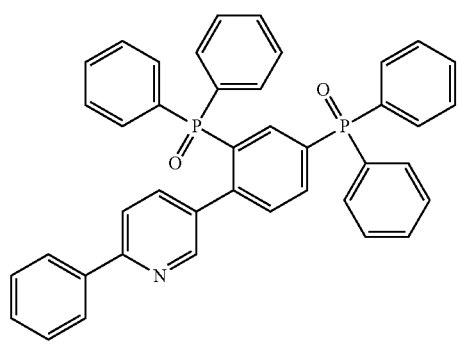
63
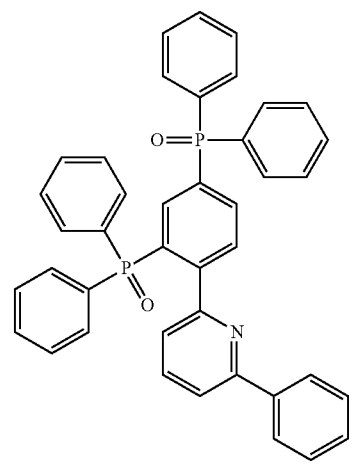
64
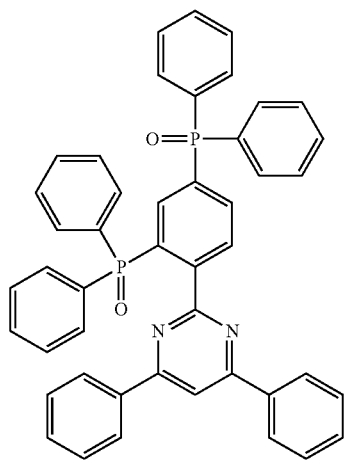
65
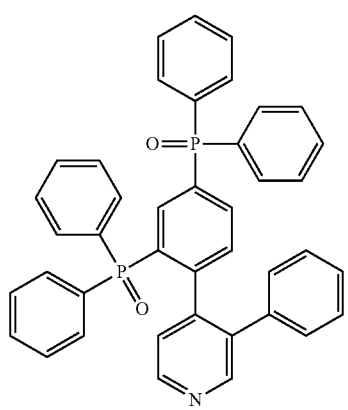
66
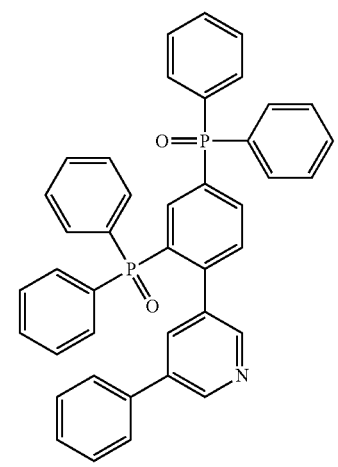

67
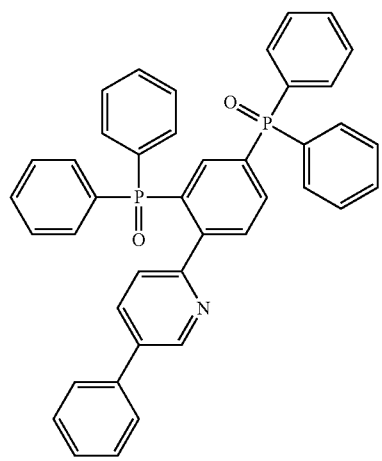
68
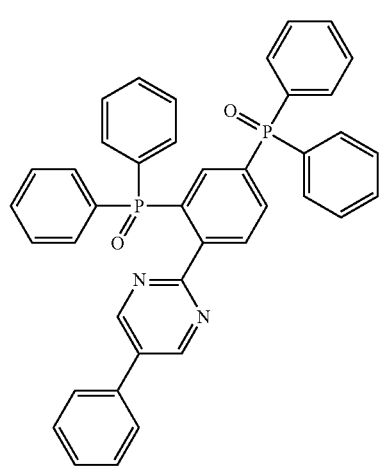
69
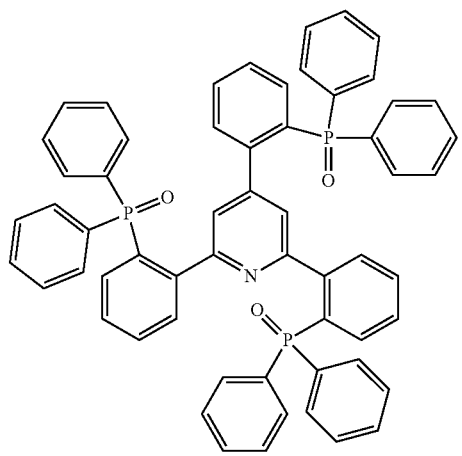
70
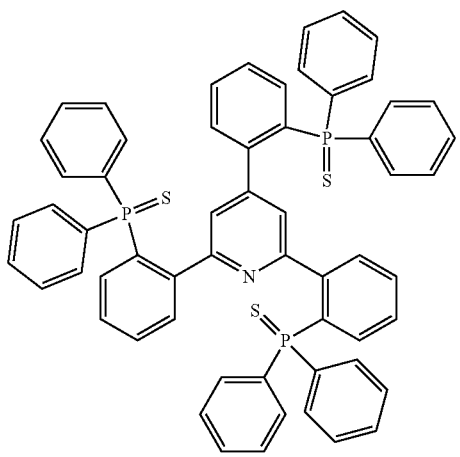
71
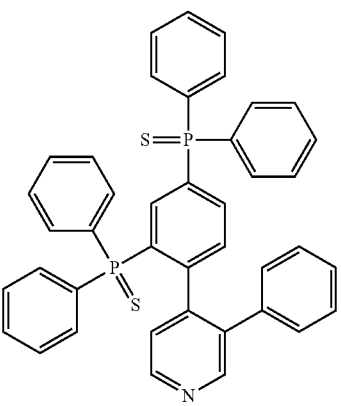
72
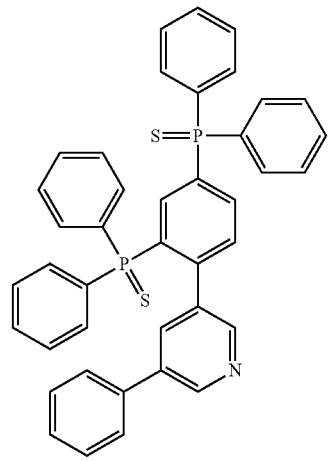

73
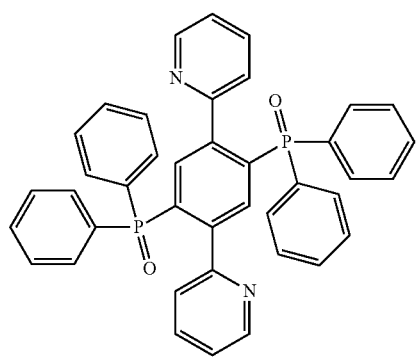
74
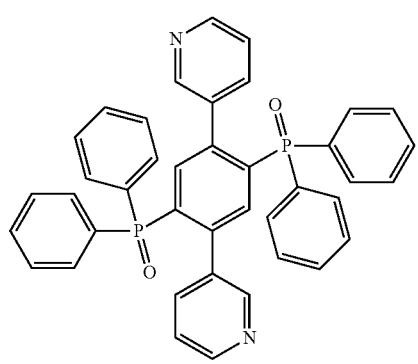
75
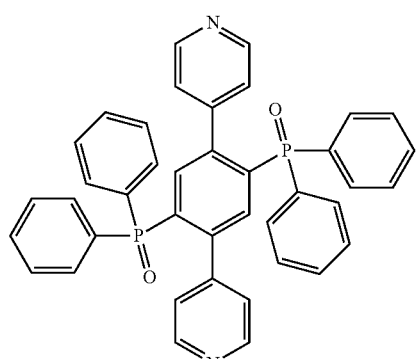
76
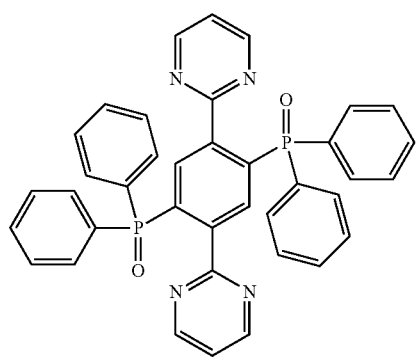
77
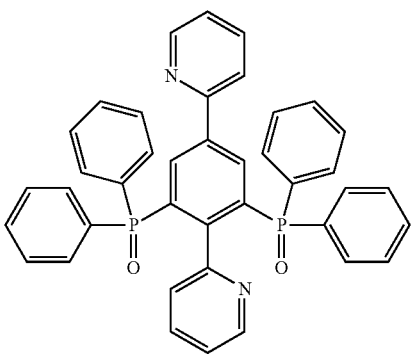
78
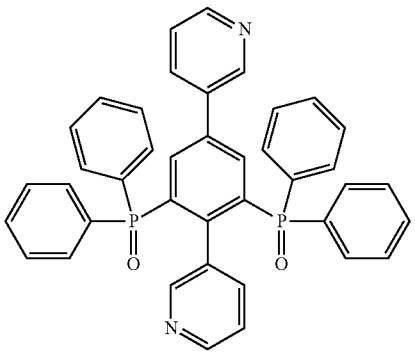
79
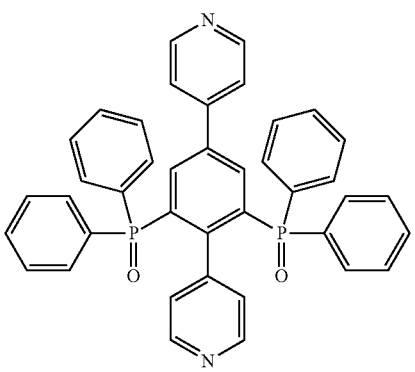
80
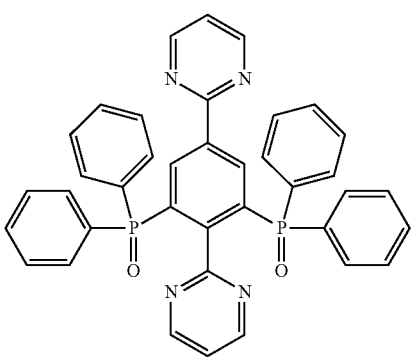

81
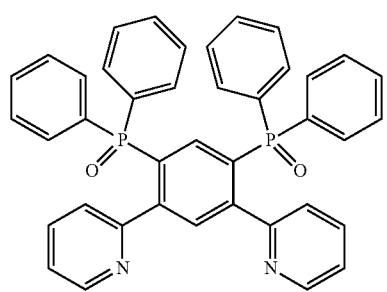
82
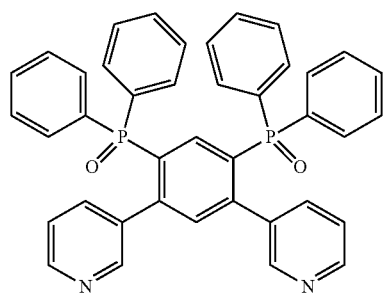
83
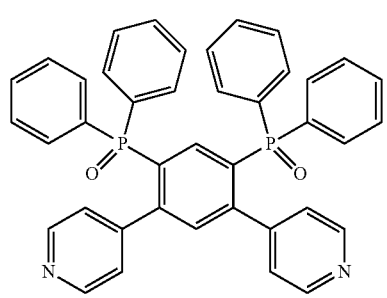
84
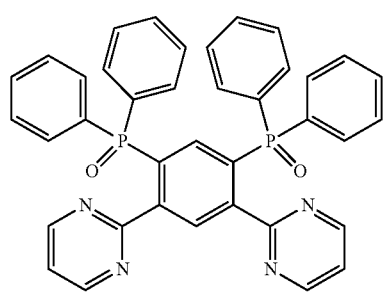
85
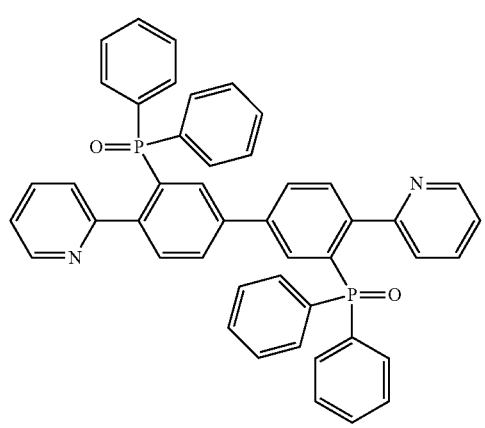
86
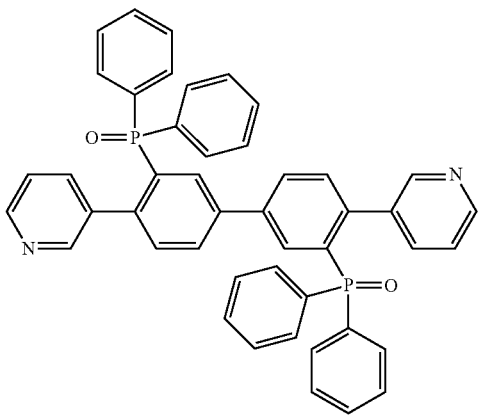
87
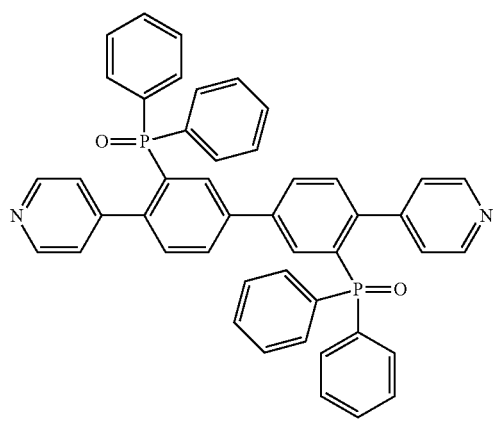
88
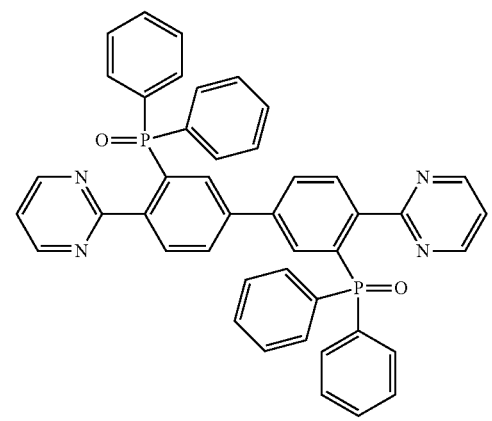
In an implementation, the phosphine-based compound represented by Formula 1 may be any a compound of the following Compound Group 3.

[Compound Group 3]

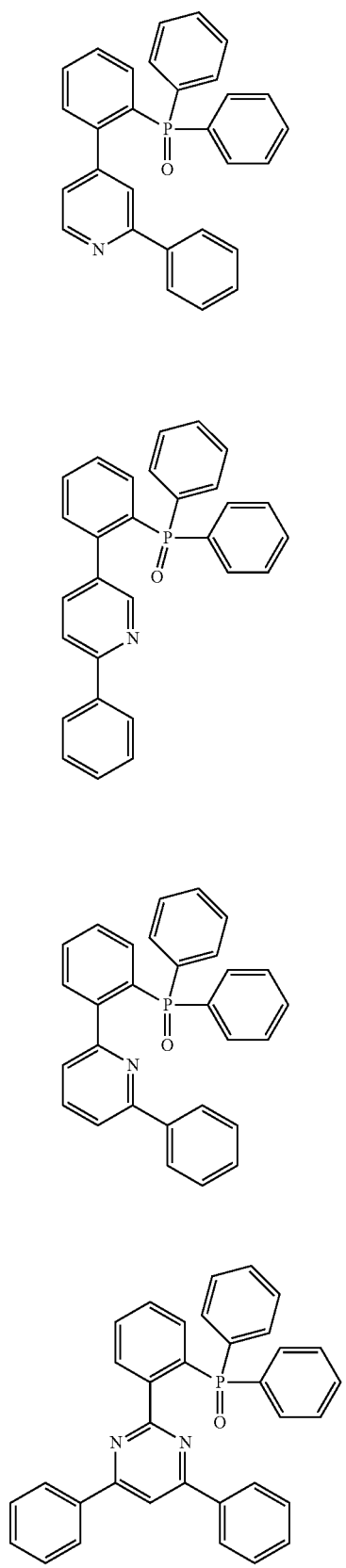

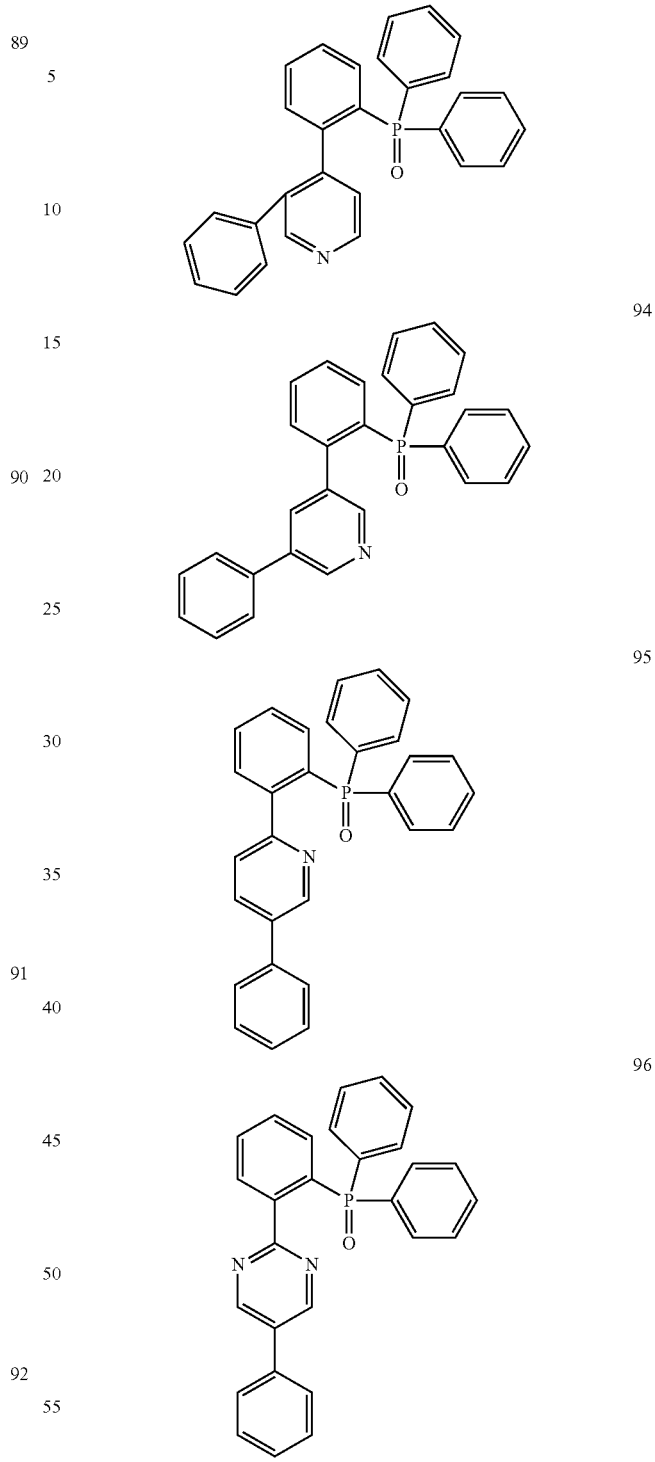

In the phosphine-based compound according to an embodiment, a phosphine oxide group or a phosphine sulfide group may be connected with a six-member aromatic ring containing one or two nitrogen atoms via a phenylene linker. In the phosphine-based compound according to an embodiment, a phosphine oxide group or a phosphine sulfide group may be connected with an one-nitrogen-based six-member aromatic ring or a two-nitrogen-based six-member aromatic ring via a phenylene linker at an ortho position. In an implementation, the one-nitrogen-based six-member aromatic ring may be a substituted or unsubstituted pyridyl group, and the two-nitrogen-based six-member aromatic ring may be a substituted or unsubstituted pyridyl group, a substituted or unsubstituted pyridazinyl group, a substituted or unsubstituted pyrimidyl group, or a substituted or unsubstituted pyrazinyl group.

If the phosphine-based compound represented by Formula 1 is applied to an organic electroluminescence device, high emission efficiency may be secured. The phosphine-based compound in which a phosphine oxide group or a phosphine sulfide group may be connected with an one-nitrogen-based six-member aromatic ring or a two-nitrogen-based six-member aromatic ring at the ortho position of a phenylene linker, and a high value of the lowest triplet energy ($T_1$) level may be attained. For example, the phosphine-based compound represented by Formula 1 may have the value of the lowest triplet energy level of about 3.3 eV or more. The phosphine-based compound according to an embodiment may have a high value of the lowest triplet energy level, and the generation of non-radiative deactivation by which energy of excitons generated in an emission layer moves to a host material of the emission layer and then is lost, may be prevented. Accordingly, the phosphine-based compound according to an embodiment may be used as the host material of an emission layer and may efficiently emit thermally activated delayed fluorescence (TADF) or phosphorescence without losing energy of triplet excitons.

In an implementation, the phosphine-based compound according to an embodiment may have a high value of the lowest triplet energy level, and the diffusion of triplet excitons generated in an emission layer to an electron transport region may be restrained. Accordingly, the phosphine-based compound according to an embodiment may be used as the material of an electron transport layer, and high electron transport properties may be secured. In an implementation, the diffusion of triplet excitons generated in an emission layer to an electron transport region may be restrained, and high emission efficiency may be secured.

Hereinafter, an organic electroluminescence device according to an embodiment will be explained. The explanation will be mainly given with different features from the phosphine-based compound according to an embodiment, and unexplained parts will follow the above-description on the phosphine-based compound according to an embodiment.

An organic electroluminescence device according to an embodiment may include the phosphine-based compound according to an embodiment.

Figure 2:
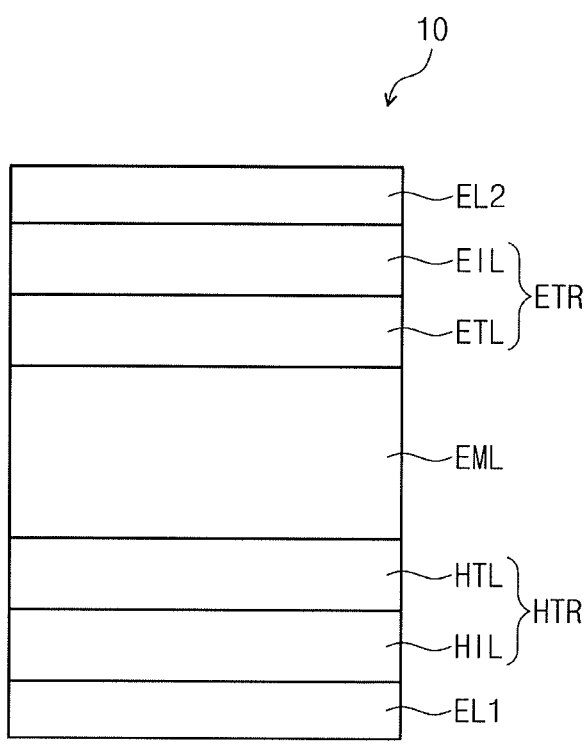
FIG. 2 illustrates a schematic cross-sectional view of an organic electroluminescence device according to an embodiment.
Figure 3:
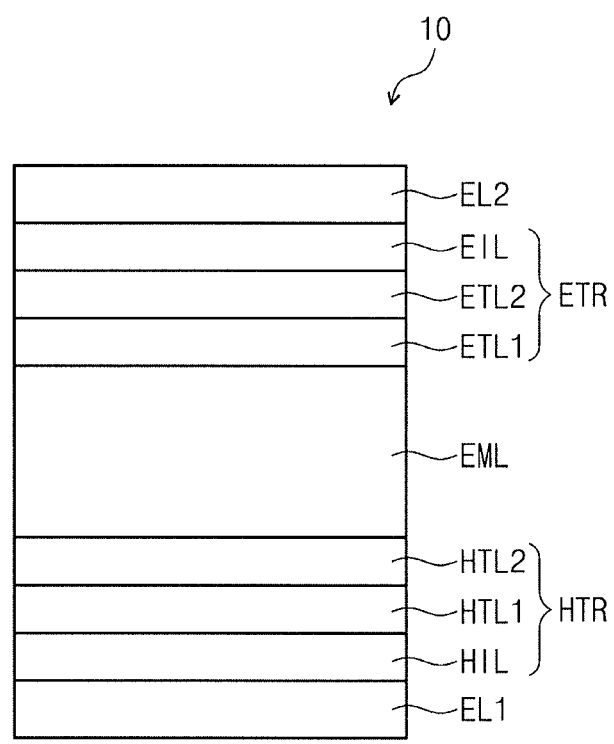
FIG. 3 illustrates a schematic cross-sectional view of an organic electroluminescence device according to an embodiment.

FIG. 1 illustrates a schematic cross-sectional view of an organic electroluminescence device according to an embodiment. FIG. 2 illustrates a schematic cross-sectional view of an organic electroluminescence device according to an embodiment. FIG. 3 illustrates a schematic cross-sectional view of an organic electroluminescence device according to an embodiment.

Referring to FIGS. 1 to 3, an organic electroluminescence device 10 according to an embodiment may include a first electrode EL1, a hole transport region HTR, an emission layer EML, an electron transport region ETR, and a second electrode EL2.

The first electrode EL1 has conductivity. The first electrode EL1 may be a pixel electrode or an anode. The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), or indium tin zinc oxide (ITZO). If the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In an implementation, the first electrode EL1 may have a structure including a plurality of layers including a reflective layer or transflective layer formed using the above materials, and a transparent layer formed using ITO, IZO, ZnO, or ITZO.

The hole transport region HTR is disposed on the first electrode EL1. The hole transport region HTR may include at least one of a hole injection layer HIL, a hole transport layer HTL, a hole buffer layer, or an electron blocking layer.

The hole transport region HTR may have a single layer formed using a single material, a single layer formed using a plurality of different materials, or a multilayer structure including a plurality of layers formed using a plurality of different materials.

For example, as shown in FIG. 2, the hole transport region HTR may have a single layer structure of a hole injection layer HIL or a hole transport layer HTL, or may have a single layer structure formed using a hole injection material and a hole transport material. In an implementation, the hole transport region HTR may have a single layer structure formed using a plurality of different materials, or a laminated structure from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer.

As shown in FIG. 3, the hole transport region HTR may have a plurality of hole transport layers. The hole transport region HTR may include a first hole transport layer HTL1 and a second hole transport layer HTL2 disposed on the first hole transport layer HTL1. The second hole transport layer HTL2 may be a hole transport layer adjacent to an emission layer EML among the plurality of hole transport layers.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthyl)-N,N'-diphenyl-(1,1'-biphenyl)-4,4'-diamine (NPD), triphenylamine-containing polyether ketone (TPAPEK), 4-isopropyl-4'-methyldiphenyliodonium tetrakis(pentafluorophenyl)borate, 1,4,5,8,9,11-hexaazatriphenylenehexacarbonitrile (HAT-CN), etc.

The hole transport layer HTL may include, for example, carbazole derivatives such as N-phenyl carbazole, polyvinyl carbazole, and 1,3-bis(N-carbazolyl)benzene (mCP), fluorene-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)

triphenylamine (TCTA), N,N'-di(1-naphthyl)-N,N'-diphenyl-[1,1'-biphenyl]-4,4'-diamine (NPD), 4,4'-cyclohexylidene bis[N,N-bis(4-methylphenyl)benzenamine](TAPC), 4,4'-bis[N,N'-(3-tolyl)amino]-3,3'-dimethylbiphenyl (HMTPD), etc.

The thickness of the hole transport region HTR may be from about 150 Å to about 12,000 Å, for example, from about 150 Å to about 1,500 Å. If the hole transport region HTR includes both the hole injection layer HIL and the hole transport layer HTL, the thickness of the hole injection layer HIL may be from about 100 Å to about 10,000 Å, for example, from about 100 Å to about 1,000 Å, and the thickness of the hole transport layer HTL may be from about 50 Å to about 1,000 Å. If the thicknesses of the hole transport region HTR, the hole injection layer HIL, and the hole transport layer HTL satisfy the above-described ranges, satisfactory hole transport properties may be obtained without the substantial increase of a driving voltage.

The hole transport region HTR may further include a charge generating material in addition to the above-described materials to improve conductivity. The charge generating material may be dispersed in the hole transport region HTR uniformly or non-uniformly. The charge generating material may be, for example, a p-dopant. The p-dopant may be one of quinone derivatives, metal oxides, or cyano group-containing compounds. Examples of the p-dopant may include quinone derivatives such as tetracyanoquinodimethane (TCNQ), and 2,3,5,6-tetrafluoro-tetracyanoquinodimethane (F4-TCNQ), metal oxides such as tungsten oxide, and molybdenum oxide.

As described above, the hole transport region HTR may further include at least one of a hole buffer layer or an electron blocking layer in addition to the hole injection layer HIL and the hole transport layer HTL. The hole buffer layer may compensate an optical resonance distance according to the wavelength of light emitted from the emission layer EML and increase light emission efficiency. Materials included in the hole transport region HTR may be used as materials included in the hole buffer layer. The electron blocking layer is a layer preventing electron injection from the electron transport region ETR into the hole transport region HTR.

The emission layer EML is disposed on the hole transport region HTR. The emission layer EML may be disposed on the hole transport layer HTL and may make contact with the hole transport layer HTL. The thickness of the emission layer EML may be, e.g., from about 100 Å to about 600 Å. In an implementation, the emission layer EML may have a single layer formed using a single material, a single layer formed using a plurality of different materials, or a multi-layer structure having a plurality of layers formed using a plurality of different materials.

Hereinafter, a case where the phosphine-based compound according to an embodiment is included in an emission layer EML, will be explained. In an implementation, the phosphine-based compound according to an embodiment may be included in at least one organic layer provided between the first electrode EL1 and the second electrode EL2. In an implementation, the phosphine-based compound according to an embodiment may be included in an electron transport region ETR.

The emission layer EML may include the phosphine-based compound according to an embodiment. For example, the organic electroluminescence device according to an embodiment may include a phosphine-based compound represented by Formula 1 below in the emission layer EML.

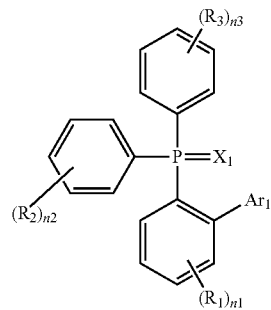

[Formula 1]

In Formula 1, particular explanation on $X_1$, $Ar_1$, $R_1$ to $R_3$, and "$n_1$" to "$n_3$" is the same as described above, and will be omitted.

Particular explanation on the phosphine-based compound represented by Formula 1 is the same as described above, and will be omitted.

The emission layer EML may emit one of red light, green light, blue light, white light, yellow light, or cyan light. The emission layer EML may include a fluorescent material or a phosphorescent material. The phosphine-based compound according to an embodiment may be a material for blue emitting thermally activated delayed fluorescence (TADF). In an implementation, the phosphine-based compound according to an embodiment may be a material for emitting phosphorescence.

In an implementation, the emission layer EML may include a host and a dopant. The phosphine-based compound represented by Formula 1 may be included as the host material of the emission layer EML. The phosphine-based compound represented by Formula 1 may have the value of the lowest triplet energy level value of about 3.3 eV or more.

In an implementation, the emission layer EML may include an additional suitable material in addition to the phosphine-based compound according to an embodiment as a host material. The additional host material of the emission layer EML may be selected from anthracene derivatives, fluoranthene derivatives, pyrene derivatives, arylacetylene derivatives, fluorene derivatives, perylene derivatives, chrysene derivatives, phenanthrene derivatives, or the like, e.g., pyrene derivatives, perylene derivatives, chrysene derivatives, phenanthrene derivatives, or anthracene derivatives. In an implementation, as the host material of the emission layer EML, anthracene derivatives represented by Formula 9 below may be used.

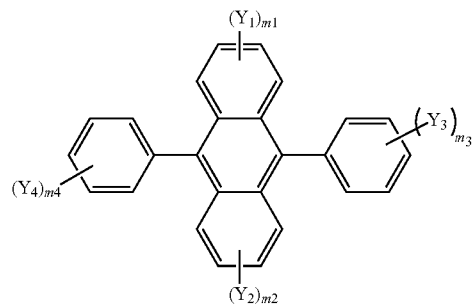

[Formula 9]

In Formula 9, $Y_1$ to $Y_4$ are each independently a hydrogen atom, a deuterium atom, a halogen atom, a substituted or unsubstituted silyl group, a substituted or unsubstituted alkyl group having 1 to 15 carbon atoms, a substituted or unsubstituted aryl group having 6 to 30 ring carbon atoms, or a substituted or unsubstituted heteroaryl group having 2 to 30 ring carbon atoms, "$m_1$" and "$m_2$" are each independently an integer of 0 to 4, "$m_3$" and "$m_4$" are each independently an integer of 0 to 5. In Formula 9, $Y_3$ and $Y_4$ may be each independently combined with an adjacent group to form a ring.

The compound represented by Formula 9 may include, e.g., the compounds represented by the following structures.

a-1 a-2 a-3 a-4

-continued a-5

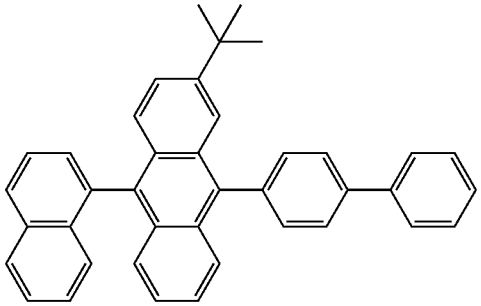

a-6

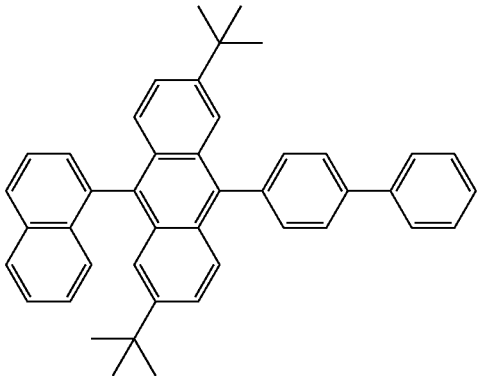

a-7

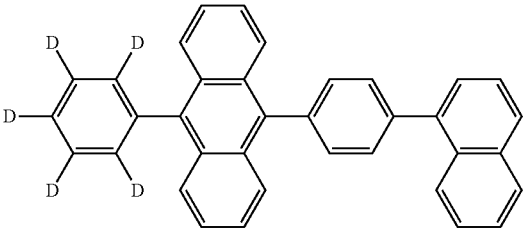

a-8

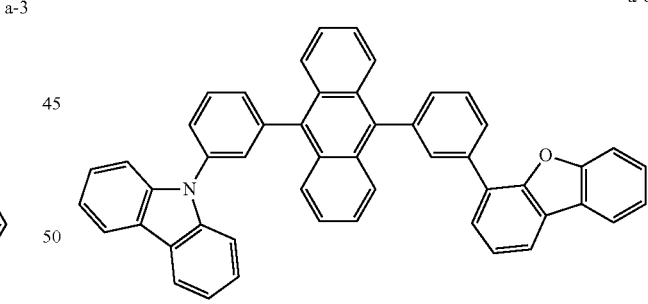

a-9

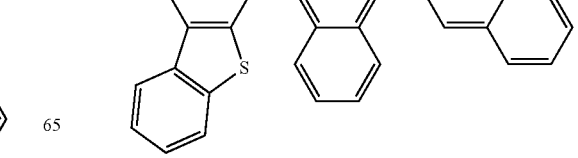

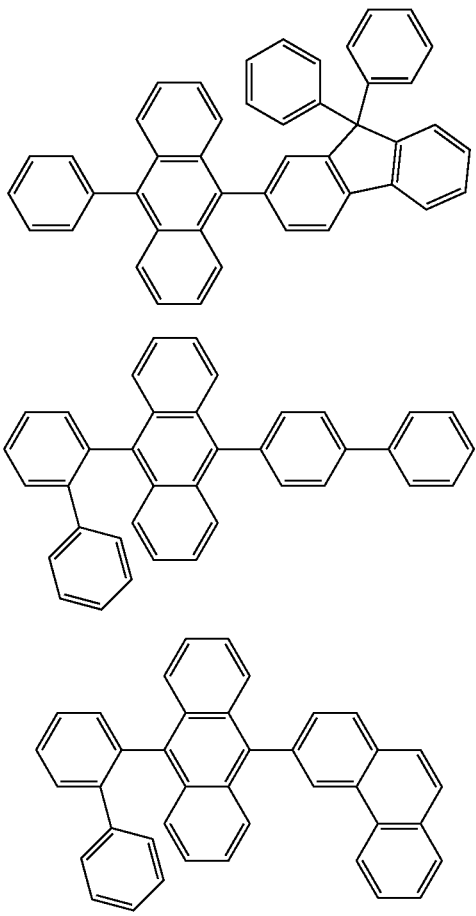

The additional host may include, e.g., tris(8-hydroxyquinolino)aluminum (Alq3), 4,4'-bis(N-carbazolyl)-1,1'-biphenyl (CBP), poly(N-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), etc.

The dopant may include, e.g., styryl derivatives (for example, 1,4-bis[2-(3-N-ethylcarbazolyl)vinyl]benzene (BCzVB), 4-(di-p-tolylamino)-4'-[(di-p-tolylamino)styryl] stilbene (DPAVB), N-(4-((E)-2-(6-((E)-4-(diphenylamino) styryl)naphthalen-2-yl)vinyl)phenyl)-N-phenylbenzenamine (N-BDAVBi)), perylene and the derivatives thereof (for example, 2,5,8,11-tetra-tert-butylperylene (TBP)), pyrene and the derivatives thereof (for example, 1,1-dipyrene, 1,4-dipyrenylbenzene, 1,4-bis(N,N-diphenylamino)pyrene), etc. In an implementation, the dopant may be, e.g., 10-phenyl-10H,10'H-spiro[acridine-9,9'-anthracen]-10'-one.

If the emission layer EML emits red light, the emission layer EML may further include, e.g., a fluorescent material including tris(dibenzoylmethanato)phenanthroline europium (PBD:Eu(DBM)$_3$(Phen)) or perylene. If the emission layer EML emits red light, the dopant included in the emission layer EML may be selected from a metal complex or an organometallic complex such as bis(1-phenylisoquinoline)acetylacetonate iridium (PIQIr(acac)), bis(1-phenylquinoline)acetylacetonate iridium (PQIr(acac), tris(1-phenylquinoline)iridium (PQIr), and octaethylporphyrin platinum (PtOEP), rubrene and the derivatives thereof, or 4-dicyanomethylene-2-(p-dimethylaminostyryl)-6-methyl-4H-pyran (DCM) and the derivatives thereof.

If the emission layer EML emits green light, the emission layer EML may further include a fluorescent material including, for example, tris(8-hydroxyquinolino)aluminum (Alq$_3$). If the emission layer EML emits green light, the dopant included in the emission layer EML may be selected from a metal complex or organometallic complex such as fac-tris (2-phenylpyridine)iridium (Ir(ppy)$_3$), coumarin, or the derivatives thereof.

If the emission layer EML emits blue light, the emission layer EML may further include a fluorescent material including at least one selected from the group consisting of, for example, spiro-DPVBi, spiro-6P, distyryl-benzene (DSB), distyryl-arylene (DSA), a polyfluorene (PFO)-based polymer, and a poly(p-phenylene vinylene) (PPV)-based polymer. If the emission layer EML emits blue light, the dopant included in the emission layer EML may be selected from, e.g., a metal complex or an organometallic complexes such as (4,6-F2ppy)$_2$Irpic, and perylene and the derivatives thereof.

The electron transport region ETR is provided on the emission layer EML. The electron transport region ETR may include at least one of an electron blocking layer, an electron transport layer ETL or an electron injection layer EIL. In an implementation, the organic electroluminescence device according to an embodiment may include the phosphine-based compound represented by Formula 1 in the electron transport region ETR.

The electron transport region ETR may have a single layer formed using a single material, a single layer formed using a plurality of different materials, or a multilayer structure having a plurality of layers formed using a plurality of different materials.

For example, as shown in FIG. 2, the electron transport region ETR may have a single layer structure of the electron injection layer EIL or the electron transport layer ETL, or a single layer structure formed using an electron injection material and an electron transport material. In an implementation, the electron transport region ETR may have a single layer structure having a plurality of different materials, or a structure laminated from the first electrode EL1 of electron transport layer ETL/electron injection layer EIL, or hole blocking layer/electron transport layer ETL/electron injection layer EIL.

As shown in FIG. 3, the electron transport region ETR may have a plurality of electron transport layers. The electron transport region ETR may include a first electron transport layer ETL1 and a second electron transport layer ETL2 disposed on the first electron transport layer ETL1. The first electron transport layer ETL1 may be a hole transport layer adjacent to the emission layer EML among the plurality of the electron transport layers.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

The electron transport region ETR may include the phosphine-based compound according to an embodiment. The electron transport region ETR may include the phosphine-based compound according to an embodiment as an electron transport material. The layer including the phosphine-based compound according to an embodiment may be an electron transport layer ETL. As shown in FIG. 3, if the electron transport layer includes the first electron transport layer ETL1 and the second electron transport layer ETL2, the phosphine-based compound according to an embodiment may be included in the first electron transport layer ETL. The phosphine-based compound according to an embodiment may be included in a layer adjacent to the emission layer EML among the electron transport region ETR.

The electron transport region ETR may further include a suitable material in addition to the phosphine-based compound according to an embodiment. The electron transport layer ETL may include, e.g., tris(8-hydroxyquinolinato) aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl) anthracene (ADN), bis[2-(diphenylphosphino)phenyl]ether oxide (DPEPO) or a mixture thereof. The thickness of the electron transport layers ETL may be from about 100 Å to about 1,000 Å, e.g., about 150 Å to about 500 Å. If the thickness of the electron transport layers ETL satisfies the above-described range, satisfactory electron transport properties may be obtained without substantial increase of a driving voltage.

If the electron transport region ETR includes an electron injection layer EIL, the electron injection layer EIL may include a metal such as Al, Ag, Li, Mg and Ca, or a mixture thereof. In an implementation, the electron injection layer EIL may use LiF, lithium quinolate (LiQ), $Li_2O$, BaO, NaCl, CsF, a metal in lanthanoides such as Yb, or a metal halide such as RbCl and RbI. The electron injection layer EIL also may be formed using a mixture material of an electron transport material and an insulating organo metal salt. The organo metal salt may be a material having an energy band gap of about 4 eV or more. For example, the organo metal salt may include, for example, a metal acetate, a metal benzoate, a metal acetoacetate, a metal acetylacetonate, or a metal stearate. The thickness of the electron injection layer EIL may be from about 10 Å to about 100 Å. If the thickness of the electron injection layer EIL satisfies the above described range, satisfactory electron injection properties may be obtained without inducing the substantial increase of a driving voltage.

The electron transport region ETR may include a hole blocking layer as described above. The hole blocking layer may include, e.g., at least one of 2,9-dimethyl-4,7-diphenyl-1,10-phenanthroline (BCP), or 4,7-diphenyl-1,10-phenanthroline (Bphen).

The second electrode EL2 is disposed on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may be formed using transparent metal oxides, e.g., ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

In an implementation, the second electrode EL2 may be connected with an auxiliary electrode. If the second electrode EL2 is connected with the auxiliary electrode, the resistance of the second electrode EL2 may decrease.

In the organic electroluminescence device 10, according to the application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to generate excitons, and light may be emitted via the transition of the excitons from an excited state to a ground state.

If the organic electroluminescence device 10 is a top emission type, the first electrode EL1 may be a reflective electrode, and the second electrode EL2 may be a transmissive electrode or a transflective electrode. If the organic electroluminescence device 10 is a bottom emission type, the first electrode EL1 may be a transmissive electrode or a transflective electrode, and the second electrode EL2 may be a reflective electrode.

The organic electroluminescence device according to an embodiment may include the phosphine-based compound represented by Formula 1, thereby securing high emission efficiency. The phosphine-based compound according to an embodiment may be used as the host material of an emission layer EML, thereby accomplishing high emission efficiency of an organic electroluminescence device. For example, a phosphine oxide group or a phosphine sulfide group may be connected with a one-nitrogen-based or two-nitrogen-based six-member aromatic ring at the ortho position of a phenylene group in the phosphine-based compound represented by Formula 1, and a high value of the lowest triplet energy ($T_1$) level may be attained. Accordingly, in the organic electroluminescence device using the phosphine-based compound as the host material, the generation of non-radiative deactivation by which energy of excitons generated in an emission layer moves to the host material of the emission layer and then is lost, may be prevented. Accordingly, the increase of efficiency of the organic electroluminescence device may become possible.

In an implementation, the organic electroluminescence device according to an embodiment may include the phosphine-based compound represented by Formula 1 in an electron transport layer, and high emission efficiency may be secured. The phosphine-based compound represented by Formula 1 may help secure high electron transport properties and a high value of the lowest triplet energy level, and the diffusion of triplet excitons generated in the emission layer to an electron transport region may be restrained and the efficiency of the organic electroluminescence device may be increased.

The phosphine-based compounds according to example embodiments may be synthesized, e.g., as follows.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthetic Examples

1. Synthesis of Compound 1
(Synthesis of Compound A)

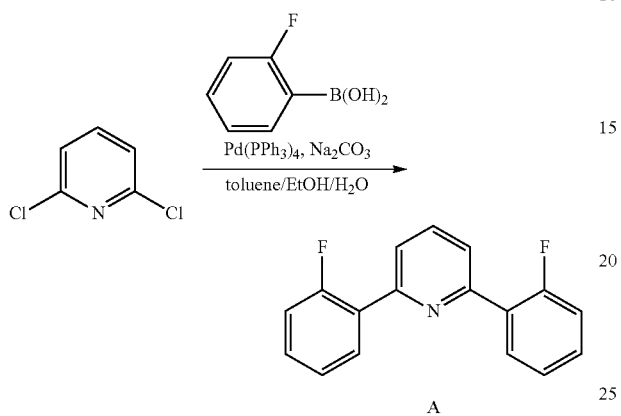

Under an argon (Ar) atmosphere, 5.0 g of 2,6-dichloropyridine, 11.8 g of 2-fluorophenylboronic acid, 3.9 g of tetrakis(triphenylphosphine)palladium(0), and 17.9 g of sodium carbonate were added to a 500 ml, three-neck flask, followed by heating and stirring in 180 ml of a mixed solvent of toluene, water, and ethanol (10:2:1) at about 80° C. for about 10 hours. After cooling in air, water was added, an organic layer was separated and taken, the organic layer was dried with magnesium sulfate, and solvents were evaporated under reduced pressure. The crude product thus obtained was separated by silica gel column chromatography to obtain 6.6 g (yield 74%) of Compound A. The molecular weight of Compound A measured by FAB-MS was 267.

(Synthesis of Compound 1)

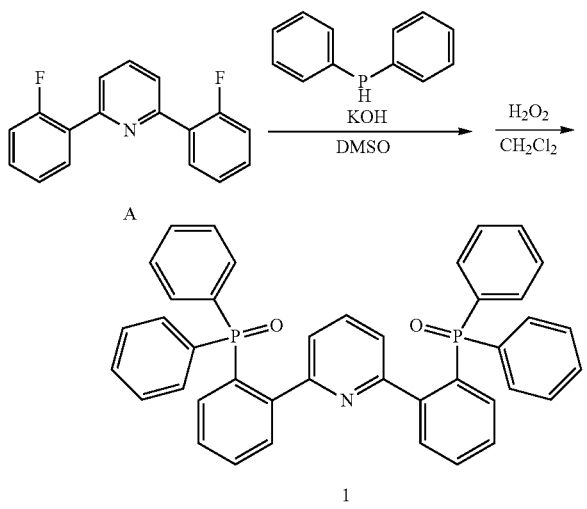

Under an argon (Ar) atmosphere, 4.2 g of potassium hydroxide, 6.5 ml of diphenyl phosphine, and 95 ml of anhydrous dimethyl sulfoxide were added to a 500 ml, three-neck flask, followed by stirring at ambient temperature for about 2 hours. 5.0 g of Compound A was added thereto and stirred for about 1 hour. Then, water and dichloromethane were added thereto, and an organic layer was separated and taken. The organic layer was dried with magnesium sulfate and solvents were evaporated under reduced pressure. The crude product thus obtained was dissolved in 180 ml of dichloromethane, and 2 ml of hydrogen peroxide (30%) was added thereto dropwise at about 0° C. After stirring at ambient temperature for about 3 hours, water and dichloromethane were added and an organic layer was separated and taken. The organic layer was dried with magnesium sulfate, and solvents were evaporated under reduced pressure. The crude product thus obtained was separated by recrystallization using toluene to obtain 5.9 g (yield 50%) of Compound 1. The molecular weight of Compound 1 measured by FAB-MS was 632. From the results, the compound thus obtained was identified as Compound 1.

2. Synthesis of Compound 4
(Synthesis of Compound B)

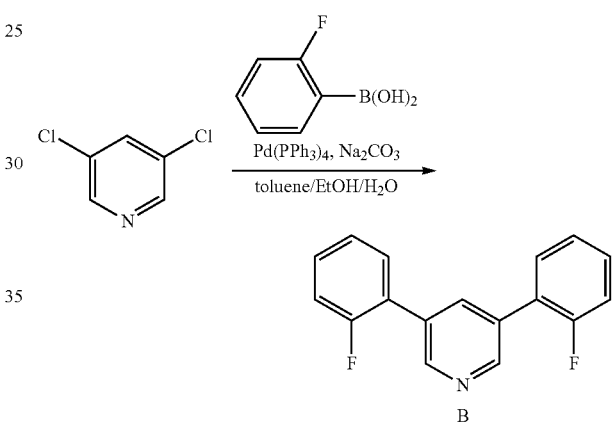

Under an argon (Ar) atmosphere, 5.0 g of 3,5-dichloropyridine, 11.8 g of 2-fluorophenylboronic acid, 3.9 g of tetrakis(triphenylphosphine)palladium(0), and 17.9 g of sodium carbonate were added to a 500 ml, three-neck flask, followed by heating and stirring in 180 ml of a mixed solvent of toluene, water, and ethanol (10:2:1) at about 80° C. for about 12 hours. After cooling in air, water was added, an organic layer was separated and taken, the organic layer was dried with magnesium sulfate, and solvents were evaporated under reduced pressure. The crude product thus obtained was separated by silica gel column chromatography to obtain 6.1 g (yield 68%) of Compound B. The molecular weight of Compound B measured by FAB-MS was 267.

(Synthesis of Compound 4)

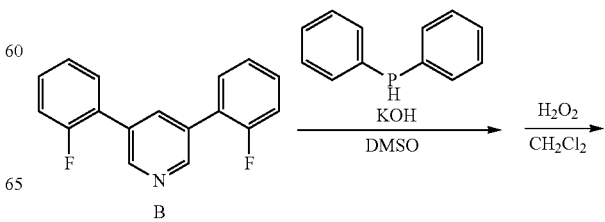

-continued

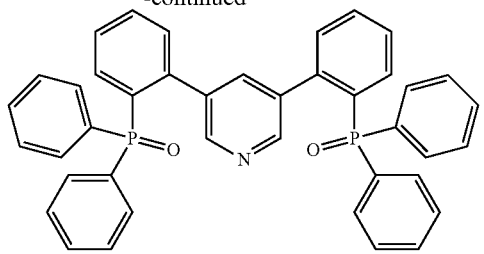

4

-continued

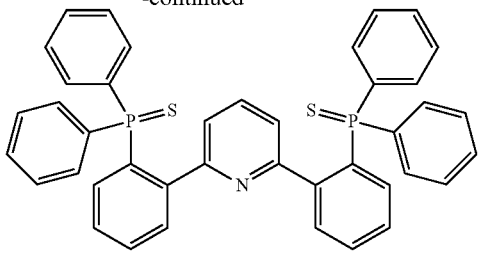

5

Under an argon (Ar) atmosphere, 4.2 g of potassium hydroxide, 6.5 ml of diphenyl phosphine, and 95 ml of anhydrous dimethyl sulfoxide were added to a 500 ml, three-neck flask, followed by stirring at ambient temperature for about 2 hours. 5.0 g of Compound B was added thereto and stirred for about 1 hour. Then, water and dichloromethane were added thereto, and an organic layer was separated and taken. The organic layer was dried with magnesium sulfate and solvents were evaporated under reduced pressure. The crude product thus obtained was dissolved in 180 ml of dichloromethane, and 2 ml of hydrogen peroxide (30%) was added thereto dropwise at about 0° C. After stirring at ambient temperature for about 3 hours, water and dichloromethane were added and an organic layer was separated and taken. The organic layer was dried with magnesium sulfate, and solvents were evaporated under reduced pressure. The crude product thus obtained was separated by recrystallization using toluene to obtain 5.6 g (yield 48%) of Compound 4. The molecular weight of Compound 4 measured by FAB-MS was 632. From the results, the compound thus obtained was identified as Compound 4.

3. Synthesis of Compound 5

Compound A was synthesized in the same manner as the synthetic method of Compound 1. Then, under an argon (Ar) atmosphere, 4.2 g of potassium hydroxide, 6.5 ml of diphenyl phosphine, and 95 ml of anhydrous dimethyl sulfoxide were added to a 500 ml, three-neck flask, followed by stirring at ambient temperature for about 2 hours. 5.0 g of Compound A was added thereto and stirred for about 1 hour. Then, water and dichloromethane were added thereto, and an organic layer was separated and taken. The organic layer was dried with magnesium sulfate and solvents were evaporated under reduced pressure. The crude product thus obtained was dissolved in 150 ml of toluene and filtered using silica gel. 1.2 g of sulfur was added thereto and refluxed for about 8 hours. Water and dichloromethane were added and an organic layer was separated and taken. The organic layer was dried with magnesium sulfate, and solvents were evaporated under reduced pressure. The crude product thus obtained was separated by recrystallization using toluene to obtain 7.4 g (yield 60%) of Compound 5. The molecular weight of Compound 5 measured by FAB-MS was 663. From the results, the compound thus obtained was identified as Compound 5.

4. Synthesis of Compound 38
(Synthesis of Compound C)

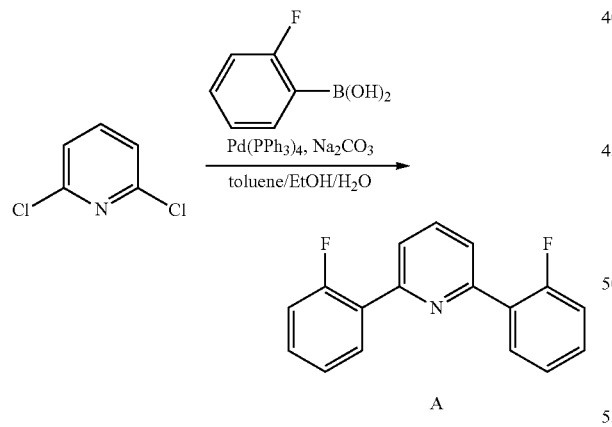

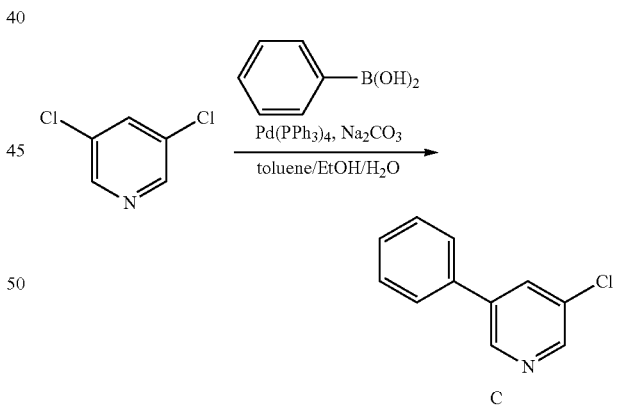

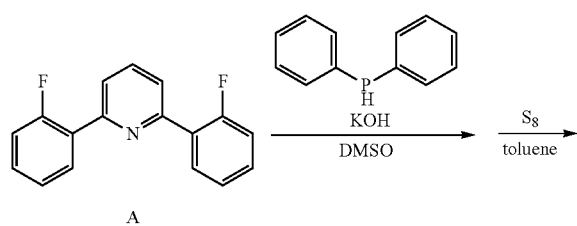

Under an argon (Ar) atmosphere, 5.0 g of 3,5-dichloropyridine, 4.0 g of phenylboronic acid, 3.9 g of tetrakis(triphenylphosphine)palladium(0), and 7.1 g of sodium carbonate were added to a 500 ml, three-neck flask, followed by heating and stirring in 180 ml of a mixed solvent of toluene, water and ethanol (10:2:1) at about 80° C. for about 8 hours. After cooling in air, water was added, an organic layer was separated and taken, the organic layer was dried with magnesium sulfate, and solvents were evaporated under reduced pressure. The crude product thus obtained was separated by silica gel column chromatography to obtain 4.3 g (yield 68%) of Compound C. The molecular weight of Compound C measured by FAB-MS was 189.

(Synthesis of Compound D)

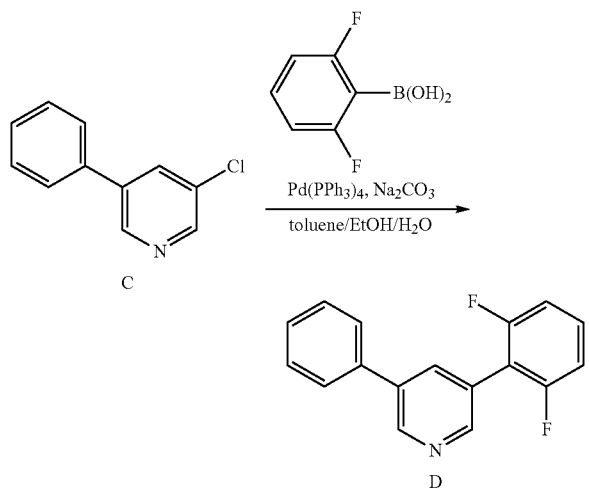

Under an argon (Ar) atmosphere, 4.3 g of Compound C, 5.3 g of difluorophenylboronic acid, 2.6 g of tetrakis(triphenylphosphine)palladium(0), and 7.2 g of sodium carbonate were added to a 500 ml, three-neck flask, followed by heating and stirring in 180 ml of a mixed solvent of toluene, water and ethanol (10:2:1) at about 80° C. for about 10 hours. After cooling in air, water was added, an organic layer was separated and taken, the organic layer was dried with magnesium sulfate, and solvents were evaporated under reduced pressure. The crude product thus obtained was separated by silica gel column chromatography to obtain 3.6 g (yield 60%) of Compound D. The molecular weight of Compound D measured by FAB-MS was 267.

(Synthesis of Compound 38)

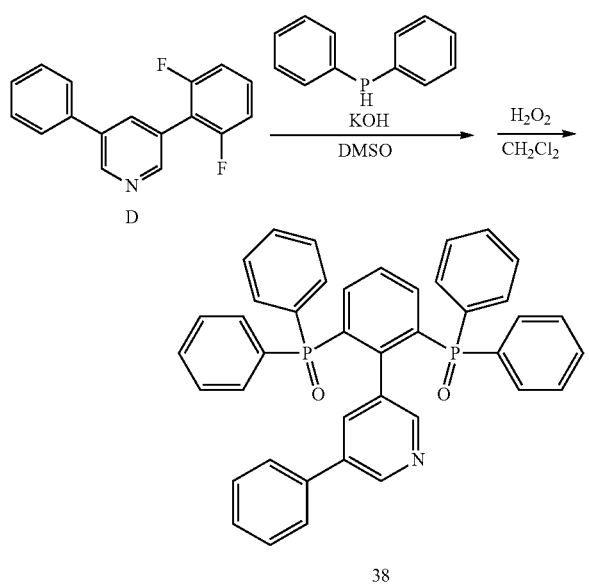

Under an argon (Ar) atmosphere, 4.2 g of potassium hydroxide, 6.5 ml of diphenyl phosphine, and 95 ml of anhydrous dimethyl sulfoxide were added to a 500 ml, three-neck flask, followed by stirring at ambient temperature for about 2 hours. 3.6 g of Compound D was added thereto and stirred for about 1 hour. Then, water and dichloromethane were added thereto, and an organic layer was separated and taken. The organic layer was dried with magnesium sulfate and solvents were evaporated under reduced pressure. The crude product thus obtained was dissolved in 130 ml of dichloromethane, and 1.4 ml of hydrogen peroxide (30%) was added thereto dropwise at about 0° C. After stirring at ambient temperature for about 3 hours, water and dichloromethane were added and an organic layer was separated and taken. The organic layer was dried with magnesium sulfate, and solvents were evaporated under reduced pressure. The crude product thus obtained was separated by recrystallization using toluene to obtain 5.1 g (yield 60%) of Compound 38. The molecular weight of Compound 38 measured by FAB-MS was 632. From the results, the compound thus obtained was identified as Compound 38.

5. Synthesis of Compound 40

(Synthesis of Compound E)

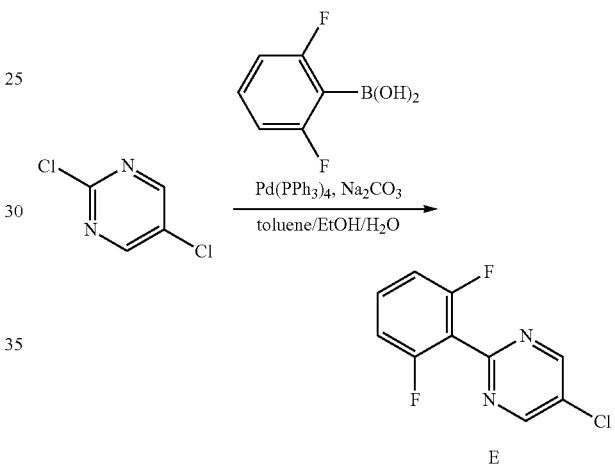

Under an argon (Ar) atmosphere, 5.0 g of 2,5-dichloropyrimidine, 5.3 g of 2,6-difluorophenylboronic acid, 3.9 g of tetrakis(triphenylphosphine)palladium(0), and 7.1 g of sodium carbonate were added to a 500 ml, three-neck flask, followed by heating and stirring in 200 ml of a mixed solvent of toluene, water, and ethanol (10:2:1) at about 80° C. for about 16 hours. After cooling in air, water was added, an organic layer was separated and taken, the organic layer was dried with magnesium sulfate, and solvents were evaporated under reduced pressure. The crude product thus obtained was separated by silica gel column chromatography to obtain 4.2 g (yield 55%) of Compound E. The molecular weight of Compound E measured by FAB-MS was 226.

(Synthesis of Compound F)

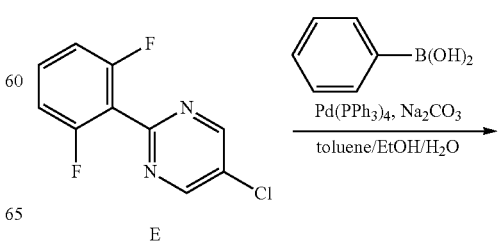

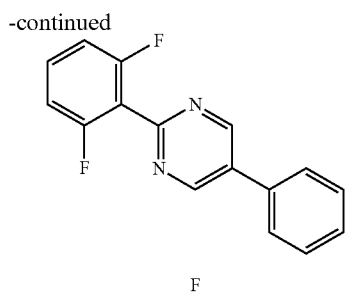

F

Under an argon (Ar) atmosphere, 4.3 g of Compound E, 3.3 g of 2,6-phenylboronic acid, 2.1 g of tetrakis(triphenylphosphine)palladium(0), and 5.7 g of sodium carbonate were added to a 500 ml, three-neck flask, followed by heating and stirring in 110 ml of a mixed solvent of toluene, water, and ethanol (10:2:1) at about 80° C. for about 8 hours. After cooling in air, water was added, an organic layer was separated and taken, the organic layer was dried with magnesium sulfate, and solvents were evaporated under reduced pressure. The crude product thus obtained was separated by silica gel column chromatography to obtain 3.1 g (yield 65%) of Compound F. The molecular weight of Compound F measured by FAB-MS was 268.

(Synthesis of Compound 40)

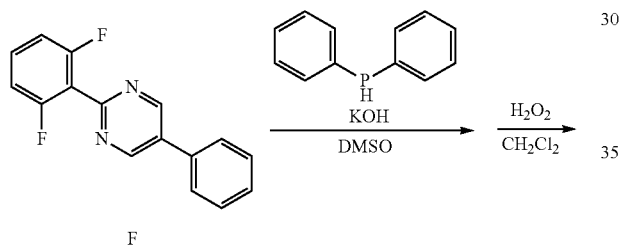

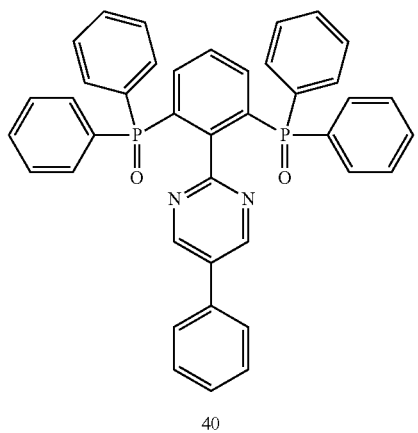

40

Under an argon (Ar) atmosphere, 2.6 g of potassium hydroxide, 4.0 ml of diphenyl phosphine, and 60 ml of anhydrous dimethyl sulfoxide were added to a 500 ml, three-neck flask, followed by stirring at ambient temperature for about 2 hours. 3.1 g of Compound F was added thereto and stirred for about 1 hour. Then, water and dichloromethane were added thereto, and an organic layer was separated and taken. The organic layer was dried with magnesium sulfate and solvents were evaporated under reduced pressure. The crude product thus obtained was dissolved in 120 ml of dichloromethane, and 1.2 ml of hydrogen peroxide (30%) was added thereto dropwise at about 0° C. After stirring at ambient temperature for about 3 hours, water and dichloromethane were added and an organic layer was separated and taken. The organic layer was dried with magnesium sulfate, and solvents were evaporated under reduced pressure. The crude product thus obtained was separated by recrystallization using toluene to obtain 3.8 g (yield 52%) of Compound 40. The molecular weight of Compound 40 measured by FAB-MS was 633. From the results, the compound thus obtained was identified as Compound 40.

6. Synthesis of Compound 57

(Synthesis of Compound G)

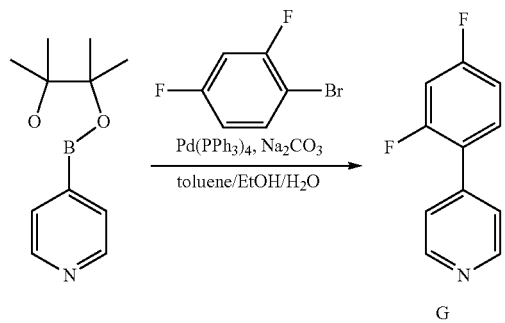

G

Under an argon (Ar) atmosphere, 7.0 g of 4-pyridylboronic acid pinacol ester, 9.8 g of 2,4-difluorobromobenzene, 3.9 g of tetrakis(triphenylphosphine)palladium(0), and 10.8 g of sodium carbonate were added to a 500 ml, three-neck flask, followed by heating and stirring in 200 ml of a mixed solvent of toluene, water, and ethanol (10:2:1) at about 80° C. for about 15 hours. After cooling in air, water was added, an organic layer was separated and taken, the organic layer was dried with magnesium sulfate, and solvents were evaporated under reduced pressure. The crude product thus obtained was separated by silica gel column chromatography to obtain 4.3 g (yield 72%) of Compound G. The molecular weight of Compound G measured by FAB-MS was 191.

(Synthesis of Compound 57)

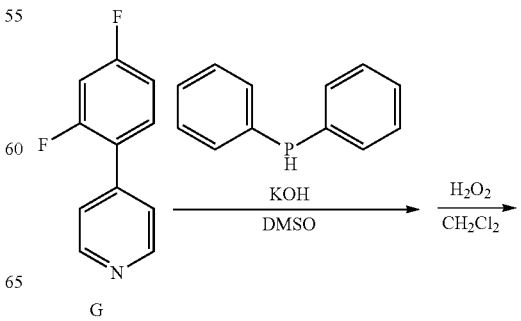

G

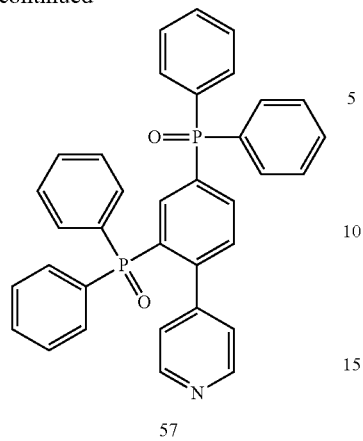

57

Under an argon (Ar) atmosphere, 5.0 g of potassium hydroxide, 7.8 ml of diphenyl phosphine, and 110 ml of anhydrous dimethyl sulfoxide were added to a 500 ml, three-neck flask, followed by stirring at ambient temperature for about 2 hours. 4.3 g of Compound G was added thereto and stirred for about 1 hour. Then, water and dichloromethane were added thereto, and an organic layer was separated and taken. The organic layer was dried with magnesium sulfate and solvents were evaporated under reduced pressure. The crude product thus obtained was dissolved in 200 ml of dichloromethane, and 2.3 ml of hydrogen peroxide (30%) was added thereto dropwise at about 0° C. After stirring at ambient temperature for about 3 hours, water and dichloromethane were added and an organic layer was separated and taken. The organic layer was dried with magnesium sulfate, and solvents were evaporated under reduced pressure. The crude product thus obtained was separated by recrystallization using toluene to obtain 3.8 g (yield 52%) of Compound 57. The molecular weight of Compound 57 measured by FAB-MS was 556. From the results, the compound thus obtained was identified as Compound 57.

Experimental Examples

Device Manufacturing Examples

Hereinafter, device manufacturing and evaluation of emission efficiency were conducted twice with different device configurations.

The above-described Compounds 1, 4, 5, 38, 40 and 57 were used for the manufacture of example devices.

[Example Compounds]

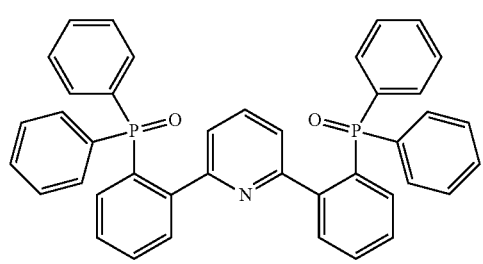

1

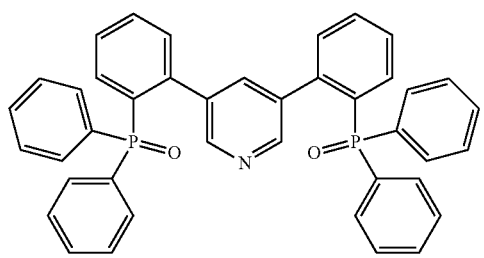

4

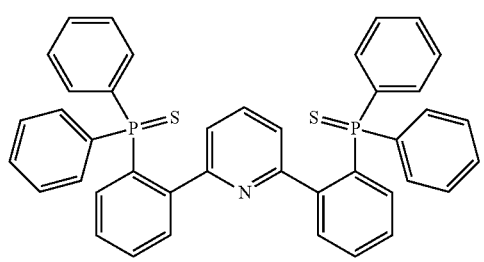

5

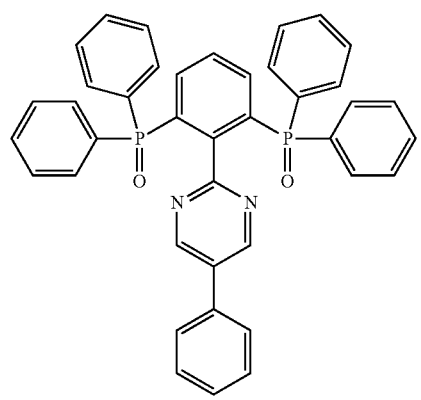

38

40

57

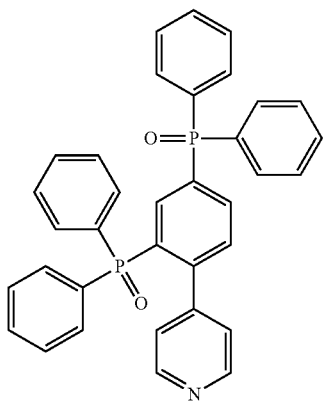

Comparative Compounds X-1 to X-6 below were used for the manufacture of comparative devices.

[Comparative Compounds]

X-1

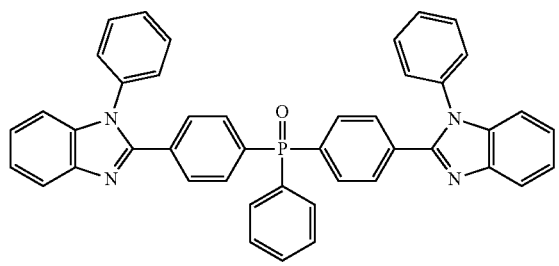

X-2

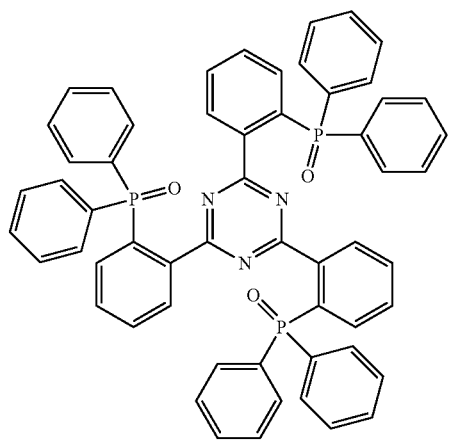

X-3

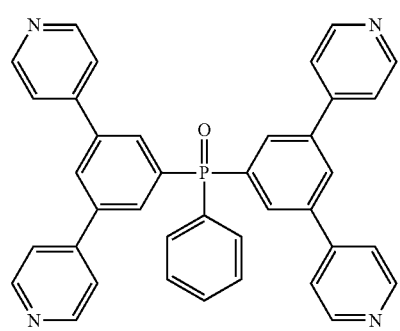

X-4

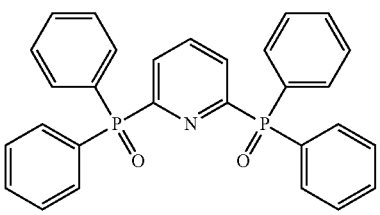

X-5

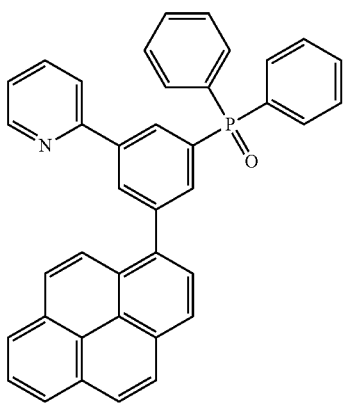

X-6

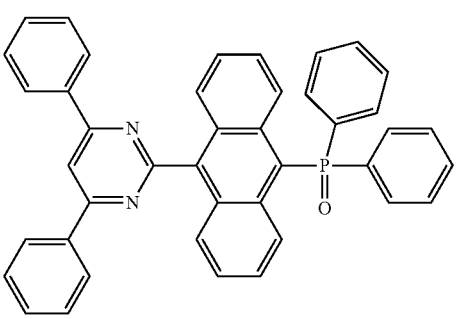

(Calculation of the Value of the Lowest Triplet Energy Level ($T_1$))

Before manufacturing a device, the values of the lowest triplet energy level ($T_1$) were calculated for Example Compounds 1, 4, 5, 38, 40 and 57 and Comparative Compounds X-1 to X-6. Calculation results are shown in Table 1 below. The value of the lowest triplet energy level ($T_1$) was calculated via a non-empirical molecular orbital method. Particularly, the calculation was conducted using B3LYP as a functional and 6-31G(d) as a basis function, by using Gaussian09 which is a product of Gaussian Co.

TABLE 1

| Compound | T1 (eV) |
| --- | --- |
| Example Compound 1 | 3.37 |
| Example Compound 4 | 3.46 |
| Example Compound 5 | 3.34 |
| Example Compound 38 | 3.30 |
| Example Compound 40 | 3.33 |
| Example Compound 57 | 3.39 |
| Comparative Compound X-1 | 2.92 |
| Comparative Compound X-2 | 3.06 |
| Comparative Compound X-3 | 3.17 |
| Comparative Compound X-4 | 3.61 |
| Comparative Compound X-5 | 2.05 |
| Comparative Compound X-6 | 1.70 |

Referring to Table 1, the Example Compounds were calculated to have high values of the lowest triplet energy level. The Example Compounds were calculated to a have higher value of the lowest triplet energy level than the Comparative Compounds except for Comparative Compound X-4. For example, the Example Compounds were calculated to have the values of the lowest triplet energy level of about 3.3 eV or more. All of the Example Compounds were calculated to have high values of the lowest triplet energy level, and it was expected that high efficiency was secured when used as a material for emitting blue phosphorescence or a material for emitting blue thermally activated delayed fluorescence (TADF).

Device Manufacturing Example 1

Organic electroluminescence devices according to Examples 1 to 6 were manufactured using Example Compounds 1, 4, 5, 38, 40 and 57 as the host materials of an emission layer. In addition, organic electroluminescent devices of Comparative Examples 1 to 6 were manufactured using the Comparative Compounds X-1 to X-6 as the host materials of an emission layer.

The organic electroluminescence devices according to Examples 1 to 6 and Comparative Examples 1 to 6 were manufactured by forming a first electrode using ITO to a thickness of about 150 nm, a hole injection layer using 1,4,5,8,9,11-hexaazatriphenylenehexacarbonitrile (HAT-CN) to a thickness of about 10 nm, a first hole transport layer using N,N'-di(1-naphthyl)-N,N'-diphenyl-(1,1'-biphenyl)-4,4'-diamine (NPD) to a thickness of about 80 nm, a second hole transport layer using 1,3-bis(N-carbazolyl)benzene (mCP) to a thickness of about 5 nm, an emission layer using the Example Compound or the Comparative Compound doped with 18% 10-phenyl-10H,10'H-spiro[acridine-9,9'-anthracen]-10'-one (ACRSA) to a thickness of about 20 nm, a first electron transport layer using bis[2-(diphenylphosphino)phenyl]ether oxide (DPEPO) to a thickness of about 10 nm, a second electron transport layer using 1,3,5-tris(N-phenylbenzimidazole-2-yl)benzene (TPBi) to a thickness of about 30 nm, an electron injection layer using LiF to a thickness of about 0.5 nm, and a second electrode using Al to a thickness of about 100 nm. Each layer was formed by a deposition method under a vacuum atmosphere.

Then, the emission efficiency of the organic electroluminescence devices thus manufactured was measured. The evaluation results are shown in Table 2 below. For the evaluation of the emission properties of the organic electroluminescence devices thus manufactured, a brightness light distribution characteristics measurement system of C9920-12 manufactured by HAMAMATSU Photonics Co. was used.

TABLE 2

| Device manufacturing example | Host | Emission efficiency ($\eta_{ext}$ %) |
| --- | --- | --- |
| Example 1 | Example Compound 1 | 14 |
| Example 2 | Example Compound 4 | 15 |
| Example 3 | Example Compound 5 | 13 |
| Example 4 | Example Compound 38 | 11 |
| Example 5 | Example Compound 40 | 10 |
| Example 6 | Example Compound 57 | 12 |
| Comparative Example 1 | Comparative Compound X-1 | 6 |
| Comparative Example 2 | Comparative Compound X-2 | 6 |
| Comparative Example 3 | Comparative Compound X-3 | 7 |
| Comparative Example 4 | Comparative Compound X-4 | 6 |
| Comparative Example 5 | Comparative Compound X-5 | 4 |
| Comparative Example 6 | Comparative Compound X-6 | 3 |

Referring to the results of Table 2, Examples 1 to 6 had increased emission efficiency when compared to Comparative Examples 1 to 6. In the Example Compounds included in Examples 1 to 6, a phosphine oxide group or a phosphine sulfide group was connected with a one-nitrogen-based or two-nitrogen-based six-member aromatic ring at the ortho position of a phenylene group, and a high value of the lowest triplet energy ($T_1$) level was obtained. Accordingly, an organic electroluminescence device using thereof as a host material may help prevent the generation of non-radiative deactivation by which the energy of excitons produced in an emission layer moves to the host material of the emission layer and then is lost, and the increase of the efficiency of the organic electroluminescence device is possible.

Comparative Compound X-1 included in Comparative Example 1 included a phosphine oxide group, but included not the one-nitrogen-based or two-nitrogen-based six-member aromatic ring but a substituted benzoimidazolyl group. Accordingly, the value of the lowest triplet energy level is lower when compared to the Example Compounds, and the emission efficiency of Comparative Example 1 was degraded.

In Comparative Compound X-2 included in Comparative Example 2, a phosphine oxide group and a nitrogen-containing six-member aromatic ring were connected at the ortho position of a phenylene group, but a triazinyl group (which is a three-nitrogen-based six-member aromatic ring) was included, different from the Example Compounds. Accordingly, the value of the lowest triplet energy level was lower than the Example Compounds, and the emission efficiency of Comparative Example 2 was decreased.

In Comparative Compound X-3 included in Comparative Example 3, a phosphine oxide group and a pyridyl group were connected with a phenylene group, but not at the ortho position of the phenylene group as the Example Compounds but at the meta position of the phenylene group. Accordingly, the value of the lowest triplet energy level was lower than the Example Compounds and the emission efficiency of Comparative Example 3 was decreased.

Comparative Compound X-4 included in Comparative Example 4 had a high value of the lowest triplet energy level, like the Example Compounds. However, a phosphine oxide group and a pyridyl group were not connected via a phenylene liker but were connected directly. Accordingly, thermal stability was low, the compound was decomposed during evaporation, and the emission efficiency of Comparative Example 4 was degraded.

In Comparative Compound X-5 included in Comparative Example 5, a phosphine oxide group and a pyridyl group were connected with a phenylene group, but not at the ortho position of the phenylene group as the example compounds but at the meta position of the phenylene group. In addition, a pyrenyl group was included, and accordingly, the value of the lowest triplet energy level was lower than the Example Compounds, and the emission efficiency of Comparative Example 5 was decreased.

In Comparative Compound X-6 included in Comparative Example 6, a phosphine oxide group and a pyridyl group were connected not via a phenylene group but via a divalent anthracenyl group. Accordingly, the value of the lowest triplet energy level was lower than the Example Compounds, and the emission efficiency of Comparative Example 6 was decreased.

Device Manufacturing Example 2

Organic electroluminescence devices according to Examples 7 to 12 were manufactured using Example Compounds 1, 4, 5, 38, 40 and 57 as the materials of the first electron transport layer. In addition, organic electroluminescent devices of Comparative Examples 7 to 12 were manufactured using the Comparative Compounds X-1 to X-6 as the materials of the first electron transport layer.

The organic electroluminescence devices according to Examples 7 to 12 and Comparative Examples 7 to 12 were manufactured by forming a first electrode using ITO to a thickness of about 150 nm, a hole injection layer using 1,4,5,8,9,11-hexaazatriphenylenehexacarbonitrile (HAT-CN) to a thickness of about 10 nm, a first hole transport layer using N,N'-di(1-naphthyl)-N,N'-diphenyl-(1,1'-biphenyl)-4,4'-diamine (NPD) to a thickness of about 80 nm, a second hole transport layer using 1,3-bis(N-carbazolyl)benzene (mCP) to a thickness of about 5 nm, an emission layer using bis[2-(diphenylphosphino)phenyl]ether oxide (DPEPO) doped with 18% 10-phenyl-10H,10'H-spiro[acridine-9,9'-anthracen]-10'-one (ACRSA) to a thickness of about 20 nm, a first electron transport layer using the Example Compound or the Comparative Compound to a thickness of about 10 nm, a second electron transport layer using 1,3,5-tris(N-phenylbenzimidazole-2-yl)benzene (TPBi) to a thickness of about 30 nm, an electron injection layer using LiF to a thickness of about 0.5 nm, and a second electrode using Al to a thickness of about 100 nm. Each layer was formed by a deposition method in a vacuum atmosphere.

Then, the emission efficiencies of the organic electroluminescence devices thus manufactured were measured. The evaluation results are shown in Table 3 below. For the evaluation of the emission properties of the organic electroluminescence devices thus manufactured, a brightness light distribution characteristics measurement system of C9920-12 manufactured by HAMAMATSU Photonics Co. was used.

TABLE 3

| Device manufacturing example | First electron transport layer | Emission efficiency ($\eta_{ext}$, %) |
| --- | --- | --- |
| Example 7 | Example Compound 1 | 14 |
| Example 8 | Example Compound 4 | 13 |
| Example 9 | Example Compound 5 | 16 |
| Example 10 | Example Compound 38 | 12 |
| Example 11 | Example Compound 40 | 14 |
| Example 12 | Example Compound 57 | 12 |
| Comparative Example 7 | Comparative Compound X-1 | 10 |
| Comparative Example 8 | Comparative Compound X-2 | 10 |
| Comparative Example 9 | Comparative Compound X-3 | 11 |
| Comparative Example 10 | Comparative Compound X-4 | 9 |
| Comparative Example 11 | Comparative Compound X-5 | 6 |
| Comparative Example 12 | Comparative Compound X-6 | 5 |

Referring to the results of Table 3, Examples 7 to 12 had increased emission efficiency when compared to Comparative Examples 7 to 12. In the Example Compounds included in Examples 7 to 12, a phosphine oxide group or a phosphine sulfide group was connected with a one-nitrogen-based or two-nitrogen-based six-member aromatic ring at the ortho position of a phenylene group, and a high value of the lowest triplet energy ($T_1$) level was obtained. Accordingly, high electron transport properties may be secured, and a high value of the lowest triplet energy level was attained. Therefore, the diffusion of triplet excitons generated in an emission layer to an electron transport region may be restrained, and high efficiency of an organic electroluminescence device may be accomplished.

Comparative Compound X-1 included in Comparative Example 7 included a phosphine oxide group, but included not the one-nitrogen-based or two-nitrogen-based six-member aromatic ring but a substituted benzoimidazolyl group. Accordingly, the value of the lowest triplet energy level is lower when compared to the Example Compounds, and the emission efficiency of Comparative Example 7 was degraded.

In Comparative Compound X-2 included in Comparative Example 8, a phosphine oxide group and a nitrogen-containing six-member aromatic ring were connected at the ortho position of a phenylene group, but a triazinyl group (which is a three-nitrogen-based six-member aromatic ring) included, different from the Example Compounds. Accordingly, the value of the lowest triplet energy level was lower than the example compounds, and the emission efficiency of Comparative Example 8 was decreased.

In Comparative Compound X-3 included in Comparative Example 9, a phosphine oxide group and a pyridyl group were connected with a phenylene group, but not at the ortho position of the phenylene group as the example compounds but at the meta position of the phenylene group. Accordingly, the value of the lowest triplet energy level was lower than the example compounds and the emission efficiency of Comparative Example 9 was decreased.

Comparative Compound X-4 included in Comparative Example 10 had a high value of the lowest triplet energy level, like the Example Compounds. However, a phosphine oxide group and a pyridyl group were not connected via a phenylene liker but were connected directly. Accordingly, thermal stability was low, the compound was decomposed during evaporation, and the emission efficiency of Comparative Example 10 was degraded.

In Comparative Compound X-5 included in Comparative Example 11, a phosphine oxide group and a pyridyl group were connected with a phenylene group, but not at the ortho position of the phenylene group as the Example Compounds but at the meta position of the phenylene group. In addition, a pyrenyl group was included, and accordingly, the value of the lowest triplet energy level was lower than the Example Compounds, and the emission efficiency of Comparative Example 11 was decreased.

In Comparative Compound X-6 included in Comparative Example 12, a phosphine oxide group and a pyridyl group were connected not via a phenylene group but via a divalent anthracenyl group. Accordingly, the value of the lowest triplet energy level was lower than the Example Compounds, and the emission efficiency of Comparative Example 12 was decreased.

By way of summation and review, by applying an organic electroluminescence device in a display, a driving voltage may be decreased and the life of the organic electroluminescence device may be increased.

The phosphine-based compound according to an embodiment may be used as a material for an organic electroluminescence device.

The organic electroluminescence device including the phosphine-based compound according to an embodiment may accomplish high emission efficiency.

The embodiments may provide a phosphine-based compound that may be used in an organic electroluminescence device having high emission efficiency.

The embodiments may provide an organic electroluminescence device having high emission efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A phosphine-based compound represented by the following Formula 1:

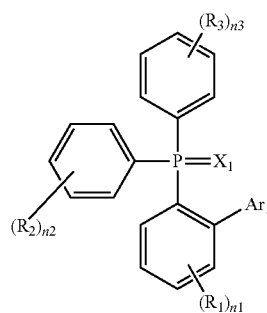

[Formula 1]

wherein, in Formula 1, $X_1$ is O or S, $Ar_1$ is a substituted or unsubstituted pyridyl group, a substituted or unsubstituted pyridazinyl group, a substituted or unsubstituted pyrimidyl group, or a substituted or unsubstituted pyrazinyl group, $R_1$ is a hydrogen atom, a deuterium atom, a halogen atom, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_2$ and $R_3$ are each independently a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, "$n_1$" is an integer of 0 to 4, and "$n_2$" and "$n_3$" are each independently an integer of 0 to 5.

2. The phosphine-based compound as claimed in claim 1, wherein $Ar_1$ is a group represented by one of the following Formulae 2-1 to 2-4:

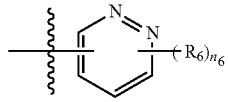

[Formula 2-1]

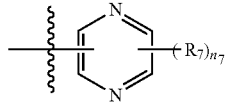

[Formula 2-2]

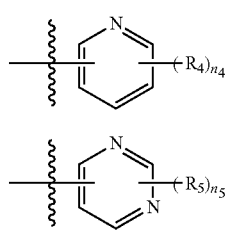

[Formula 2-3]

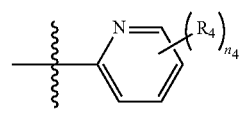

[Formula 2-4]

wherein, in Formulae 2-1 to 2-4, $R_4$ to $R_7$ are each independently a hydrogen atom, a deuterium atom, a halogen atom, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, or a combination thereof, "$n_4$" is an integer of 0 to 4, and "$n_5$" to "$n_7$" are each independently an integer of 0 to 3.

3. The phosphine-based compound as claimed in claim 2, wherein:

$Ar_1$ is a group represented by Formula 2-1, and the group represented by Formula 2-1 is a group represented by one of the following Formulae 2-1-1 to 2-1-3:

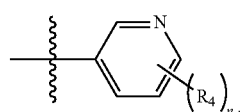

[Formula 2-1-1]

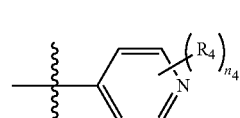

[Formula 2-1-2]

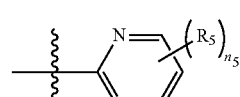

[Formula 2-1-3]

wherein, in Formulae 2-1-1 to 2-1-3, $R_4$ and "$n_4$" are defined the same as those of Formula 2-1.

4. The phosphine-based compound as claimed in claim 2, wherein:

$Ar_1$ is a group represented by Formula 2-2, and the group represented by Formula 2-2 is a group represented by one of the following Formulae 2-2-1 to 2-2-3:

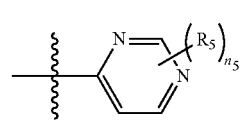

[Formula 2-2-1]

[Formula 2-2-2]

[Formula 2-2-3]

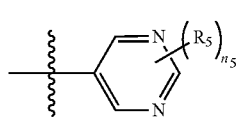

wherein, in Formulae 2-2-1 to 2-2-3, $R_5$ and "$n_5$" are defined the same as those of Formula 2-2.

5. The phosphine-based compound as claimed in claim 2, wherein:

$Ar_1$ is a group represented by Formula 2-3, and the group represented by Formula 2-3 is a group represented by one of the following Formula 2-3-1 or 2-3-2:

[Formula 2-3-1]

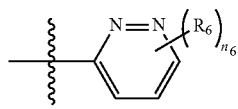

[Formula 2-3-2]

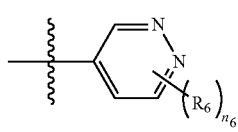

wherein, in Formulae 2-3-1 and 2-3-2, $R_6$ and "$n_6$" are defined the same as those of Formula 2-3.

6. The phosphine-based compound as claimed in claim 2, wherein $R_4$ to $R_7$ are each independently a hydrogen atom, a substituted or unsubstituted aryl group having 6 to 30 ring carbon atoms, or a substituted or unsubstituted heteroaryl group having 2 to 30 ring carbon atoms, a group represented by the following Formula 3, or a combination thereof,

[Formula 3]

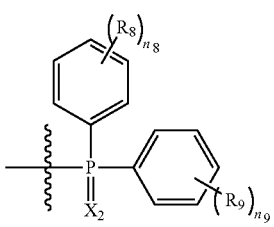

wherein, in Formula 3, $X_2$ is O or S, $R_8$ and $R_9$ are each independently a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and "$n_8$" and "$n_9$" are each independently an integer of 0 to 5.

7. The phosphine-based compound as claimed in claim 1, wherein $R_1$ is a hydrogen atom, a substituted or unsubstituted aryl group having 6 to 30 ring carbon atoms, a substituted or unsubstituted heteroaryl group having 2 to 30 ring carbon atoms, or a group represented by the following Formula 4:

[Formula 4]

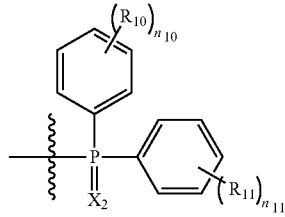

wherein, in Formula 4, $R_{10}$ and $R_{11}$ are each independently a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms; and "$n_{10}$" and "$n_{11}$" are each independently an integer of 0 to 5.

8. The phosphine-based compound as claimed in claim 1, wherein the phosphine-based compound represented by Formula 1 is represented by the following Formula 5:

[Formula 5]

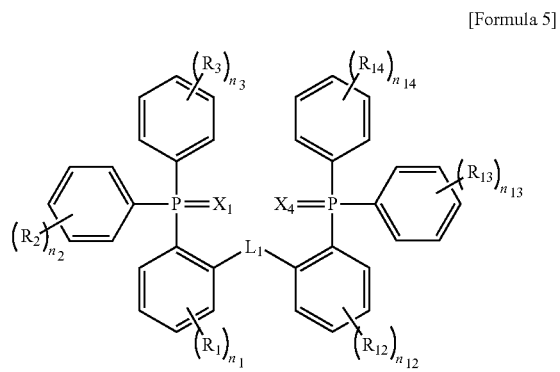

wherein, in Formula 5, $L_1$ is a substituted or unsubstituted pyridylene group, a substituted or unsubstituted pyridazinylene group, a substituted or unsubstituted pyrimidylene group, or a substituted or unsubstituted pyrazinylene group, $X_4$ is O or S, $R_{12}$ to $R_{14}$ are each independently a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, "$n_{12}$" is an integer of 0 to 4, "$n_{13}$" and "$n_{14}$" are each independently an integer of 0 to 5, and $X_1$, $R_1$ to $R_3$, and "$n_1$" to "$n_3$" are defined the same as those of Formula 1.

9. The phosphine-based compound as claimed in claim 1, wherein the phosphine-based compound represented by Formula 1 is represented by the following Formula 6:

[Formula 6]

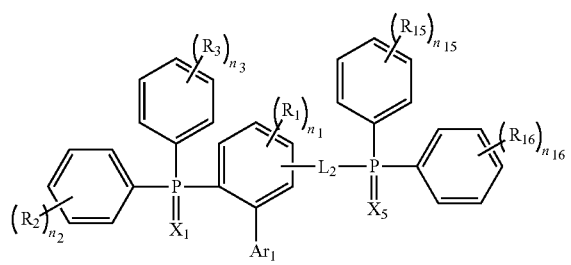

wherein, in Formula 6, $X_5$ is O or S, $L_2$ is a direct linkage or a substituted or unsubstituted phenylene group, $R_{15}$ and $R_{16}$ are each independently a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, "$n_{15}$" and "$n_{16}$" are each independently an integer of 0 to 5, "$n_1$" is an integer of 0 to 3, and $Ar_1$, $X_1$, $R_1$ to $R_3$, and "$n_2$" and "$n_3$" are defined the same as those of Formula 1.

10. The phosphine-based compound as claimed in claim 1, wherein the phosphine-based compound represented by Formula 1 is a compound of the following Compound Group 1:

[Compound Group 1]

1

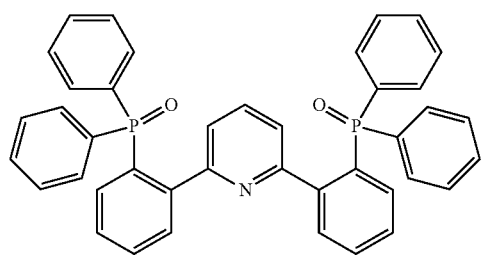

2

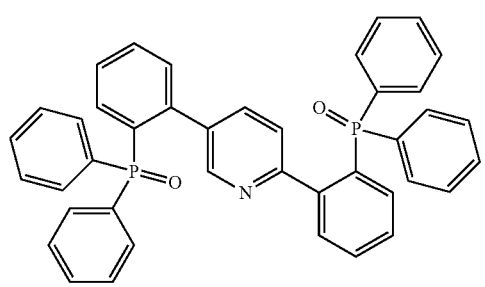

3

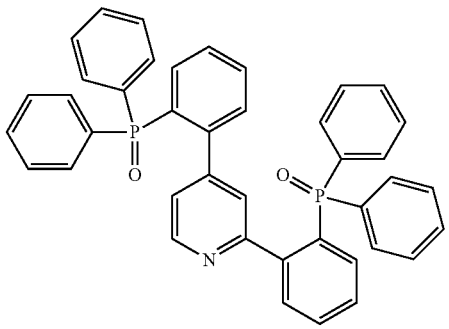

4

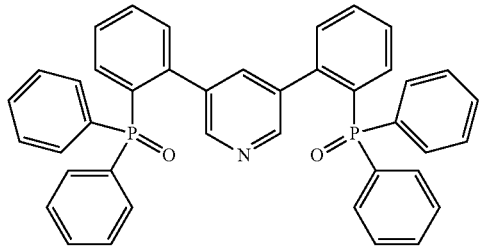

5

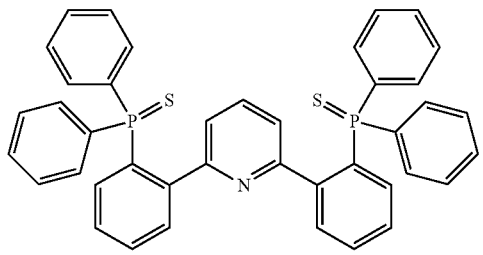

6

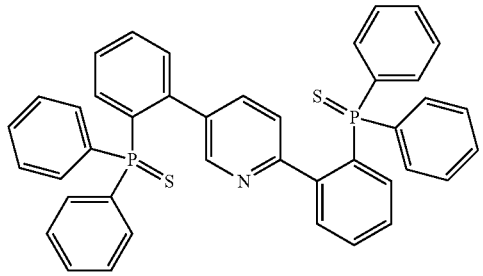

7

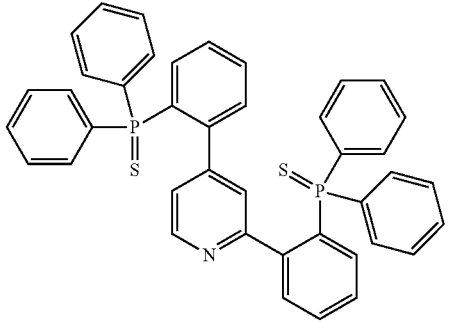

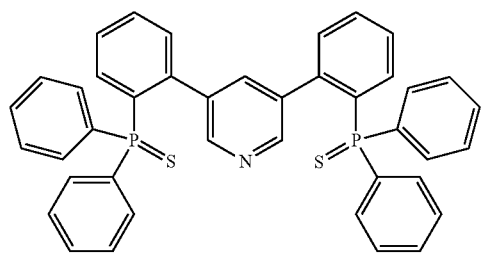
8
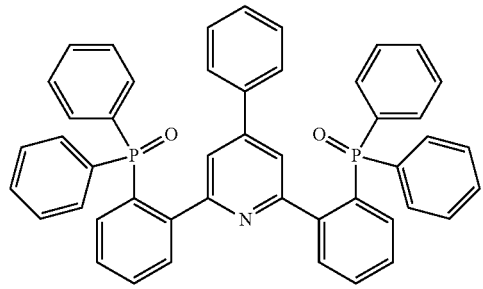
9
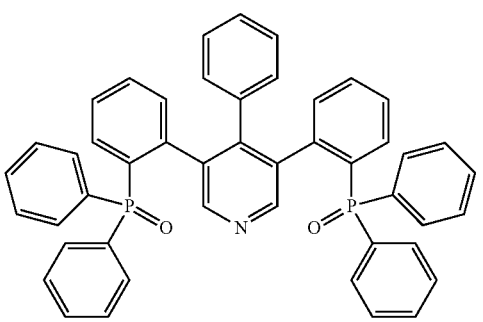
10
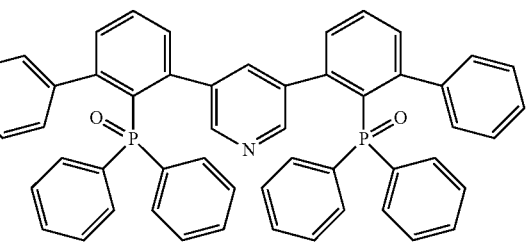
11
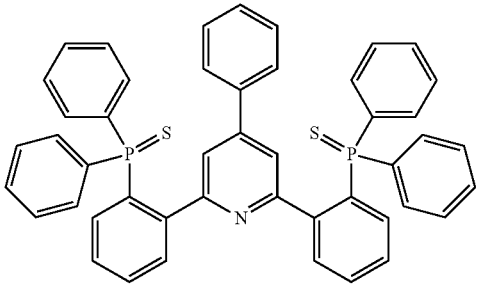
12
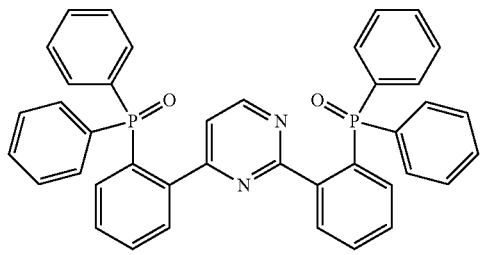
13
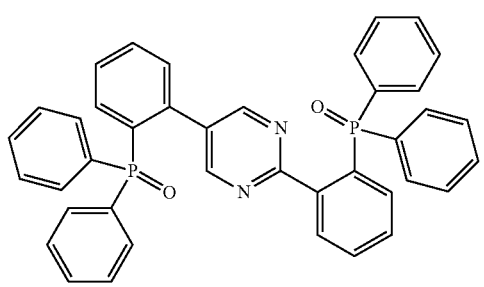
14
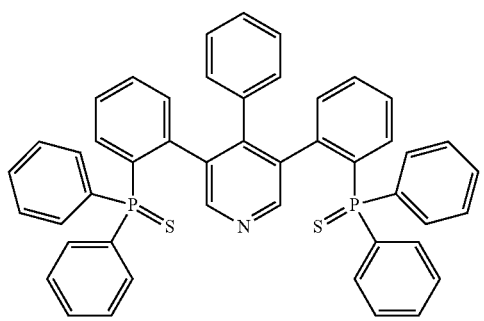
15
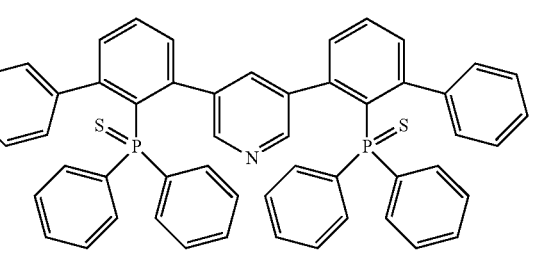
16
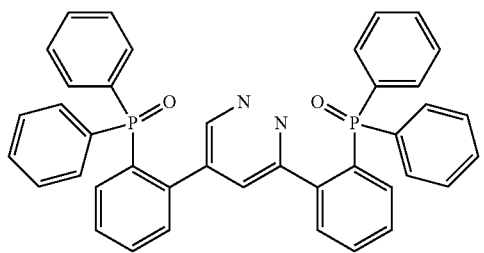
17

18
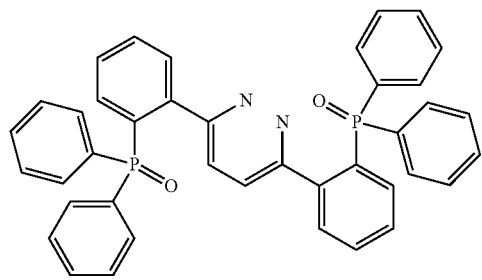
19
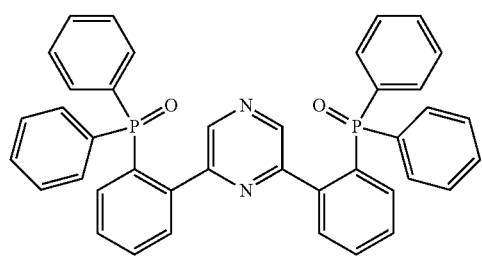
20
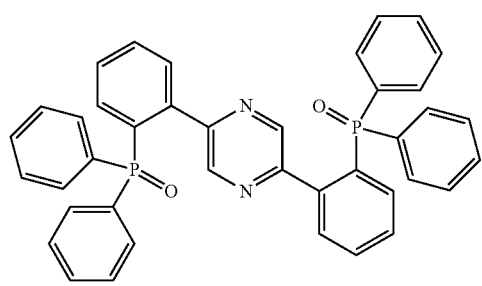
21
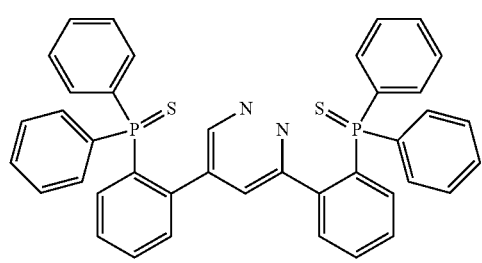
22
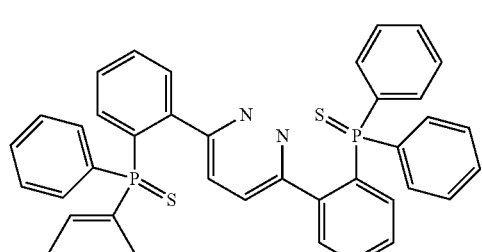
23
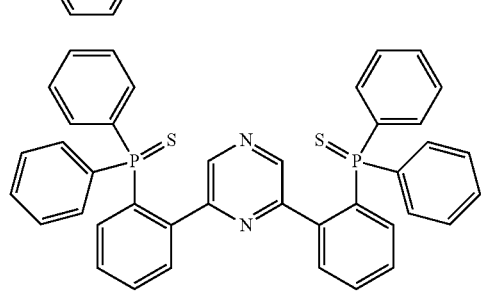
24
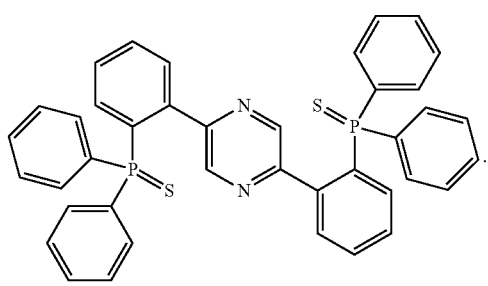
11. The phosphine-based compound as claimed in claim 1, wherein the phosphine-based compound represented by Formula 1 is a compound of the following Compound Group 2:
[Compound Group 2]
25
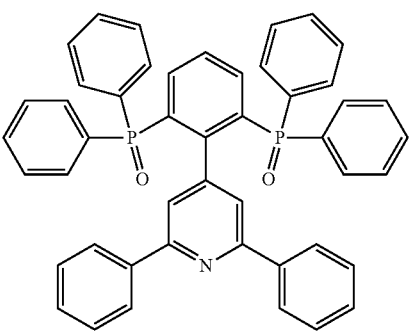
26
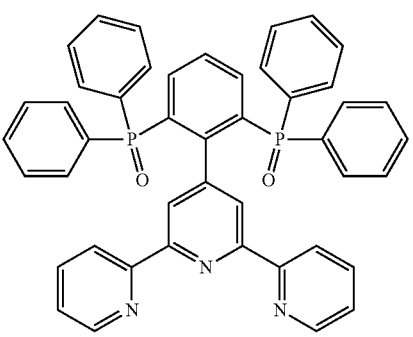
27
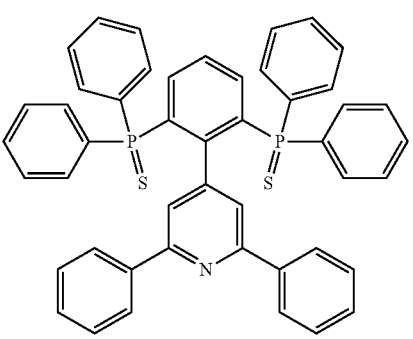

28
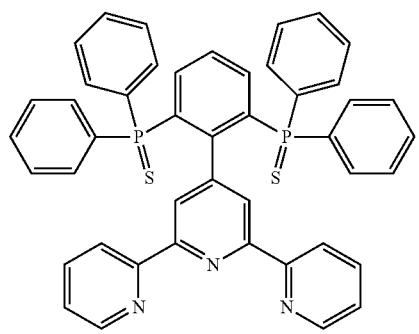
29
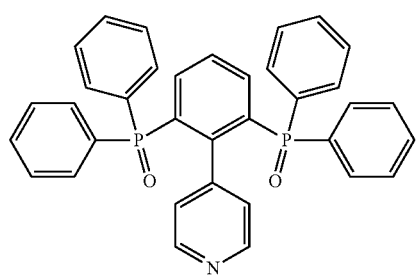
30
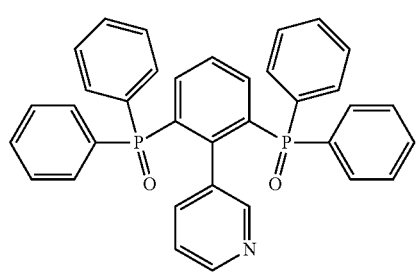
31
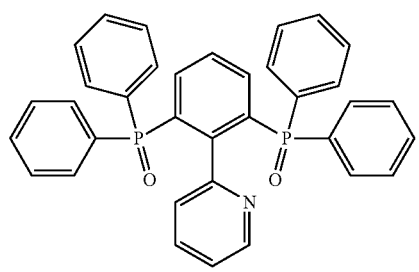
32
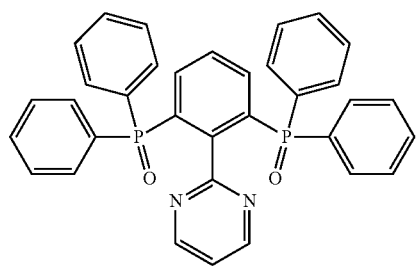
33
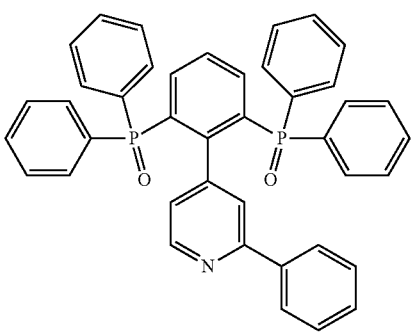
34
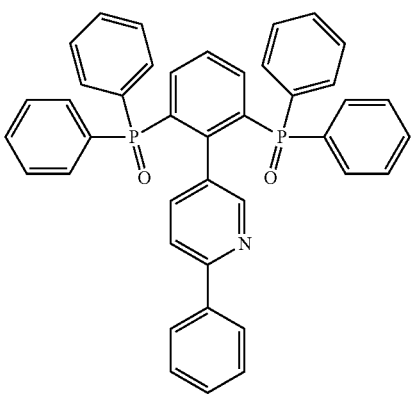
35
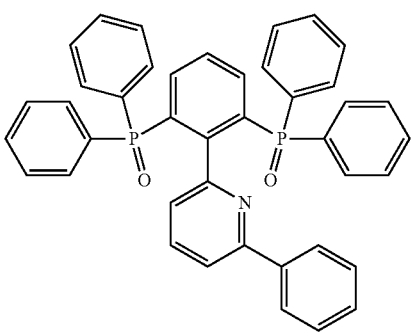
36
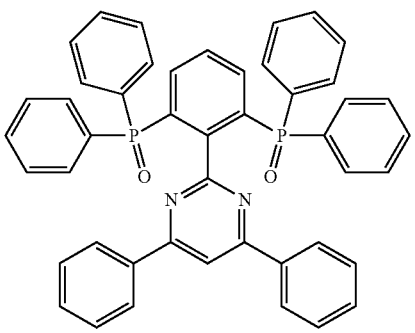

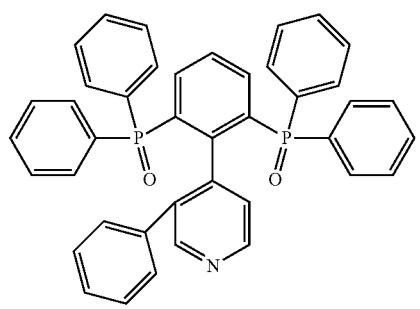
37
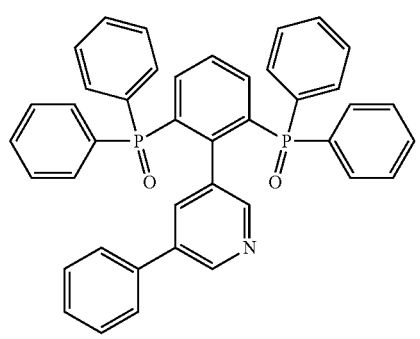
38
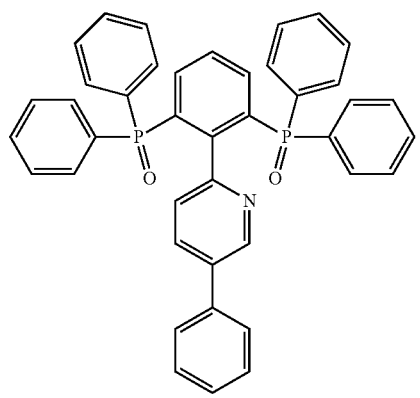
39
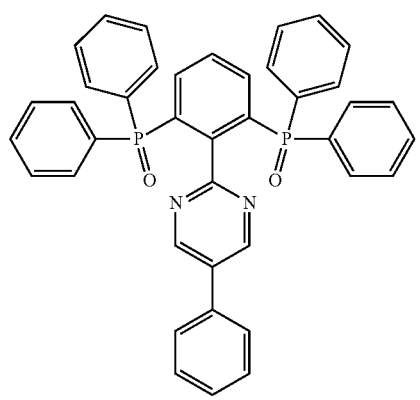
40
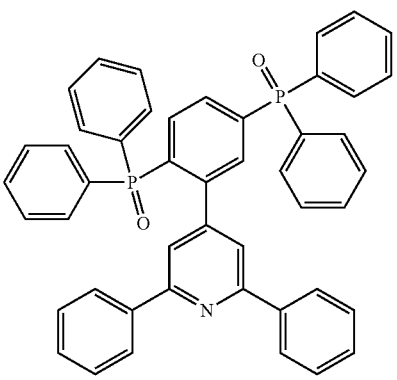
41
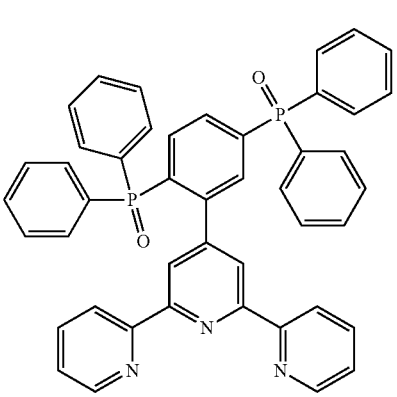
42
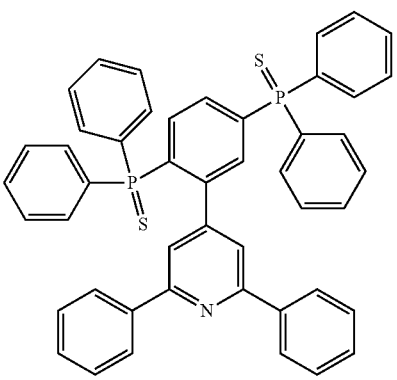
43
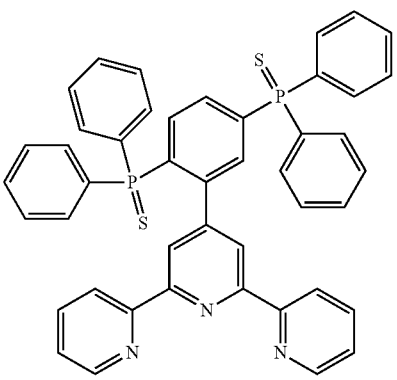
44

45
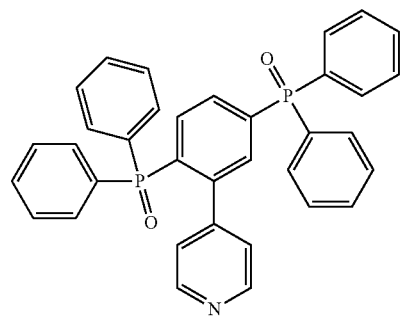
46
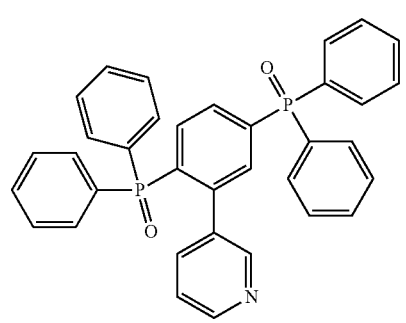
47
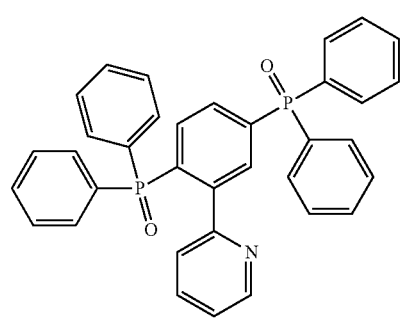
48
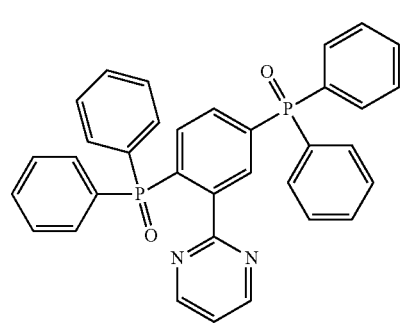
49
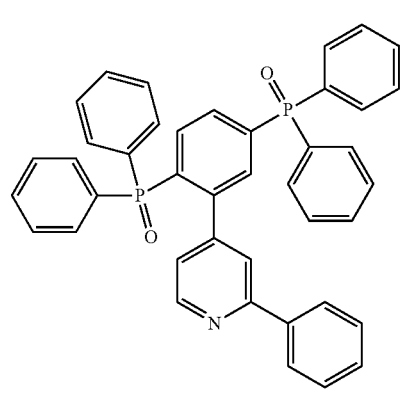
50
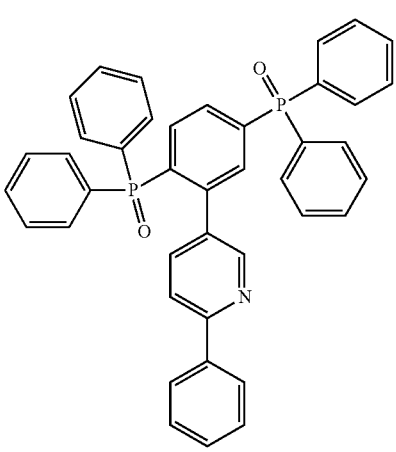
51
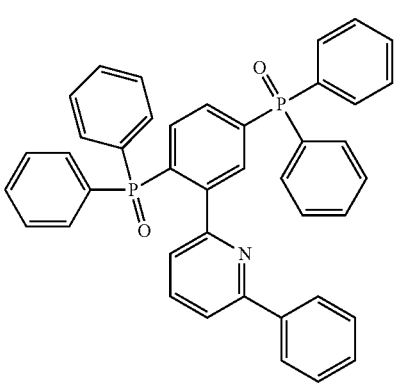
52
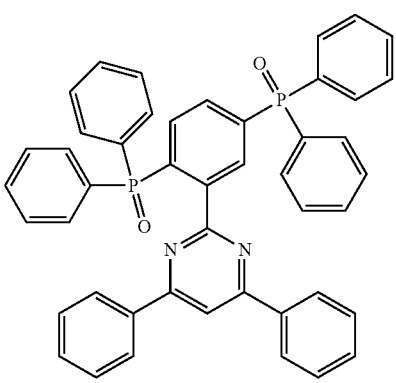
53
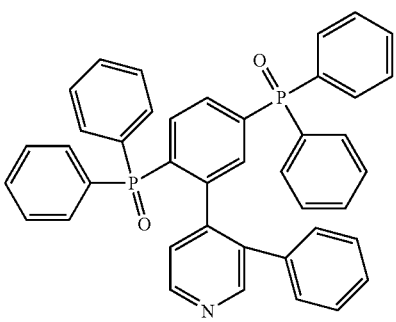

54
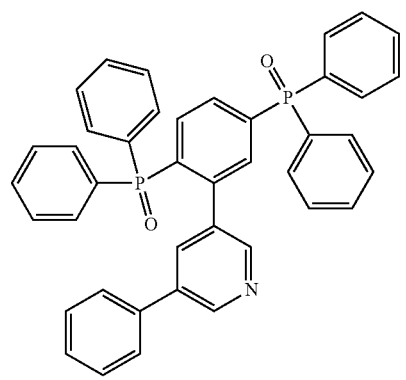
55
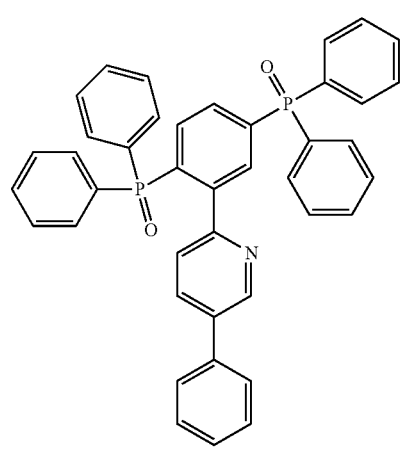
56
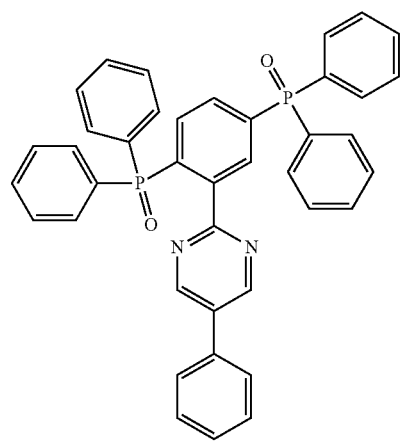
57
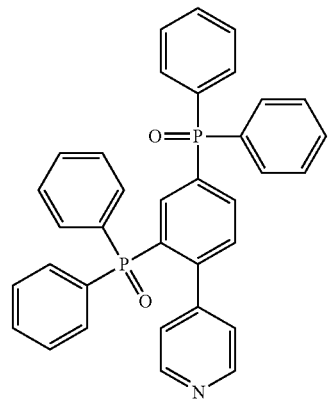
58
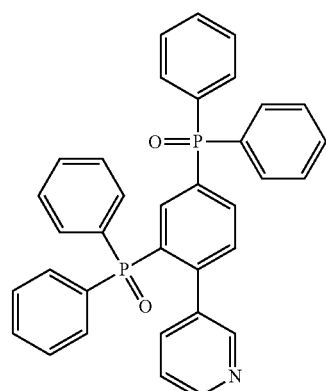
59
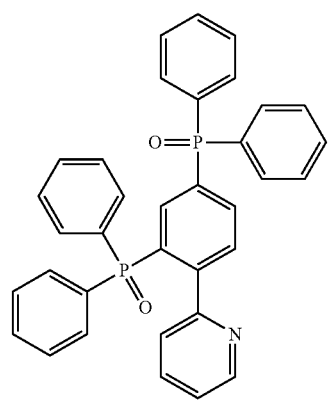
60
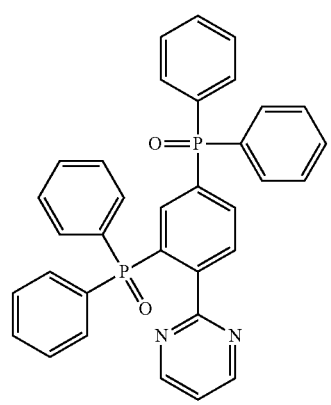

61
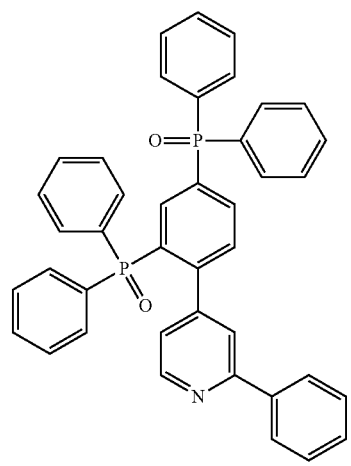
62
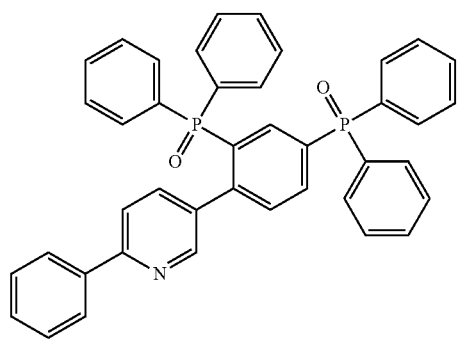
63
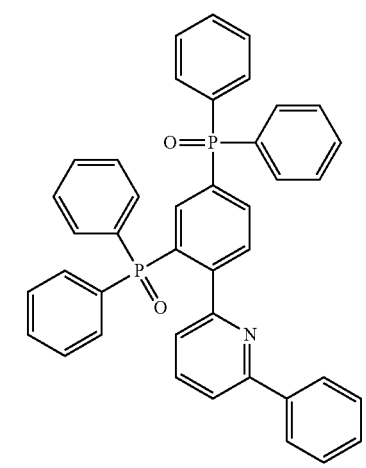
64
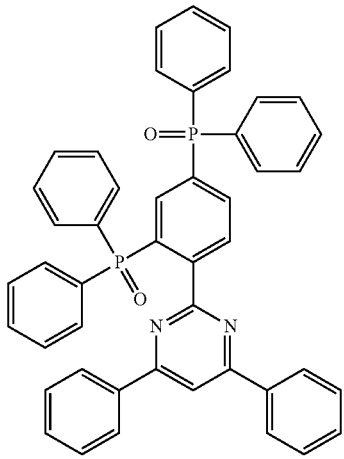
65
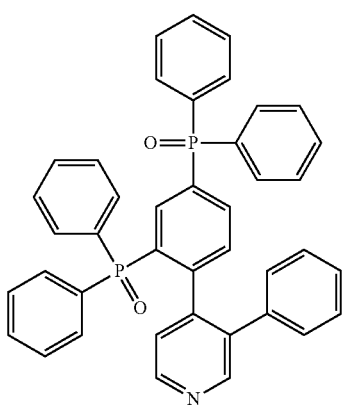
66
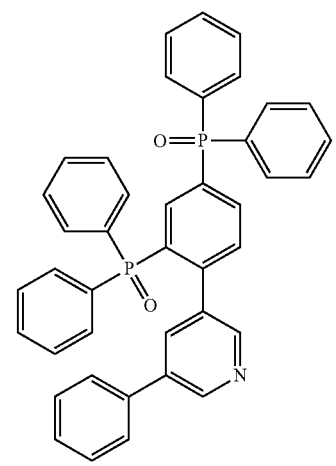

67
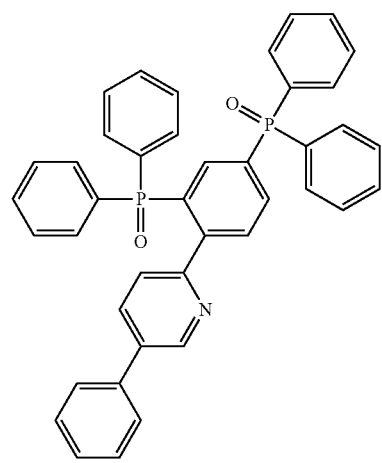
5
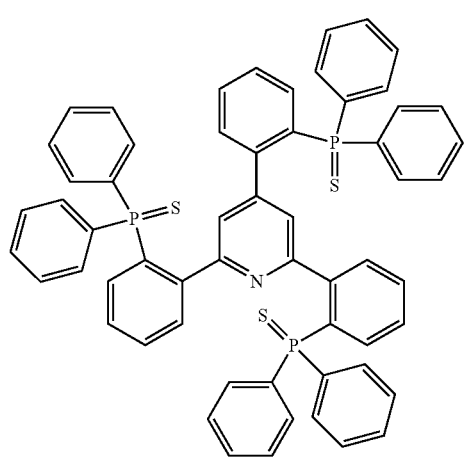
70
68
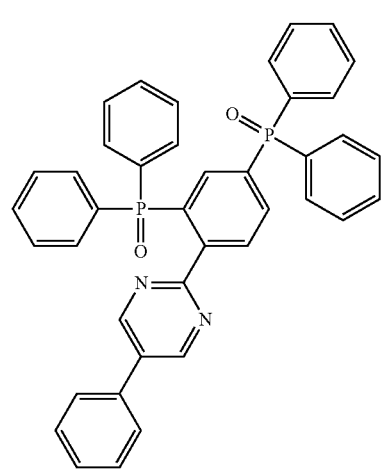
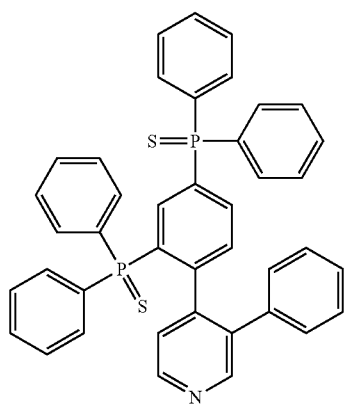
71
69
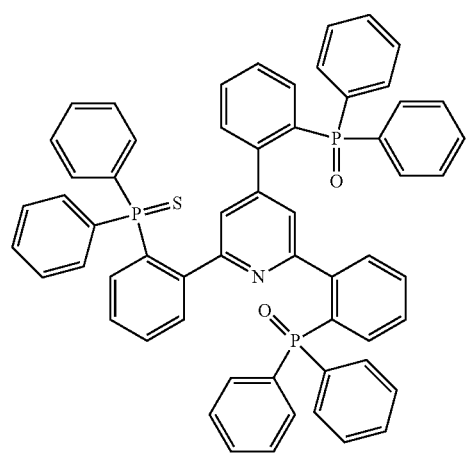
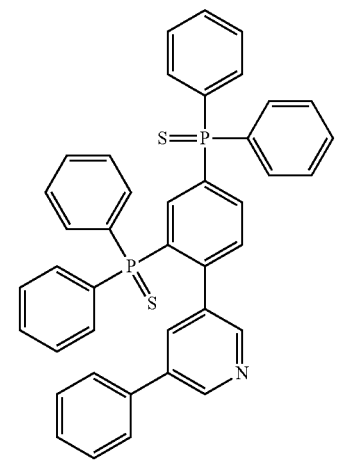
72

73
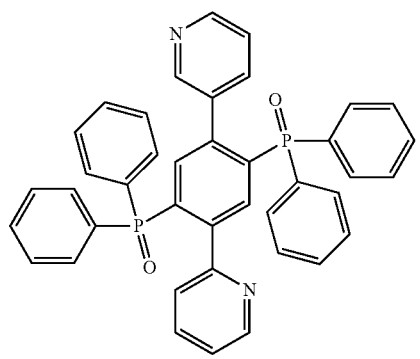
74
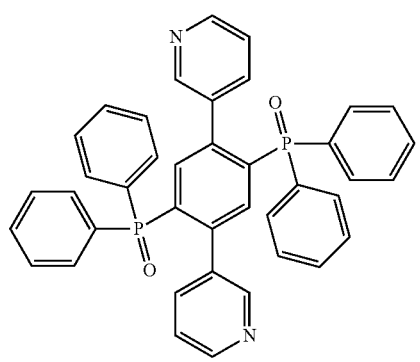
75
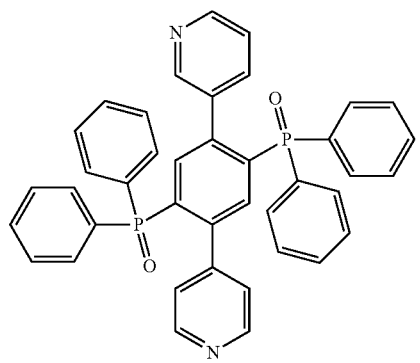
76
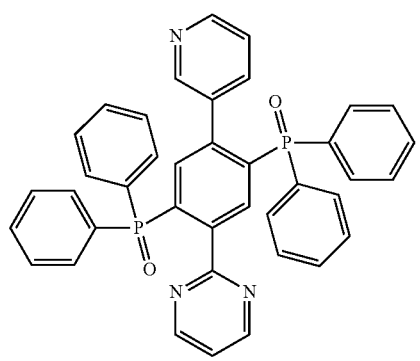
77
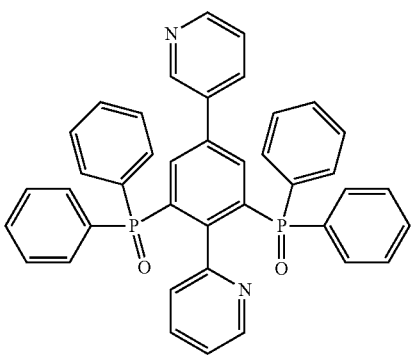
78
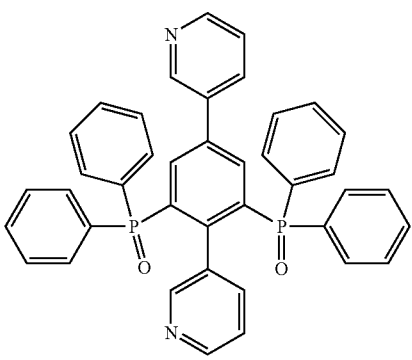
79
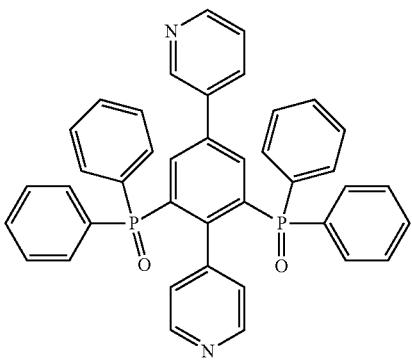
80
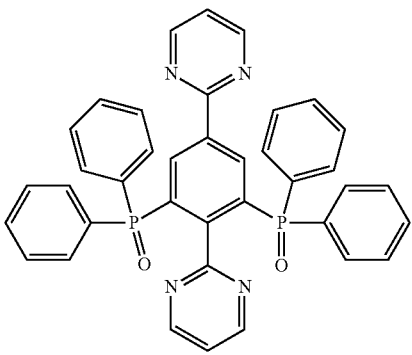

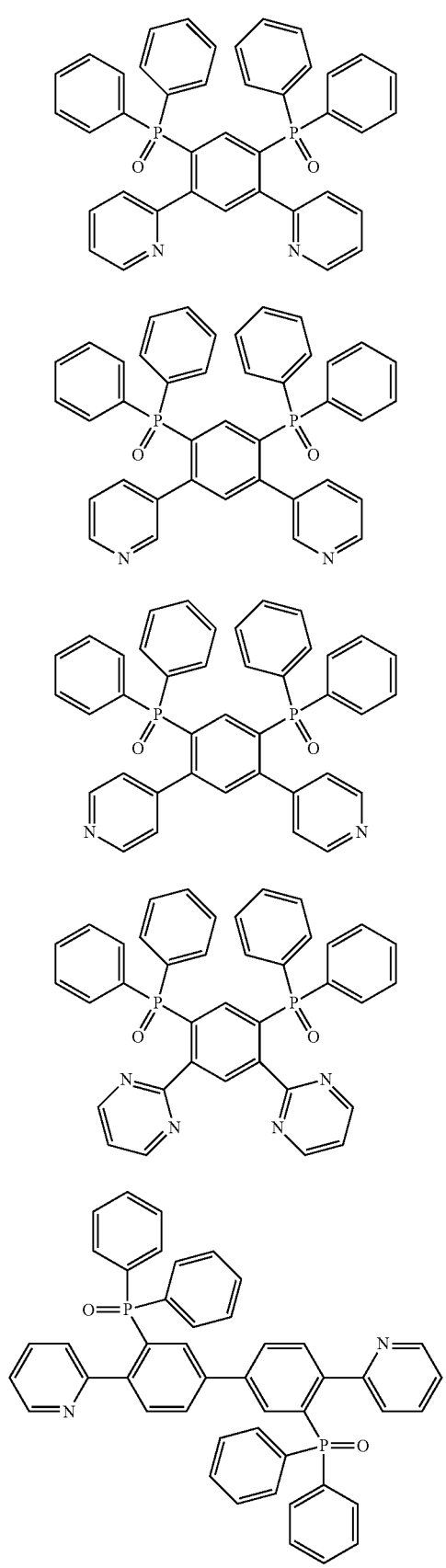
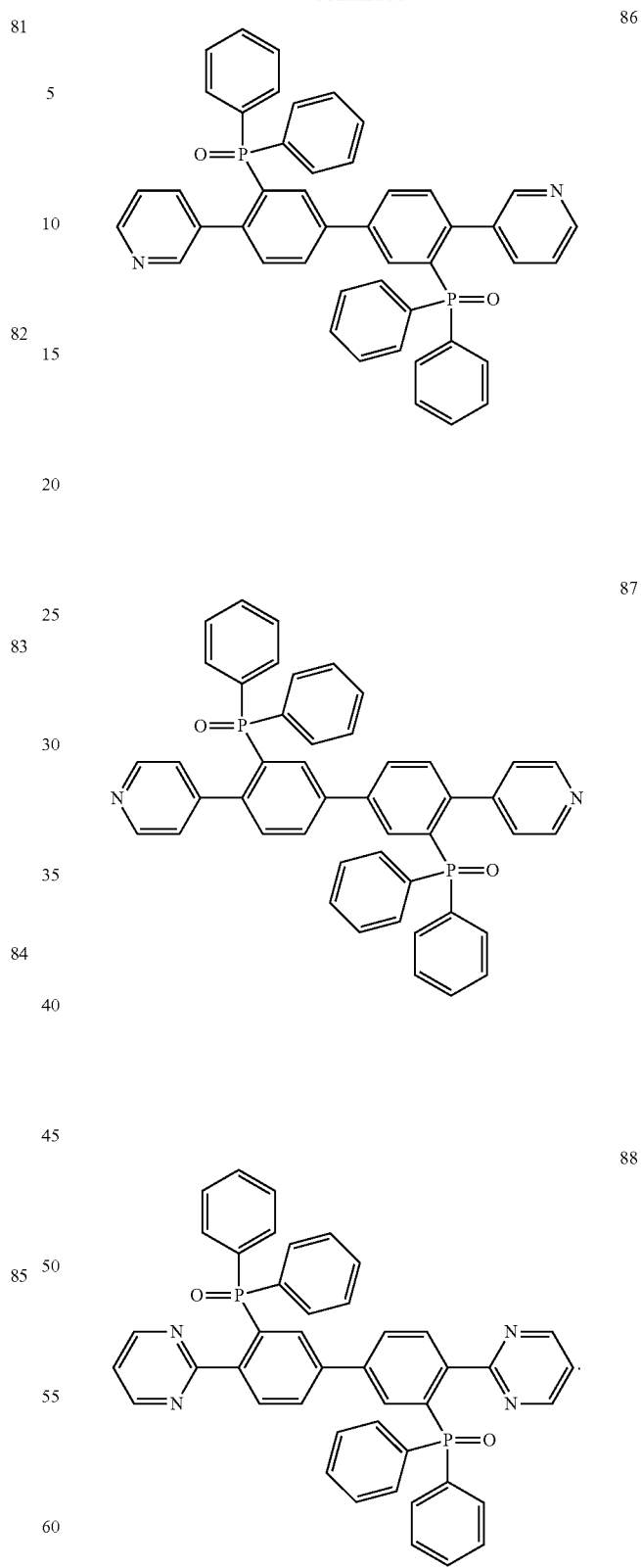
12. The phosphine-based compound as claimed in claim 1, wherein the phosphine-based compound represented by Formula 1 is a compound of the following Compound Group 3:

[Compound Group 3]
89
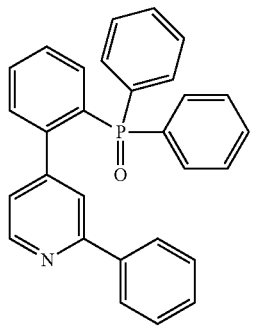
90
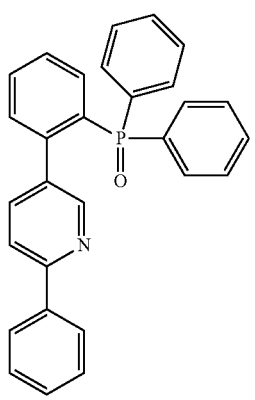
91
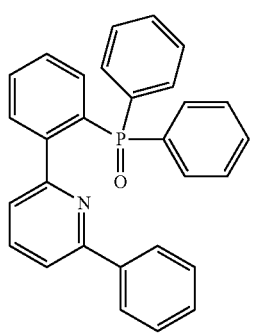
92
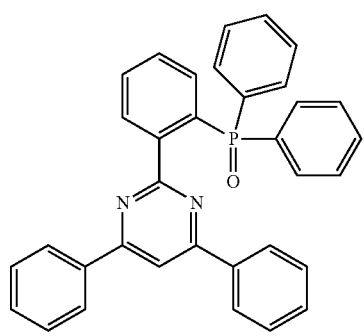
93
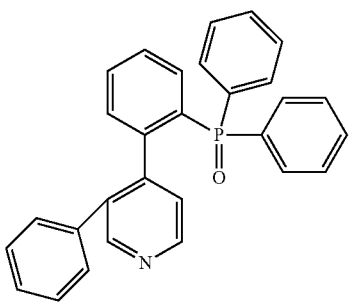
94
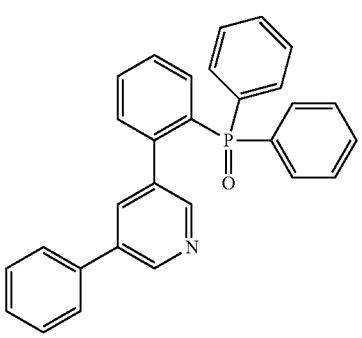
95
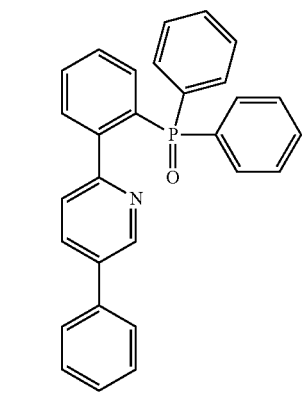
96
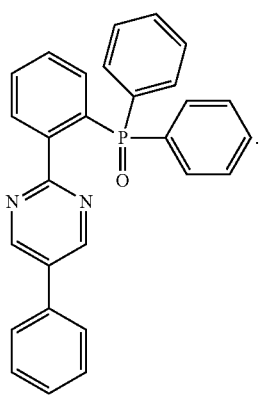

13. A phosphine-based compound represented by the following Formula 7:

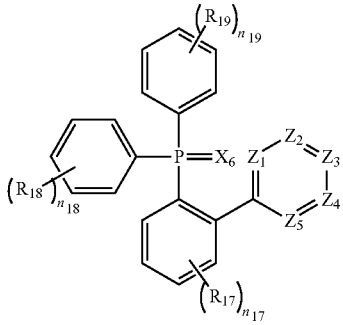

[Formula 7]

wherein, in Formula 7,
$X_6$ is O or S,
$Z_1$ to $Z_5$ are each independently $CR_{20}$ or N, one or two of $Z_1$ to $Z_5$ being N,
$R_{17}$ and $R_{20}$ are each independently a hydrogen atom, a deuterium atom, a halogen atom, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, or a combination thereof,
$R_{18}$ and $R_{19}$ are each independently a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms,
"$n_{17}$" is an integer of 0 to 4,
"$n_{18}$" and "$n_{19}$" are each independently an integer of 0 to 5, and
at least one of $R_{17}$ and $R_{20}$ is a group represented by the following Formula 8:

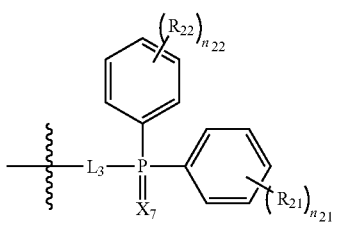

[Formula 8]

wherein, in Formula 8,
$X_7$ is O or S,
$L_3$ is a direct linkage or a substituted or unsubstituted phenylene group,
$R_{21}$ and $R_{22}$ are each independently a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and
"$n_{21}$" and "$n_{22}$" are each independently an integer of 0 to 5.

14. An organic electroluminescence device, comprising:
a first electrode;
a hole transport region disposed on the first electrode;
an emission layer disposed on the hole transport region;
an electron transport region disposed on the emission layer; and
a second electrode disposed on the electron transport region,
wherein at least one of the emission layer or the electron transport region includes a phosphine-based compound represented by the following Formula 1:

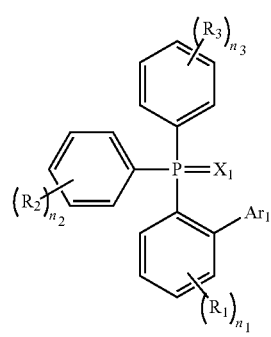

[Formula 1]

wherein, in Formula 1,
$X_1$ is O or S,
$Ar_1$ is a substituted or unsubstituted pyridyl group, a substituted or unsubstituted pyridazinyl group, a substituted or unsubstituted pyrimidyl group, or a substituted or unsubstituted pyrazinyl group,
$R_1$ is a hydrogen atom, a deuterium atom, a halogen atom, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms,
$R_2$ and $R_3$ are each independently a hydrogen atom, a deuterium atom, a halogen atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms,
"$n_1$" is an integer of 0 to 4, and
"$n_2$" and "$n_3$" are each independently an integer of 0 to 5.

15. The organic electroluminescence device as claimed in claim 14, wherein:
the emission layer includes a host and a dopant, and
the host includes the phosphine-based compound represented by Formula 1.

16. The organic electroluminescence device as claimed in claim 14, wherein:
the electron transport region includes:
an electron transport layer on the emission layer; and
an electron injection layer on the electron transport layer, and
the electron transport layer includes the phosphine-based compound represented by Formula 1.

17. The organic electroluminescence device as claimed in claim 14, wherein:
the electron transport region includes:
a first electron transport layer on the emission layer while making contact with the emission layer;
a second electron transport layer on the first electron transport layer; and
an electron injection layer on the second electron transport layer, and
the first electron transport layer includes the phosphine-based compound represented by Formula 1.

18. The organic electroluminescence device as claimed in claim 14, wherein Ar$_1$ is a group represented by one of the following Formulae 2-1 to 2-4:

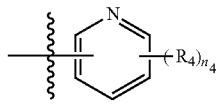

[Formula 2-1]

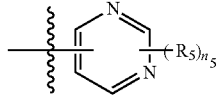

[Formula 2-2]

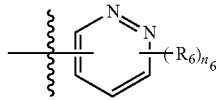

[Formula 2-3]

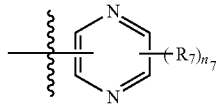

[Formula 2-4]

wherein, in Formulae 2-1 to 2-4,
R$_4$ to R$_7$ are each independently a hydrogen atom, a deuterium atom, a halogen atom, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, or a combination thereof,
"n$_4$" is an integer of 0 to 4, and
"n$_5$" to "n$_7$" are each independently an integer of 0 to 3.

19. The organic electroluminescence device as claimed in claim 14, wherein the phosphine-based compound represented by Formula 1 is a compound of the following Compound Groups 1 to 3:

[Compound Group 1]

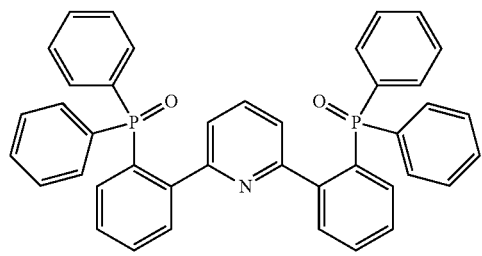

1

-continued

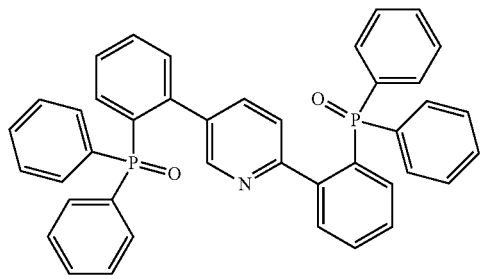

2

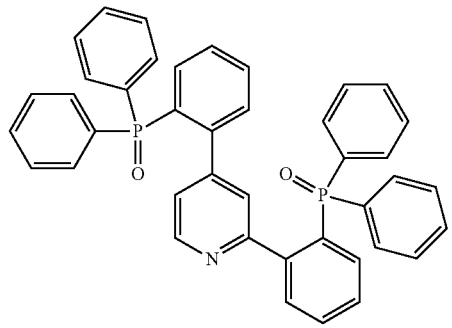

3

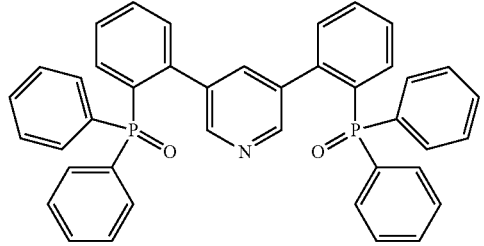

4

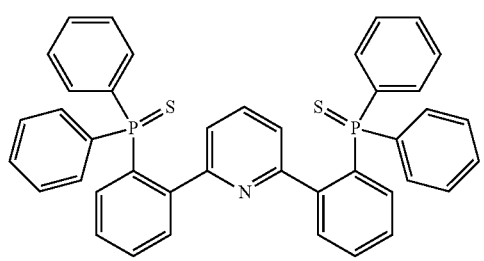

5

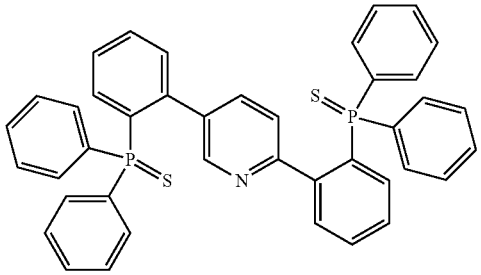

6

7
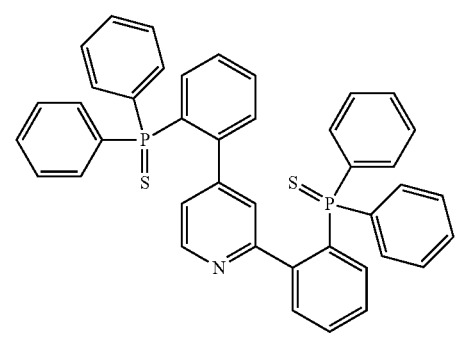
8
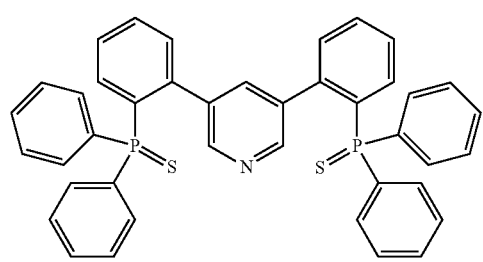
9
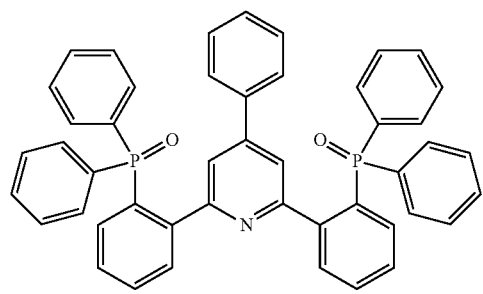
10
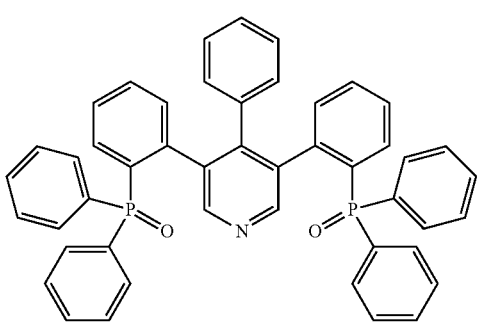
11
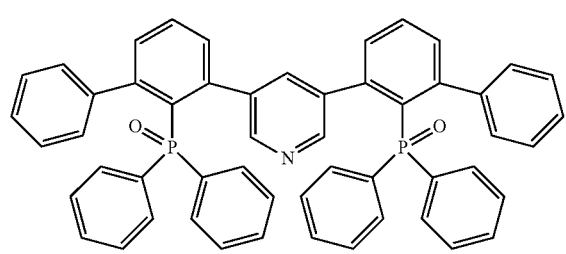
12
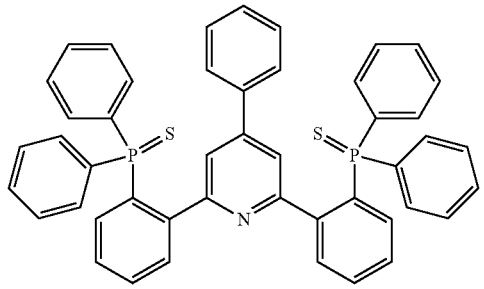
13
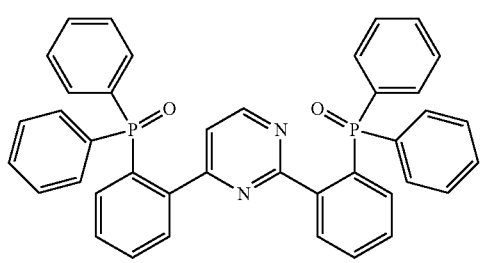
14
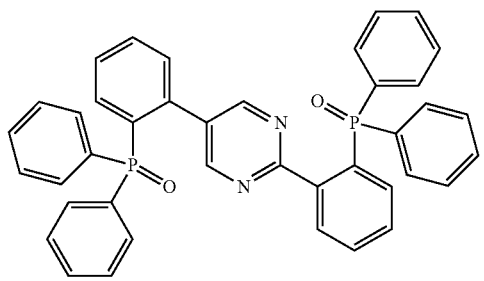
15
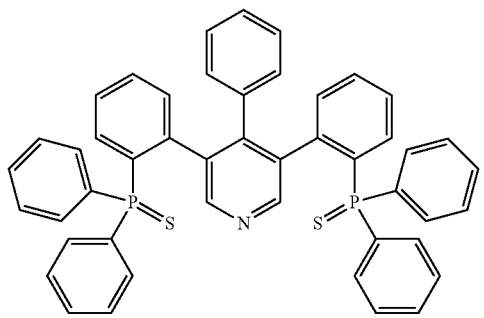
16
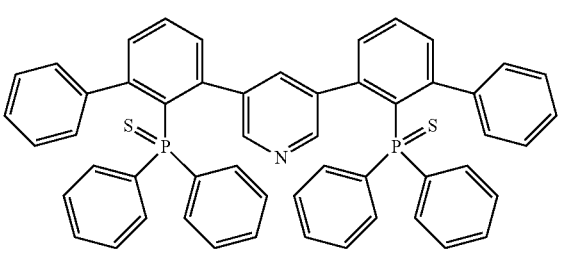

[Compound Group 2]

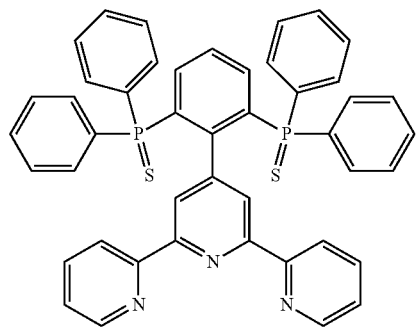
28
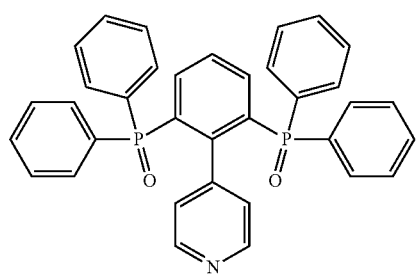
29
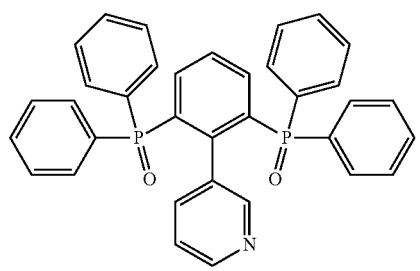
30
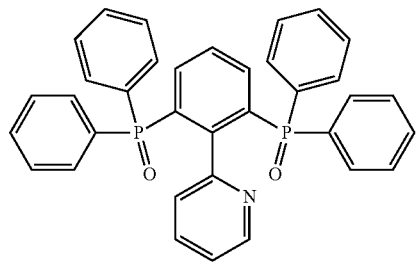
31
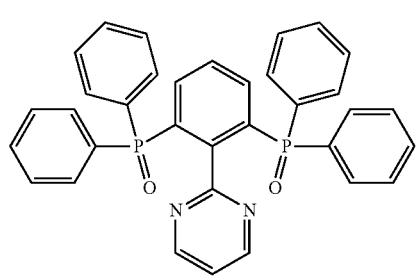
32
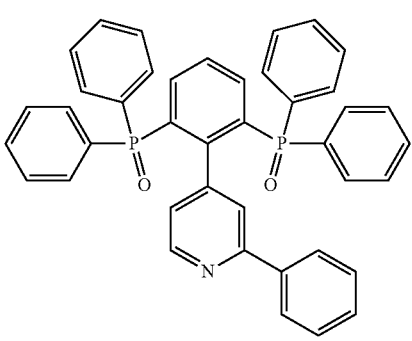
33
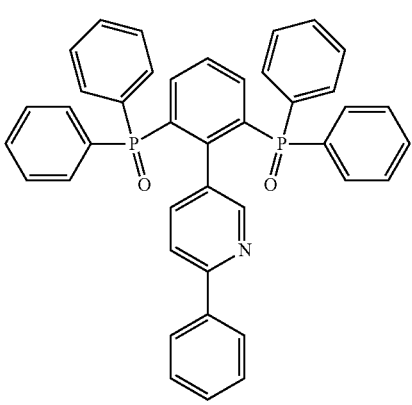
34
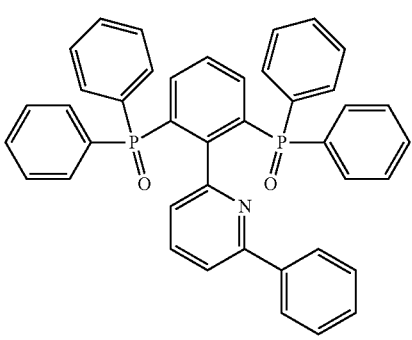
35
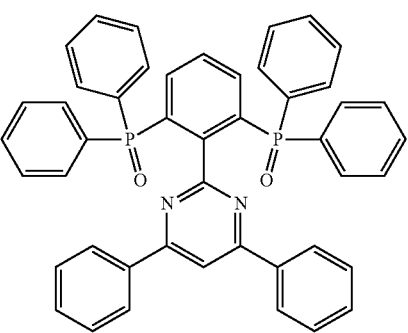
36

37
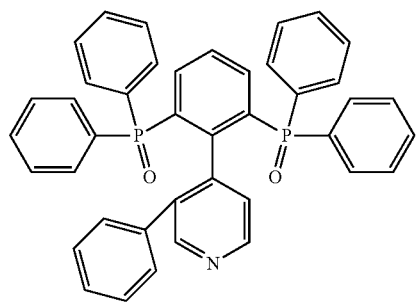
38
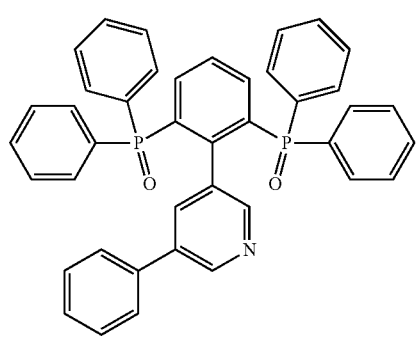
39
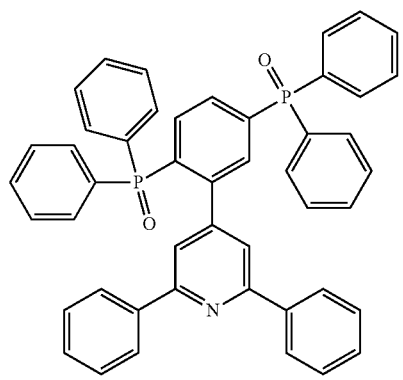
40
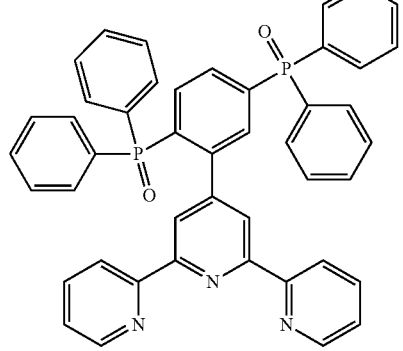
41
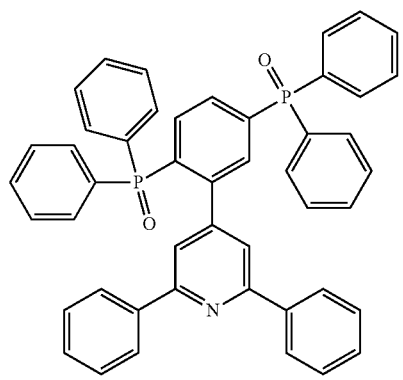
42
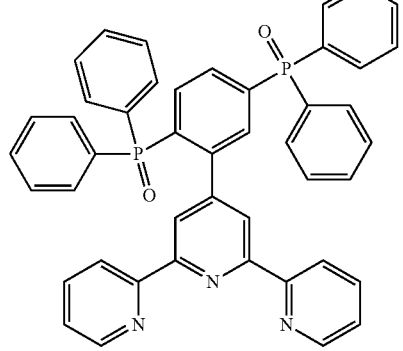
43
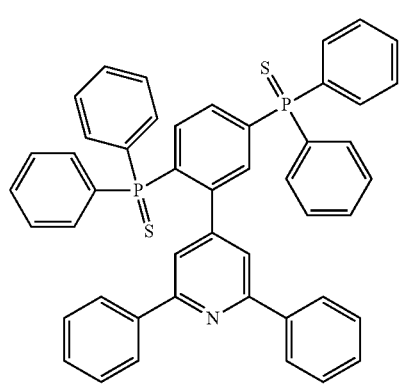
44
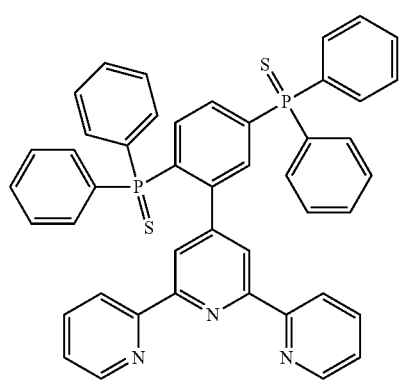

45
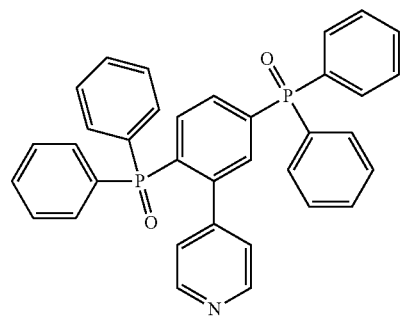
46
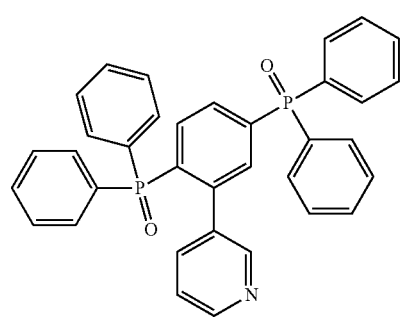
47
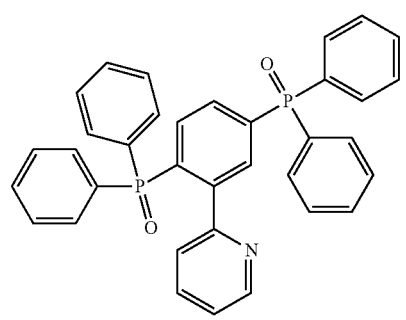
48
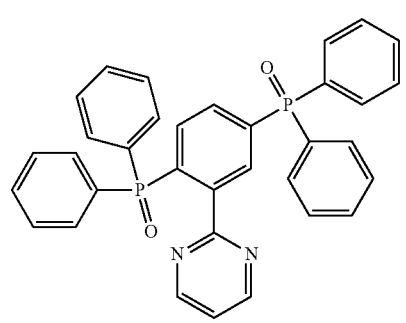
49
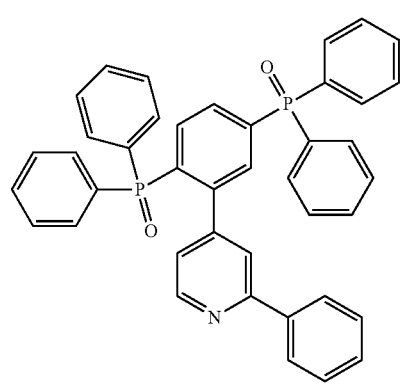
50
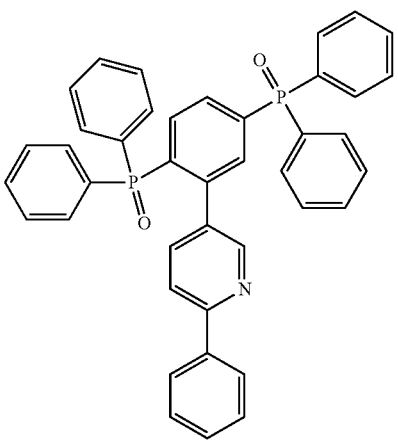
51
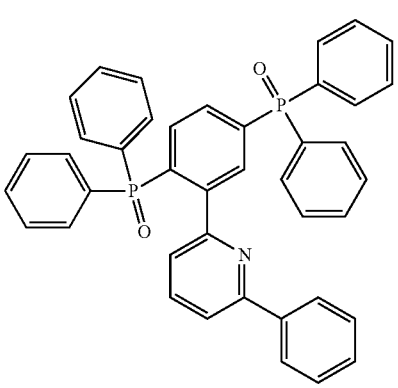
52
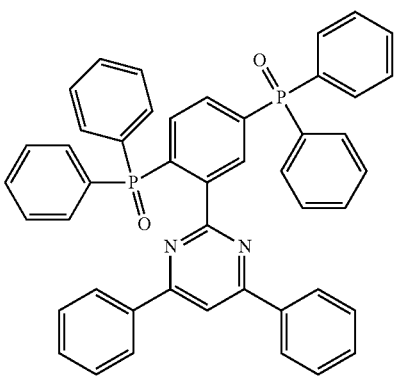
53
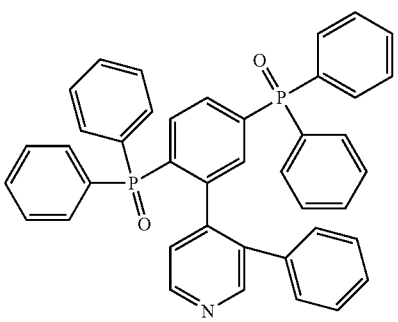

54
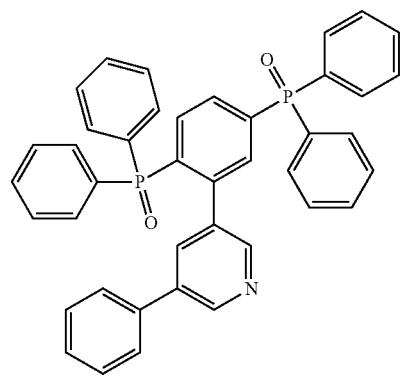
55
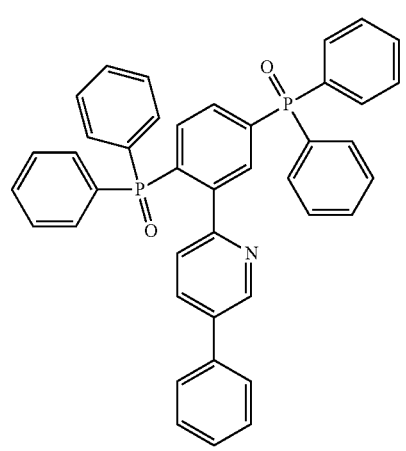
56
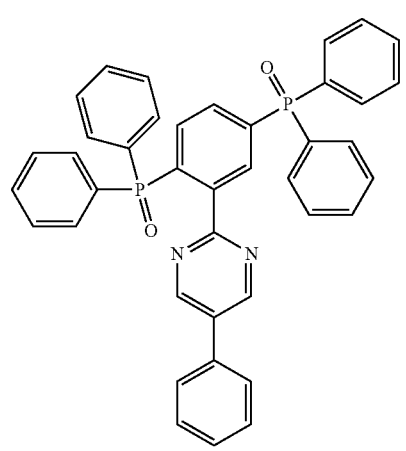
57
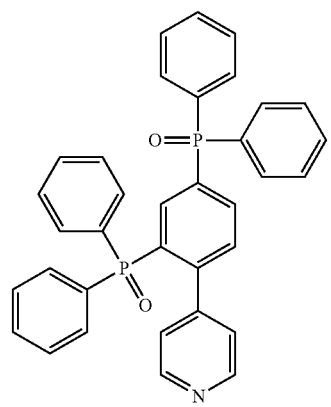
58
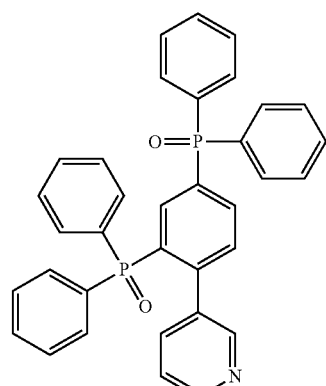
59
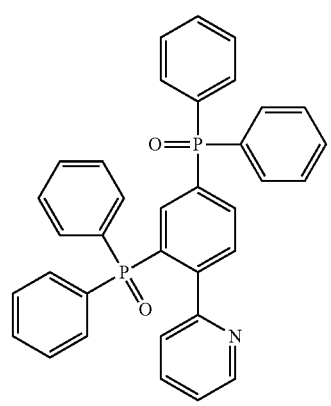
60
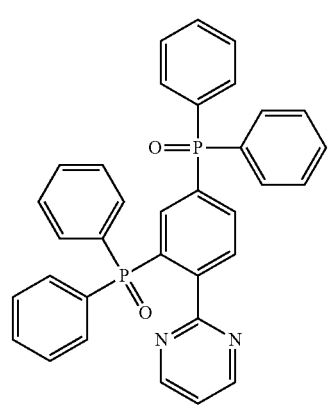

61
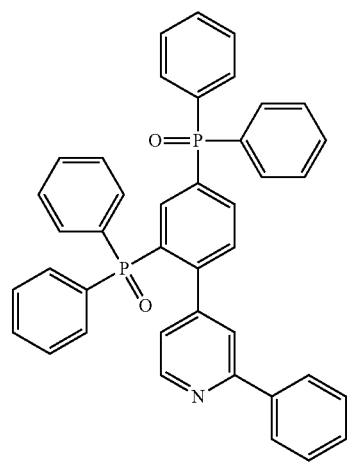
62
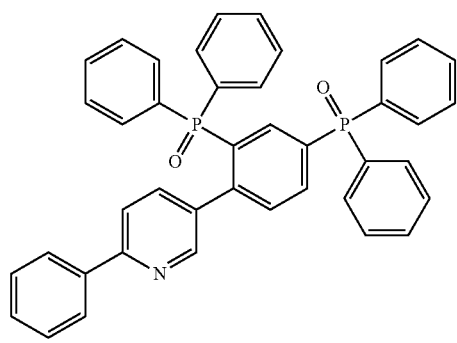
63
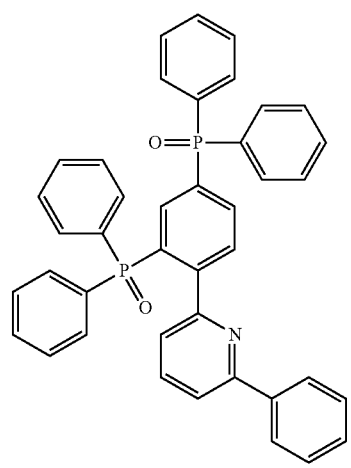
64
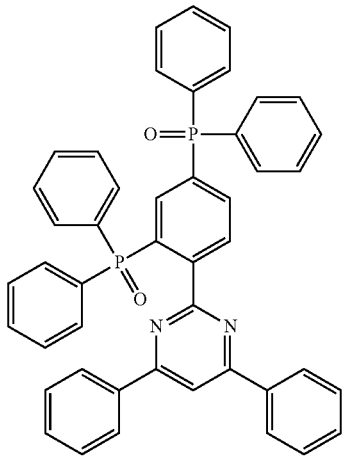
65
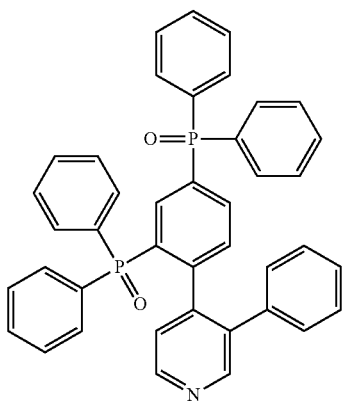
66
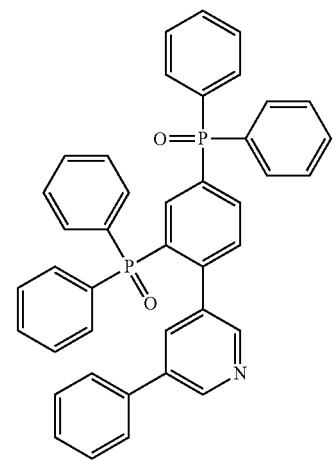

67
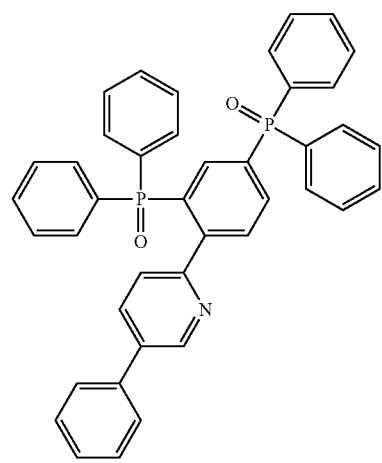
68
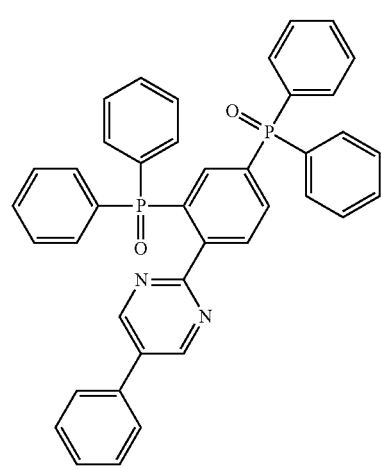
69
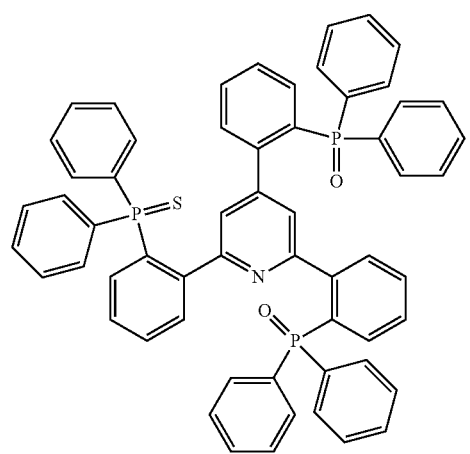
70
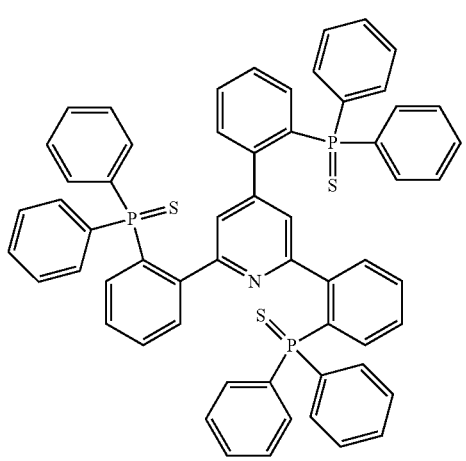
71
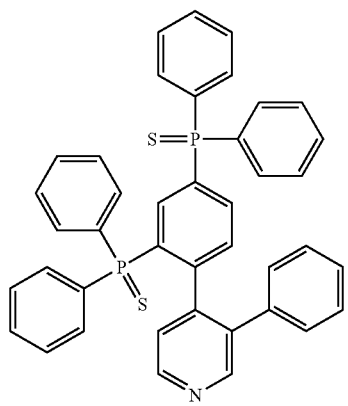
72
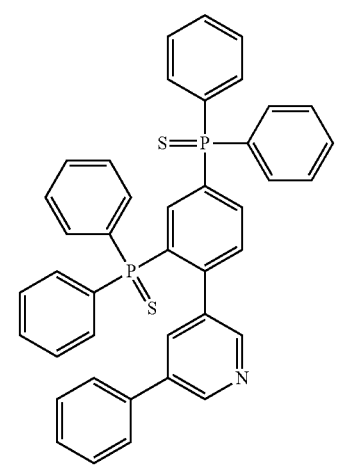

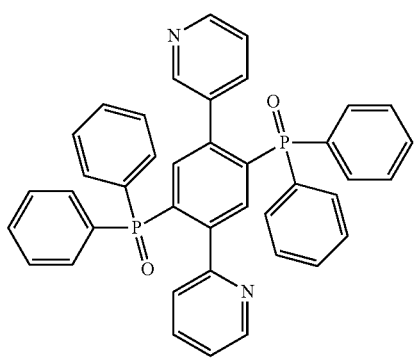
73
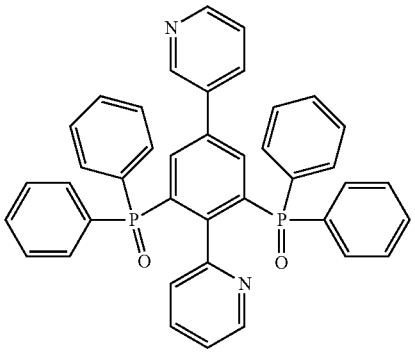
77
74
78
75
79
76
80
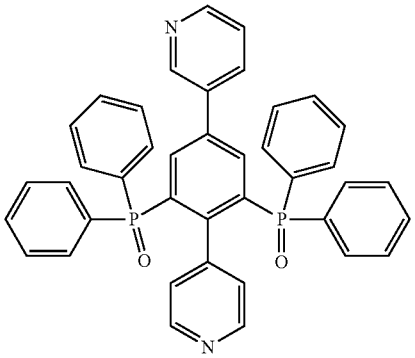
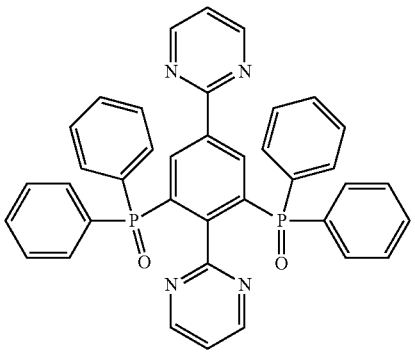

81
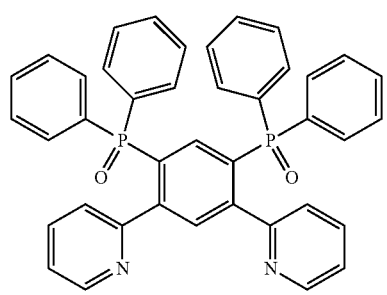
82
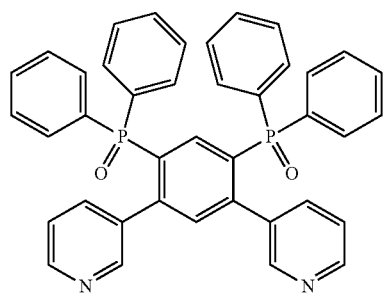
83
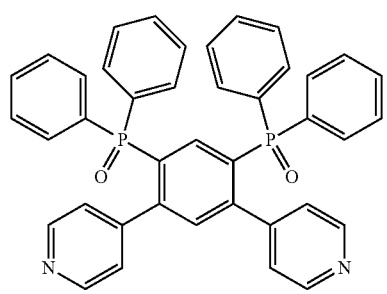
84
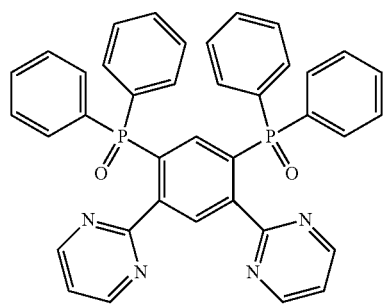
85
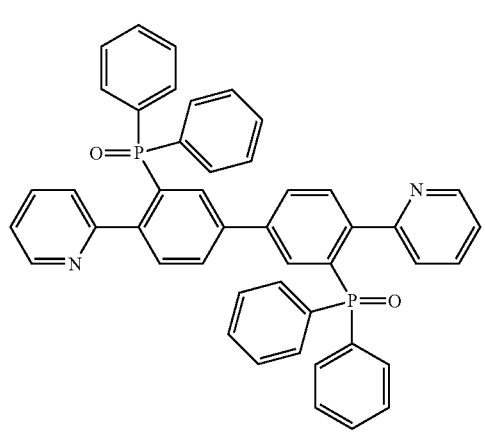
86
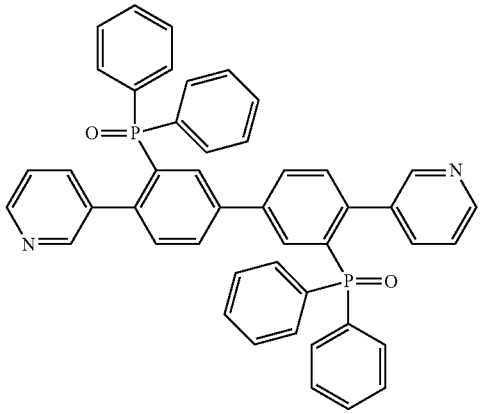
87
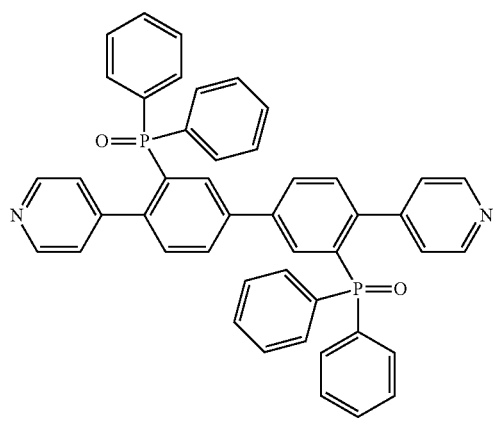
88
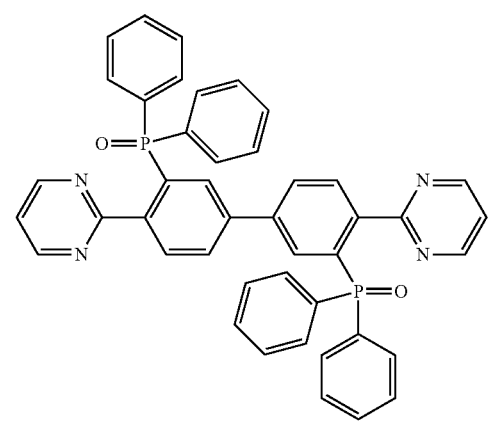
[Compound Group 3]
89
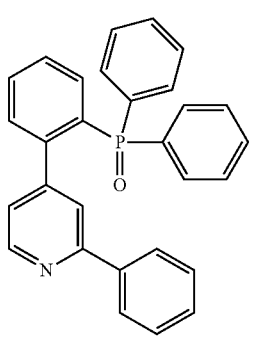

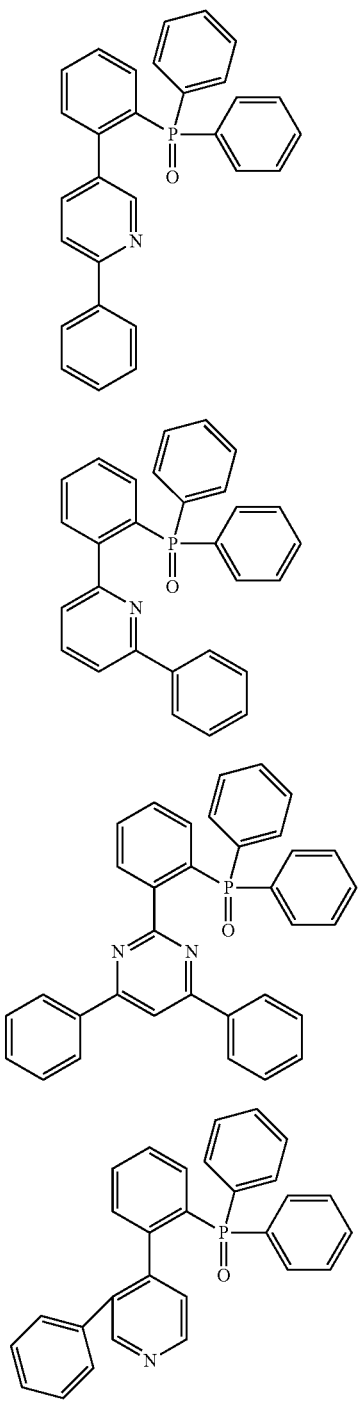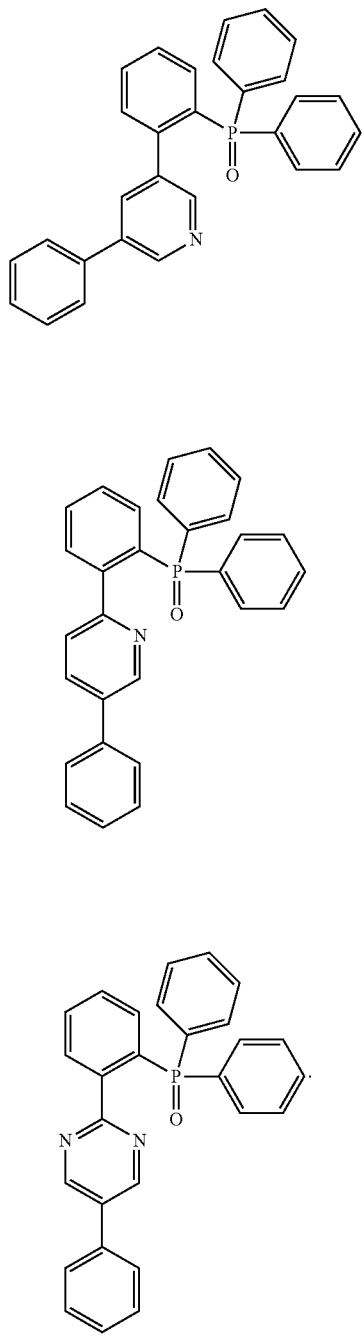

UNITED STATES PATENT AND TRADEMARK OFFICE
CERTIFICATE OF CORRECTION

Page 1 of 4

PATENT NO. : 10,727,415 B2
APPLICATION NO. : 15/923023
DATED : July 28, 2020
INVENTOR(S) : Naoya Sakamoto It is certified that error appears in the above-identified patent and that said Letters Patent is hereby corrected as shown below:

In the Claims

Column 66, Lines 3-8,
Claim 7, Formula 4

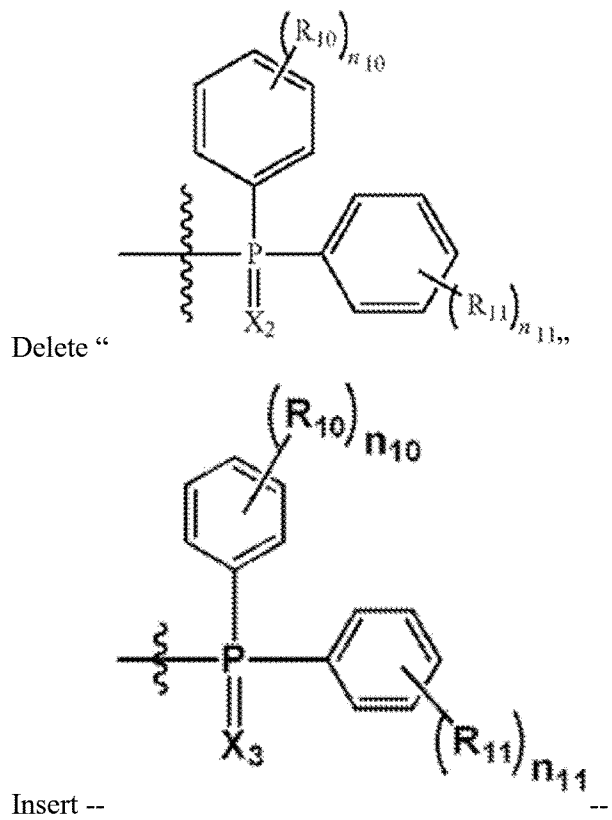

Delete " [upper structure] "

Insert -- [lower structure] --

Signed and Sealed this
Twenty-fifth Day of July, 2023

Katherine Kelly Vidal
*Director of the United States Patent and Trademark Office*

CERTIFICATE OF CORRECTION (continued)
U.S. Pat. No. 10,727,415 B2

Column 83, Lines 50-65,
Claim 11, Compound 69

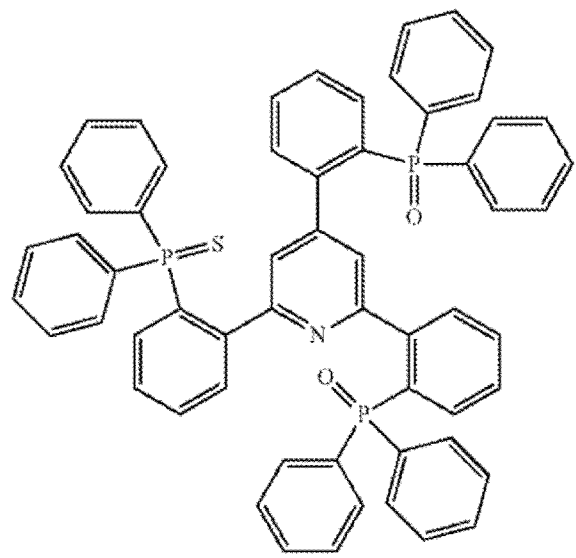

Delete " "

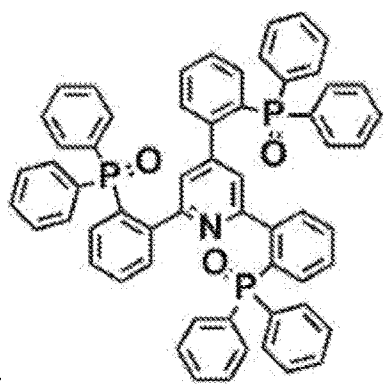

Insert -- --

Column 85, Lines 53-66,
Claim 11, Compound 76

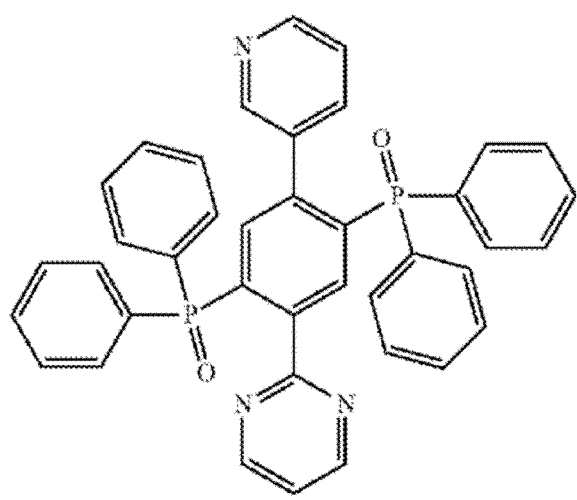

Delete " "

CERTIFICATE OF CORRECTION (continued)
U.S. Pat. No. 10,727,415 B2

Insert -- 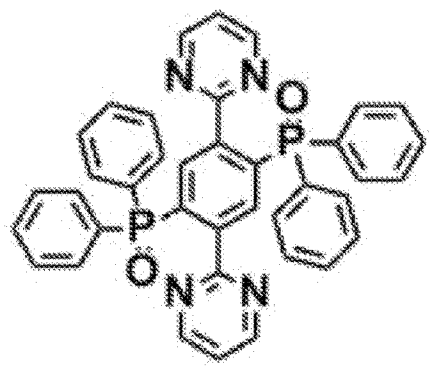 --

Column 109, Lines 50-65,
Claim 19, Compound 69

Delete " 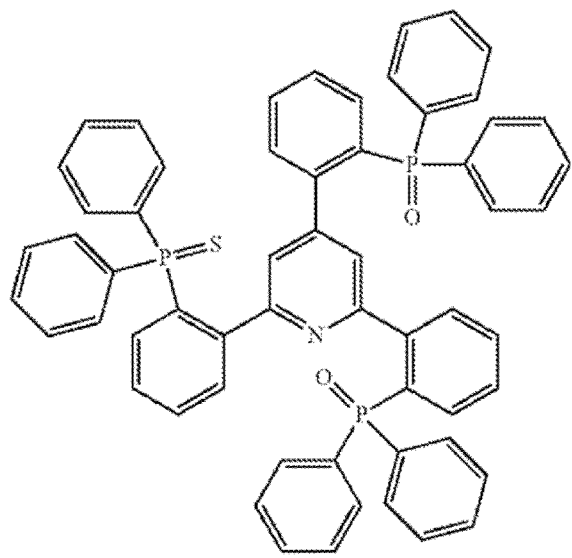 "

Insert -- 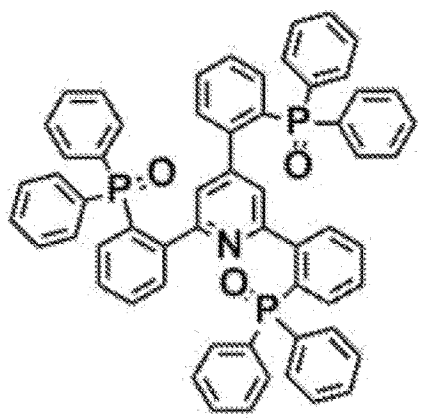 --

CERTIFICATE OF CORRECTION (continued)
U.S. Pat. No. 10,727,415 B2

Page 4 of 4

Column 111, Lines 53-65,
Claim 19, Compound 76

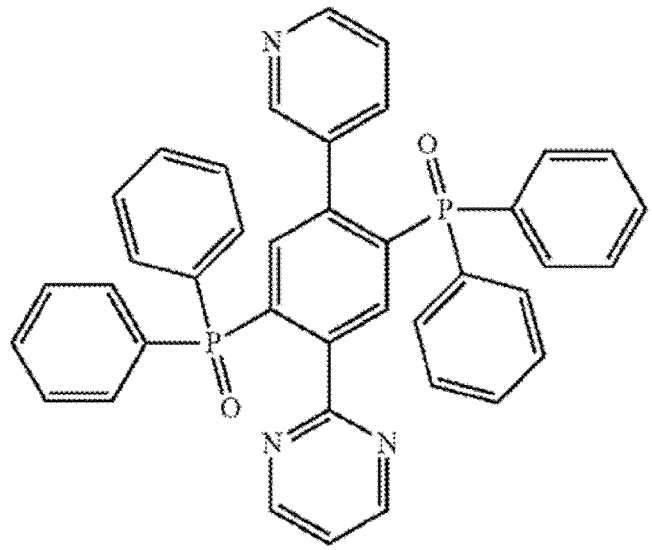

Delete " "

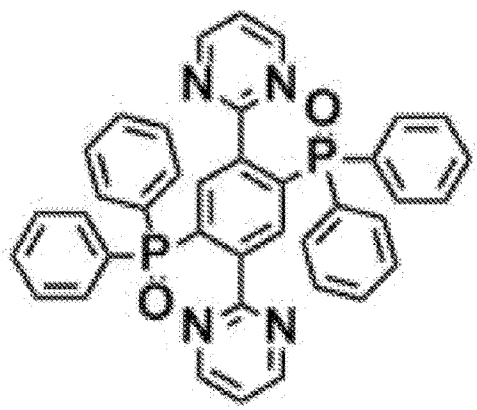

Insert -- --